United States Patent
Nomura

(10) Patent No.: US 7,660,145 B2
(45) Date of Patent: Feb. 9, 2010

(54) STORAGE DEVICE AND SEMICONDUCTOR DEVICE

(75) Inventor: Ryoji Nomura, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 508 days.

(21) Appl. No.: 11/474,944

(22) Filed: Jun. 27, 2006

(65) Prior Publication Data

US 2007/0001167 A1    Jan. 4, 2007

(30) Foreign Application Priority Data

Jul. 1, 2005    (JP) ............... 2005-194077

(51) Int. Cl.
*G11C 11/00* (2006.01)

(52) U.S. Cl. ............ 365/129; 365/175; 365/145; 365/151

(58) Field of Classification Search ........ 365/175, 365/103–105, 158, 163, 129, 145; 257/40, 257/72, 59, 98
See application file for complete search history.

(56) References Cited

U.S. PATENT DOCUMENTS

| | | | |
|---|---|---|---|
| 5,356,526 A * | 10/1994 | Frankenthal et al. ........ 205/122 |
| 5,883,397 A | 3/1999 | Isoda et al. | |
| 6,777,249 B2 * | 8/2004 | Yamazaki ...................... 438/4 |
| 6,950,331 B2 | 9/2005 | Yang et al. | |
| 7,289,353 B2 * | 10/2007 | Spitzer et al. ............... 365/151 |
| 7,443,710 B2 * | 10/2008 | Fang et al. .................. 365/148 |

FOREIGN PATENT DOCUMENTS

WO    WO 2004/015778    2/2004

* cited by examiner

*Primary Examiner*—David Lam
(74) *Attorney, Agent, or Firm*—Eric J. Robinson; Robinson Intellectual Property Law Office, P.C.

(57) ABSTRACT

An object of the present invention is to provide nonvolatile, rewritable, easily-manufactured, and inexpensive storage element, storage device, and semiconductor device, which are superior in switching characteristics and which has low operation voltage. In an element including a first conductive layer, a second conductive layer facing the first conductive layer, and a layer containing at least one kind of an organic compound provided between the first conductive layer and the second conductive layer, the organic compound can be electrochemically doped or dedoped. By feeding current in this element, the organic compound provided between the conductive layers is electrochemically doped, i.e., electrons are transported, whereby the conductivity can be increased by about three to ten digits.

10 Claims, 27 Drawing Sheets

400   411   412   410

413

414a   414b 415   419

416   418   417

STORAGE DEVICE AND SEMICONDUCTOR DEVICE

BACKGROUND OF THE INVENTION

1. Field of Invention

The present invention relates to a semiconductor device and particularly relates to a semiconductor device capable of storing, erasing, and rewriting data by using an organic compound for a storage circuit. Moreover, the present invention relates to a storage circuit (storage device) capable of storing, erasing, and rewriting data by using an organic compound.

2. Description of the Related Art

In recent years, identification technology where an ID (identification number) is assigned to each object so as to reveal data on the object such as history thereof has been attracting attention, which is utilized for production, management, and the like. Above all, semiconductor devices capable of sending and receiving data without contact have been developed. As such semiconductor devices, in particular, an RFID (Radio Frequency Identification) tag (also called an ID tag, an IC tag, an IC chip, an RF (Radio Frequency) tag, a wireless tag, an electronic tag, or a wireless chip), and the like have been introduced into companies, markets, and the like.

Many of these semiconductor devices currently put into practical use have antennas and circuits using a semiconductor substrate made of Si or the like (such circuits are also referred to as IC (Integrated Circuit) chips), and the IC chip is formed by using a storage circuit (also referred to as a storage device or a memory), a controlling circuit, and the like. In particular, by providing a storage circuit capable of storing a large amount of data, a more sophisticated and higher-value-added semiconductor device can be provided.

In general, the following is given as a storage circuit (storage device) to be provided to a semiconductor device: a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, or the like. Among these, a DRAM and an SRAM are volatile storage circuits; therefore, once the power is turned off, data is erased. Accordingly, data needs to be written every time the power is turned on.

Among nonvolatile memories, users can freely write and erase data in an EPROM, an EEPROM, a flash memory, and an FeRAM. With the progress of information technology in recent years, memories capable of storing, erasing, and reading a larger amount of data at high speed have been demanded, and size reduction, cost reduction, and integration of nonvolatile memories have been important issues. However, an EPROM has a drawback that UV rays need to be used to erase data. Although an EEPROM and a flash memory are nonvolatile storage circuits, since an element including two gate electrodes is used, the number of manufacturing steps increases. In contrast, since an FeRAM uses a ferroelectric thin film material and a material and a process that are used for a Si process can be used for an FeRAM, an FeRAM is superior in its characteristics and also has potential to be manufactured at low cost. However, there has been a delay in practical application of this FeRAM, resulting from technical difficulty in thinning a ferroelectric film.

SUMMARY OF THE INVENTION

In view of the above problem, it is an object of the present invention to provide a storage device and a semiconductor device at low cost which are nonvolatile, easily manufactured, and capable of storing and erasing information.

A storage device and a semiconductor device according to the present invention each comprise a first conductive layer, a second conductive layer facing the first conductive layer, and a layer containing at least one kind of an organic compound provided between the first conductive layer and the second conductive layer, wherein the organic compound can be electrochemically doped or dedoped. By feeding current to this storage element, the organic compound provided between the conductive layers is electrochemically doped. In other words, by transporting electrons, the conductivity can be raised by about $10^3$ to $10^{10}$ times. This produces a large difference in the amount of current flowing in the storage element at a doped state and a dedoped state. By reading this difference, information of 0 and information of 1 can be differentiated. Thus, functions as a storage device and a semiconductor device can be given.

Moreover, in the storage device and the semiconductor device of the present invention, one or both of the first conductive layer and the second conductive layer is/are partially ionized when the organic compound is doped or dedoped. Therefore, the organic compound provided between the conductive layers can be doped or dedoped by applying voltage between the conductive layers. Moreover, since doping and dedoping can be controlled just by inverting positive and negative potential to be applied, information can be written, erased, and rewritten arbitrarily. Thus, nonvolatile and rewritable storage device and semiconductor device can be provided.

Doping herein described means electrochemical oxidation or reduction, while dedoping means returning from the electrochemically oxidized or reduced state to an initial neutral state.

A storage device according to the present invention comprises a storage element including a first conductive layer, a second conductive layer, and a layer containing at least one kind of an organic compound between the first conductive layer and the second conductive layer, wherein when current is fed between the first conductive layer and the second conductive layer, the organic compound is reduced and one of the first conductive layer and the second conductive layer is oxidized, so that one of the first conductive layer and the second conductive layer is partially ionized.

A storage device according to the present invention comprises a storage element including a first conductive layer, a second conductive layer, and a layer containing at least one kind of an organic compound between the first conductive layer and the second conductive layer, wherein a metal cation exists in the organic compound, and wherein when current is fed between the first conductive layer and the second conductive layer, the organic compound is oxidized as well as the metal cation is reduced.

In the aforementioned structure, one or both of the first conductive layer and the second conductive layer has/have a standard potential of −3.0 V or higher and +0.8 V or lower with a saturated calomel electrode as a reference.

Moreover, the storage device may have a plurality of bit lines extending in a first direction and a plurality of word lines extending in a second direction perpendicular to the first direction.

A semiconductor device of the present invention comprises a storage element including a first conductive layer, a second conductive layer, and a layer containing at least one kind of an organic compound between the first conductive layer and the second conductive layer; and a transistor, wherein a source or drain region of the transistor is electrically connected to the first conductive layer or the second conductive layer, and wherein when current is fed between the first conductive layer and the second conductive layer, the organic compound is reduced and one of the first conductive layer and the second conductive layer is oxidized, so that one of the first conductive layer and the second conductive layer is partially ionized.

A semiconductor device of the present invention comprises a storage element including a first conductive layer, a second conductive layer, and a layer containing at least one kind of an organic compound between the first conductive layer and the second conductive layer; and a transistor, wherein a source or drain region of the transistor is electrically connected to the first conductive layer or the second conductive layer, wherein a metal cation exists in the organic compound, and wherein when current is fed between the first conductive layer and the second conductive layer, the organic compound is oxidized as well as the metal cation is reduced.

In the above structure, one or both of the first conductive layer and the second conductive layer has/have a standard potential of −3.0 V or higher and +0.8 V or lower with a saturated calomel electrode as a reference.

Moreover, the semiconductor device may have a plurality of bit lines extending in a first direction and a plurality of word lines extending in a second direction perpendicular to the first direction.

In the above structure, the organic compound is preferably a conjugated polymer. Moreover, one aspect of the present invention is an electronic appliance using the aforementioned storage device and semiconductor device. The electronic appliance includes a liquid crystal display device, an EL display device, a television device, a mobile phone, a printer, a camera, a personal computer, a earphone-equipped goggle, a speaker device, a headphone, a navigation device, a car-mount device for ETC, an electronic key, and the like.

According to the present invention, data can be written, erased, and rewritten arbitrarily. Moreover, inexpensive storage device and semiconductor device having minute structures can be provided by applying the present invention.

DETAILED DESCRIPTION OF THE INVENTION

Embodiment Mode

Figure 1:
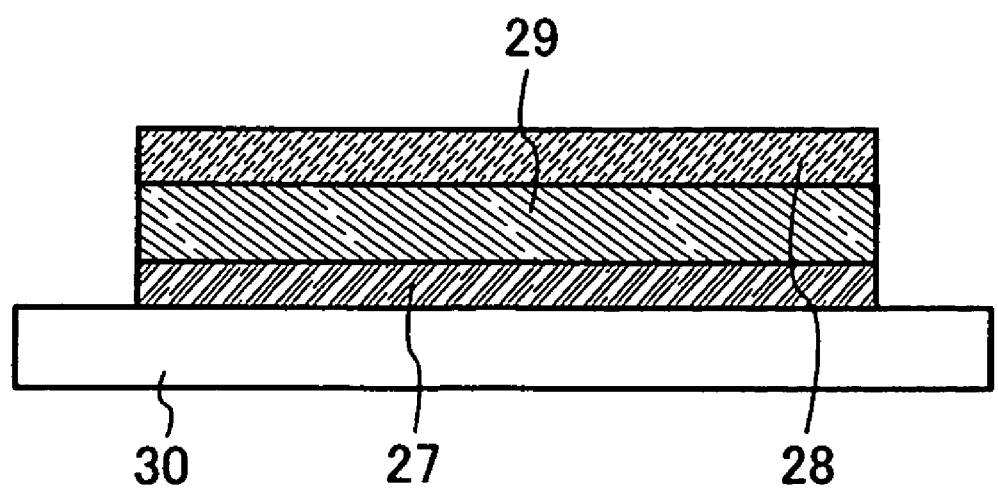
FIG. 1 shows a structural example of a semiconductor device of the present invention.

Embodiment modes of the present invention will be hereinafter described with reference to drawings. However, the present invention is not limited to the following description and it is easily understood by those skilled in the art that the mode and detail can be variously modified without departing from the scope and spirit of the present invention. Therefore, the present invention is not construed as being restricted by the description of the embodiment modes hereinafter shown. It is to be noted that a reference numeral indicating the same thing may be used in common throughout the drawings in the structure of the present invention hereinafter described.

Embodiment Mode 1

This embodiment mode will describe a structural example of a storage device (hereinafter also referred to as a storage circuit or an organic memory) in which an organic compound is provided between two conductive layers, with reference to drawings.

As shown in FIG. 1, a glass substrate made of barium borosilicate glass, aluminoborosilicate glass, or the like; a quartz substrate; a ceramic substrate; or the like can be used as a substrate 30. A metal substrate containing stainless steel or a semiconductor substrate over which an insulating layer is formed may also be used. Although a substrate made of flexible synthetic resin such as plastic, for example PET, tends to have lower allowable temperature limit than the above substrates in general, the substrate made of flexible synthetic resin can also be used as long as the substrate can resist process temperature in manufacturing steps. It is to be noted that a surface of the substrate 30 may be flattened by polishing by a CMP method or the like.

As one or both of a first conductive layer 27 and a second conductive layer 28, a metal having a standard potential of −3.0 V or higher and +0.8 V or lower with a saturated calomel electrode as a reference is used. Specifically, magnesium (Mg), aluminum (Al), zinc (Zn), chromium (Cr), iron (Fe), cadmium (Cd), cobalt (Co), nickel (Ni), or the like is a preferable example. A single layer including one kind of an element selected from these elements or an alloy containing a plurality of the elements, or a multilayer structure can be used.

If one of the first conductive layer 27 and the second conductive layer 28 is formed with the metal or alloy, the other may be formed with a metal or alloy having a standard potential of +0.8 V or higher with a saturated calomel electrode as a reference. Specifically, gold (Au), silver (Ag), platinum (Pt), palladium (Pd), or the like can be used. A conductive material including transparent metal oxide may be used. As a transparent conductive material, indium tin oxide (ITO), zinc oxide (ZnO), indium zinc oxide (IZO), gallium-doped zinc oxide (GZO), or another light-transmitting conductive oxide material can be used. Moreover, indium tin oxide containing silicon oxide, or indium oxide containing silicon oxide in which 2 to 20 wt % of zinc oxide (ZnO) is further mixed may be used. The above material can be formed by a droplet discharging method, an evaporation method, a sputtering method, a CVD method, a spin coating method, or a printing method such as a screen printing method or a gravure printing method. For example, Ag can be formed by a droplet discharging method and Al can be formed by an evaporation method.

An organic compound layer 29 is provided in such a way that a layer formed with a material which can be doped or dedoped electrochemically is provided in a single-layer or multilayer structure. Alternatively, in the case of using a plurality of materials, they can be formed as a mixed layer. In the case where a plurality of materials are used, as long as the materials include at least one material which can be doped or dedoped electrochemically, the other materials may be materials which cannot be doped or dedoped. Specifically, the material may be either an insulator or an organic electrolyte. These organic compounds are formed by an evaporation method, a spin coating method, an ink jet method, a dip coating method, a printing method, or the like. By employing these methods, a thin film with high film quality and controlled film thickness can be formed. Thus, simplification of a manufacturing process and cost reduction for a storage device are possible.

As the material which can be doped or dedoped electrochemically, the followings can be given: anthracene derivatives such as 9,10-diphenylanthracene and 9,10-di(2-naphtyl)anthracene; bianthryl derivatives such as 10,10'-diphenyl9,9'-dianthracene; pyrene derivatives such as 1,3,6,8-tetraphenylpyrene, carbazole derivatives such as 4,4'-di(N-carbazolyl)biphenyl; oxazole derivatives such as 4,4'-bis (5-methylbenzoxazole-2-yl)stilbene; and stilbene derivatives such as 4,4'-bis (2,2-diphenylethenyl)biphenyl. Alternatively, typical metal complexes such as tris (8-quinolinolato)aluminum (abbreviated as $Alq_3$), tris (4-methyl-8-quinolinolato) aluminum (abbreviated as $Almq_3$), bis (10-hydroxybenzo[h]-quinolinato)beryllium (abbreviated as $BeBq_2$), bis(2-methyl-8-quinolinolato)-(4-hydroxy-biphenylyl)-aluminum (abbreviated as BAlq), bis [2-(2-hydroxypheyl)-benzoxazolato]zinc (abbreviated as $Zn(BOX)_2$), and bis [2-(2-hydroxypheyl)-benzothiazolato]zinc (abbreviated as $Zn(BTZ)_2$) can be used. Further, triazole derivatives such as 3-(4-tert-buthylphenyl)-4-(4-ethylpheyl)-5-(4-biphenylyl)-1,2,4-triazole, phenanthroline derivatives such as bathophenanthroline or bathocuproine may be used.

As a more preferable material, a polymer which can be formed by a wet method such as a spin coating method, a dip coating method, or an ink jet method is given. Specifically, poly(phenylene vinylene), poly(phenylene ethynylene), polyfluorene, poly(acetylene), their substitution products, polysilane, polyaniline, polythiophene, polypyrrole, polypyridine, and the like are preferable. Since these polymers often have low solubility, it is preferable to introduce a substituent such as an alkyl group, and more preferable to introduce an alkyl group with 1 to 6 carbon atoms. These materials are usually formed by a wet method; however, an evaporation method may also be used.

Such a structure makes it possible to dope or dedope an organic compound provided between conductive layers just by changing a positive and negative potential to be applied to the conductive layers. This will be described with reference to 2A to 4B.

Figure 2A:
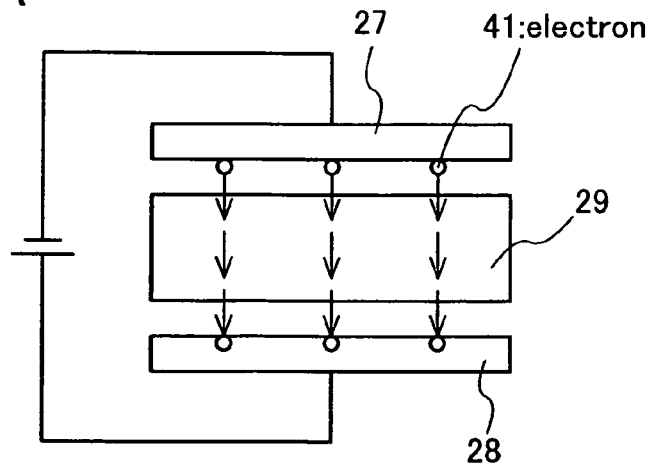
FIGS. 2A to 2C show structural examples of a semiconductor device of the present invention.
Figure 2B:
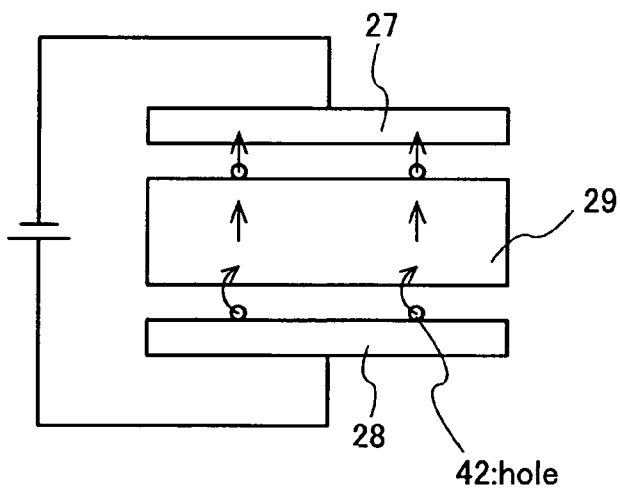
Figure 2C:
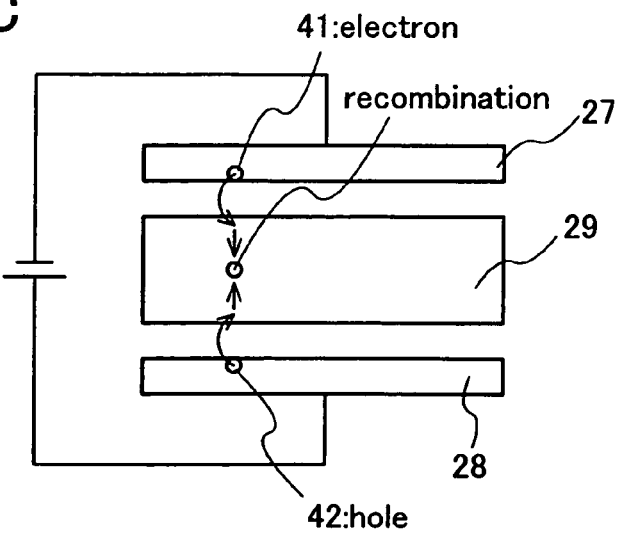

A storage element in which two conductive layers use a metal of which a standard potential is +0.8 V or higher with a saturated calomel electrode as a reference will be examined in FIGS. 2A to 2C. Specifically, a case of using a metal of which an ionization tendency is low, such as Pt or Au, will be referred to. Between these two conductive layers is provided the aforementioned organic compound layer 29, i.e., a material which can be electrochemically doped or dedoped. If the organic compound layer 29 is in a dedoped condition in an initial state, the following three phenomena may occur by feeding current from the second conductive layer 28 as an anode to the first conductive layer 27 as a cathode.

The first phenomenon is that electrons 41 are injected from the cathode into the organic compound layer 29 to n-dope the organic compound. In other words, the organic compound is reduced by one electron to become an anion species. However, since a counter cation does not exist and an electric field is applied to an element, the injected electrons 41 do not stay in one organic compound molecule but go toward the anode while hopping along a lowest unoccupied molecular orbital (LUMO) of the organic compound. If holes are not injected in the anode, the electrons go through to reach the anode (see FIG. 2A).

The second phenomenon is that holes 42 are injected from the anode into the organic compound layer 29 to p-dope the organic compound, i.e., oxidize the organic compound. However, even in this case, since a counter anion does not exist and an electric field is applied to the element, the injected holes 42 go toward the cathode while hopping along a highest occupied molecular orbital (HOMO) of the organic compound. If the electrons are not injected in the cathode, the holes 42 reach the cathode (see FIG. 2B).

If the first and second phenomena occur, electrons are transported between the organic compound layer and the conductive layers; however, the initial state is obtained at the end and the organic compound layer cannot be doped.

The third phenomenon is that the holes 42 are injected from the anode to the organic compound layer 29 to p-dope the organic compound, i.e., oxidize the organic compound, so that the organic compound becomes a cation species. At the same time, the electrons 41 are injected from the cathode into the organic compound layer 29, so that the organic compound is n-doped, i.e., reduced to become an anion species (FIG. 2C). In this case, since a cation species and an anion species exist, charges are kept neutral in the element. However, since these ion species of the organic compounds can hardly move, each of the ion species is localized. Such a state is very disadvantageous in terms of energy, so that the electrons go toward the anode and the holes go toward the cathode similarly to the first and second phenomena.

As a result, similarly to the first and second phenomena, the electrons reach the anode and the holes reach the cathode. Alternatively, the electrons 41 and the holes 42 are recombined. In the case of recombination, the organic compound becomes an excited state; however, the excited organic compound is immediately deactivated to a ground state and returns to the initial state. Therefore, if conductive layers of which an ionization tendency is so low that ionization does not occur are used for both electrodes, the organic compound provided between the conductive layers cannot be doped. Even if the organic compound is either p-doped or n-doped in the initial state, the organic compound cannot be dedoped. In other words, the organic compound does not have a function that is required as a storage element.

Figure 3A:
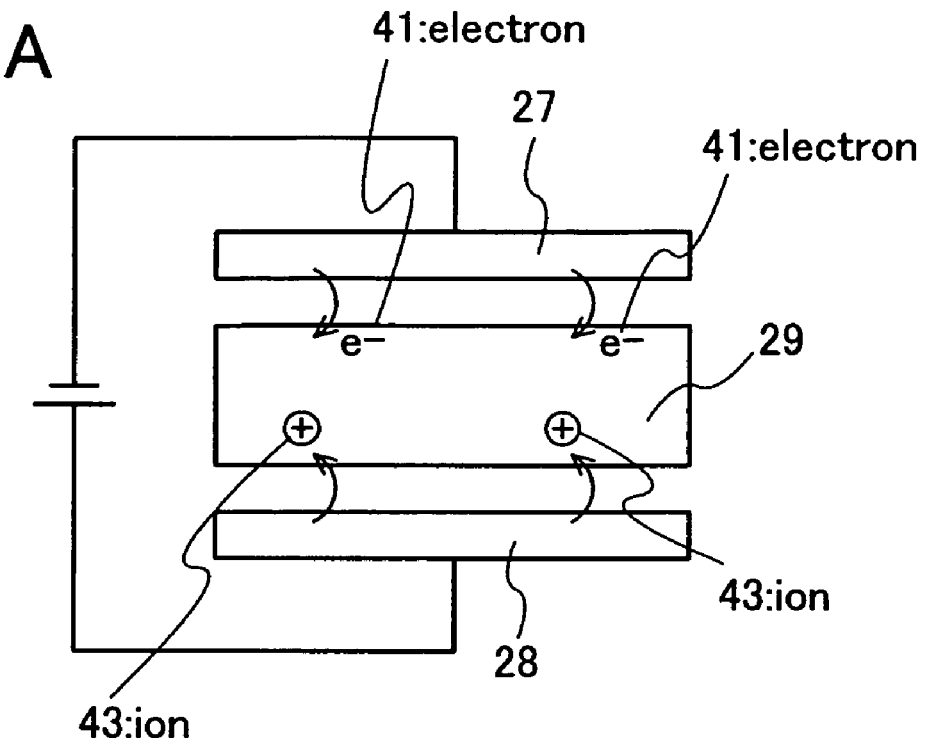
FIGS. 3A and 3B show structural examples of a semiconductor device of the present invention.

In contrast, description is made on a storage element with reference to FIG. 3A which uses a metal having a standard potential of +0.8 V or higher with a saturated calomel electrode as a reference for one conductive layer (referred to as the first conductive layer 27) and which uses a metal having a standard potential of −3.0 V or higher and +0.8 V or lower with a saturated calomel electrode as a reference for the other conductive layer (referred to as the second conductive layer 28). In the initial state, the organic compound is in a dedoped condition, and the following phenomenon occurs by feeding current with the first conductive layer 27 used as a cathode and the second conductive layer 28 used as an anode.

The electron 41 is injected from the cathode to n-dope the organic compound. In other words, the organic compound is reduced by one electron to become an anion species. However, since oxygen overvoltage of the electrode using the aforementioned second conductive layer is so low at an interface between the anode and the organic compound layer 29 that hole injection into the organic compound layer 29, i.e., oxidation of the organic compound layer does not occur and the second conductive layer itself is oxidized. Accordingly, the anode is ionized to become a metal cation (ion 43) and diffuses in the organic compound layer 29. Thus, a counter cation against the anion species, which has been generated by n-doping the organic compound, is generated to keep neutrality of electric charge for the organic compound layer 29. Such a state is stable in terms of thermodynamics, so that n-doping is completed. This changes the conductivity of the organic compound layer 29 greatly to allow information to be written.

Figure 3B:
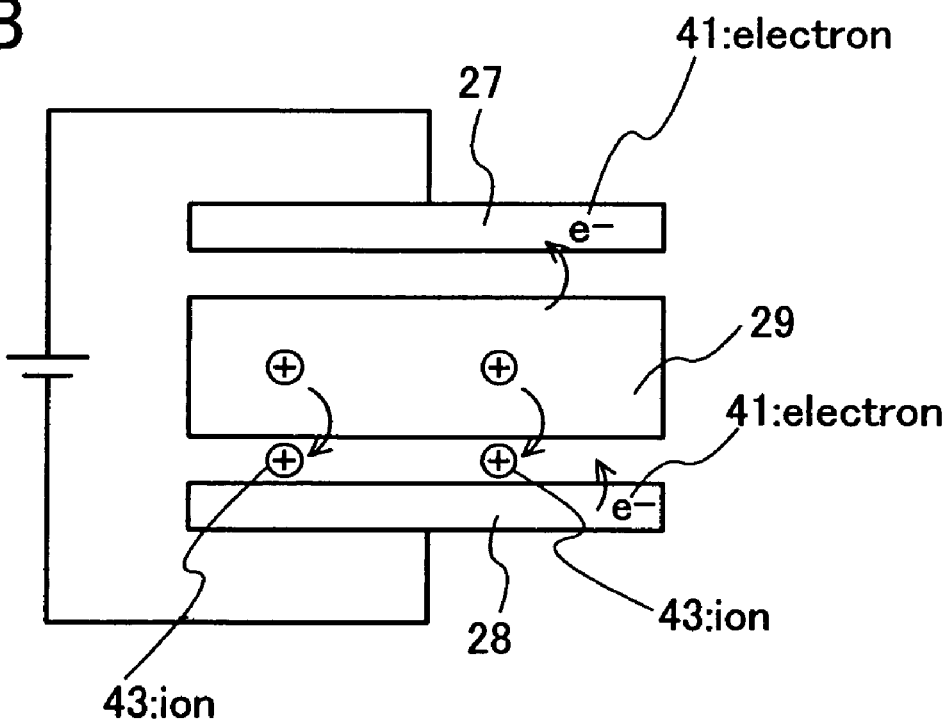

Next, a case of inverting the positive and negative potential to be applied to this storage element in order to erase information will be described with reference to FIG. 3B. Since information is erased by inverting the positive and negative potential to be applied, the first conductive layer 27 functions as the anode and the second conductive layer 28 functions as the cathode. In FIG. 3B, the organic compound layer 29 which has been n-doped is sandwiched between the first conductive layer 27 and the second conductive layer 28. In the case where the first conductive layer 27 functions as the anode and the second conductive layer 28 functions as the cathode and current is fed with its positive and negative potential to be applied inverted, the following phenomenon occurs.

In the vicinity of the anode, the anode has such a low ionization tendency that the anode is not oxidized and derives the electrons 41 from the organic compound layer 29 which has been n-doped; thus, dedoping progresses. On the other hand, in the vicinity of the cathode, the electrons 41 are injected from the cathode into the organic compound layer. However, it is difficult to further inject electrons into the organic compound layer 29 for which the n-doping has been completed. Therefore, the organic compound is not n-doped further. Instead, the ion 43 which is diffused moves to the cathode to be reduced to become a zero-valent metal and is then attached to the cathode. With the above results considered over the entire element, the organic compound layer 29 which has been n-doped is dedoped. This changes the conductivity of the organic compound layer 29 greatly to allow information to be erased.

Although this embodiment mode has shown the example in which information is written by n-doping the dedoped organic compound layer 29 and the information is erased by dedoping the organic compound layer 29 by inverting the positive and negative potential, the information may be written by providing in advance an n-doped organic compound layer and dedoping the organic compound layer and the information may be erased by n-doping the organic compound layer again. Moreover, the information may be written and erased by utilizing a difference in conductivity in p-doped and dedoped conditions instead of the n-doped and dedoped conditions.

Figure 4A:
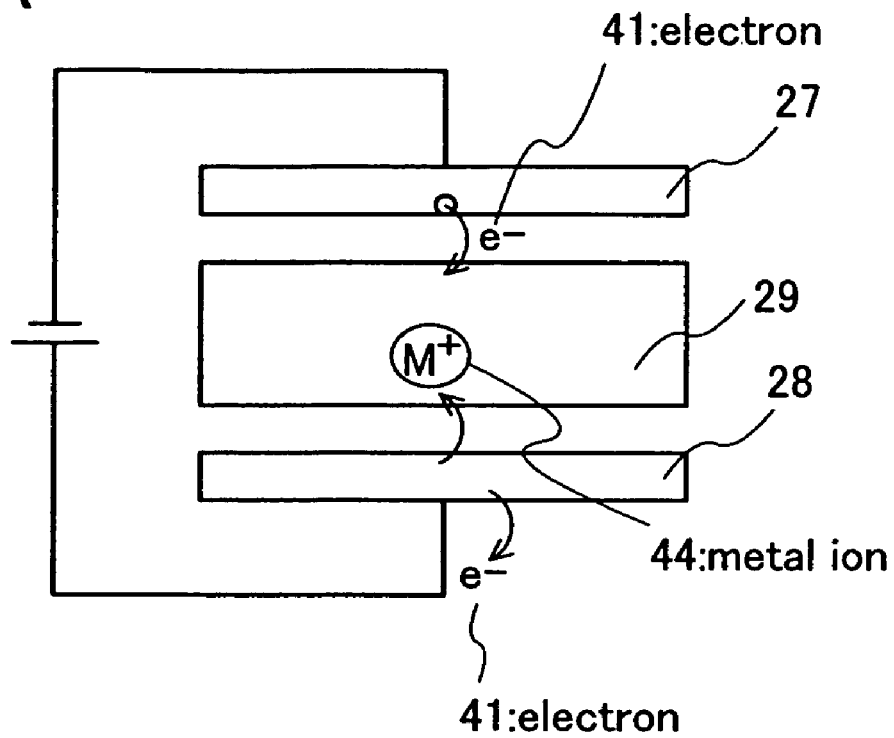
FIGS. 4A and 4B show structural examples of a semiconductor device of the present invention.
Figure 4B:
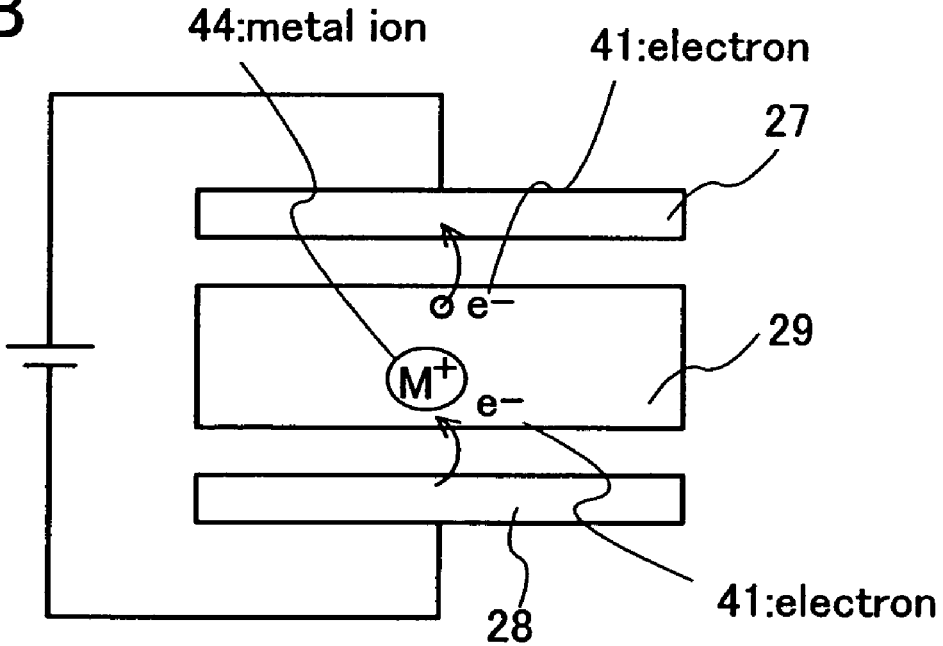

Similarly, description will be made with reference to FIGS. 4A and 4B on a storage element which uses a metal having a standard potential of −3.0 V or higher and +0.8 V or lower with a saturated calomel electrode as a reference for both of the first conductive layer 27 and the second conductive layer 28. In the initial state, the organic compound layer 29 is in a dedoped condition, and the following phenomenon occurs in the case where current is fed by using the first conductive layer 27 as the cathode and the second conductive layer 28 as the anode.

As for the cathode, since the first conductive layer has high hydrogen overvoltage, the electrons 41 are easily injected in the organic compound layer 29 and the organic compound layer 29 receives the electrons 41. That is, n-doping progresses. However, since the second conducive layer has low oxygen overvoltage at an interface between the anode and the organic compound layer 29, the organic compound is not oxidized. Therefore, hole injection from the anode to the organic compound layer 29, i.e., oxidation of the organic compound layer 29 does not occur but the second conductive layer itself is oxidized. Accordingly, a part of the anode, particularly a part of the anode that is in the vicinity of the interface between the anode and the organic compound layer 29 becomes a cation (metal ion 44) to diffuse to the organic compound layer 29. Therefore, when the entire element is viewed, the organic compound layer 29 becomes an anion species and its counter cation is supplied from the anode to allow a reduction reaction of the organic compound to be achieved. This means that the organic compound layer 29 can be n-doped. This changes the conductivity of the organic compound layer 29 greatly to allow information to be written.

Meanwhile, a case of erasing information by inverting the positive and negative potential to be applied to the element in which the writing has been completed will be described with reference to FIG. 4B. In the case where the first conductive layer 27 is used as the anode and the second conductive layer 28 is used as the cathode and current is fed with its applying positive and negative potential inverted, the following phenomenon occurs.

Since the organic compound layer 29 which has been n-doped can be easily oxidized in the vicinity of the first conductive layer 27, the first conductive layer 27 is not oxidized and the organic compound layer 29 which has been n-doped is dedoped. Meanwhile, in the vicinity of the second conductive layer 28, it is difficult to further inject an electron to the organic compound layer 29 in which n-doping has been completed. Therefore, the metal ion 44 from the first conductive layer 27 is reduced to be attached to the first conductive layer 27. Thus, when the entire element is viewed, the organic compound layer 29 which has been n-doped is dedoped. In other words, the information can be erased. Even in this element, the organic compound layer 29 which has been n-doped may be provided in advance and the information may be written by dedoping the organic compound layer 29 and the information may be erased by n-doping the organic compound layer 29 again. Moreover, the information may be written and erased by utilizing a difference in conductivity in p-doped and dedoped conditions instead of the n-doped and dedoped conditions.

Embodiment Mode 2

This embodiment mode will describe a structural example of a storage circuit including an organic compound layer in a storage element portion with reference to drawings. More specifically, this embodiment mode will show a case of a storage circuit having a passive matrix structure.

Figure 5A:
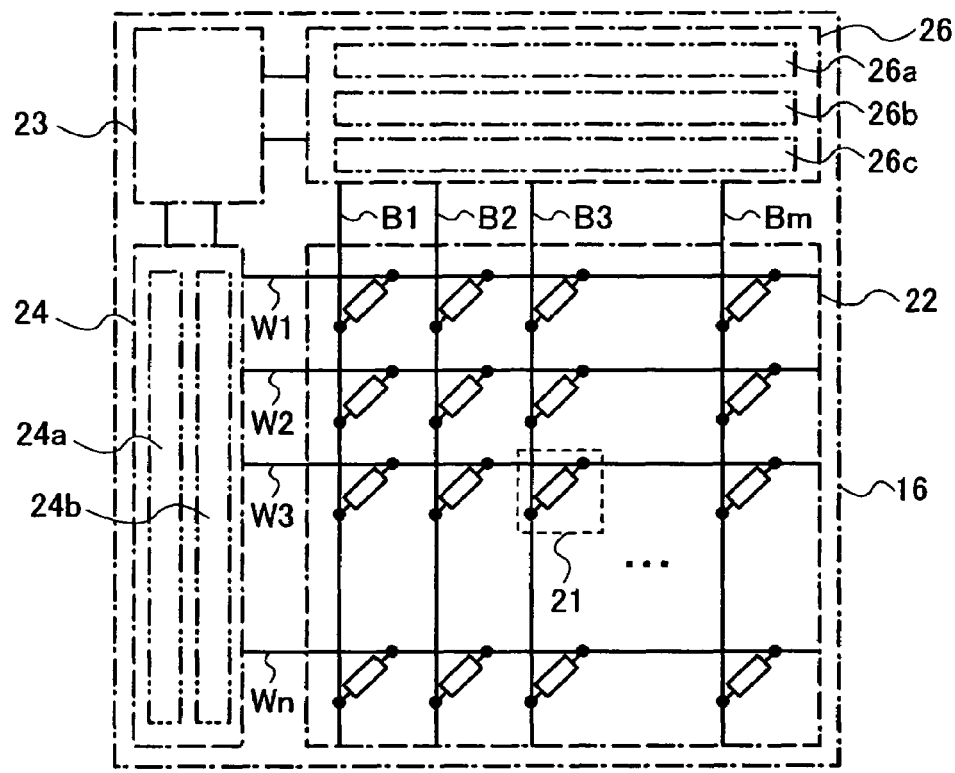
FIGS. 5A and 5B show structural examples of a semiconductor device of the present invention.

FIG. 5A shows a structural example of a semiconductor device of the present invention, which includes a memory cell array 22 in which memory cells 21 are arranged in a matrix form; a bit line driver circuit 26 having a column decoder 26a, a reading circuit 26b, and a selector 26c; a word line driver circuit 24 having a row decoder 24a and a level shifter 24b; and an interface 23 having a writing circuit and the like to communicate with the outside. It is to be noted that the structure of the storage circuit 16 shown here is just one example, and the storage circuit 16 may further include other circuits such as a sense amplifier, an output circuit, and a buffer circuit and moreover, the writing circuit may be provided in the bit line driver circuit.

The memory cell 21 has a structure in which an organic compound layer is provided between a pair of conductive layers (hereinafter also referred to as an organic memory element). Here, the memory cell 21 has a first conductive layer that forms a word line Wy ($1 \leq y \leq n$), a second conductive layer that forms a bit line Bx ($1 \leq x \leq m$), and an organic compound layer provided between the first conductive layer and the second conductive layer. The organic compound layer is provided in a single-layer or multilayer structure.

Figure 5B:
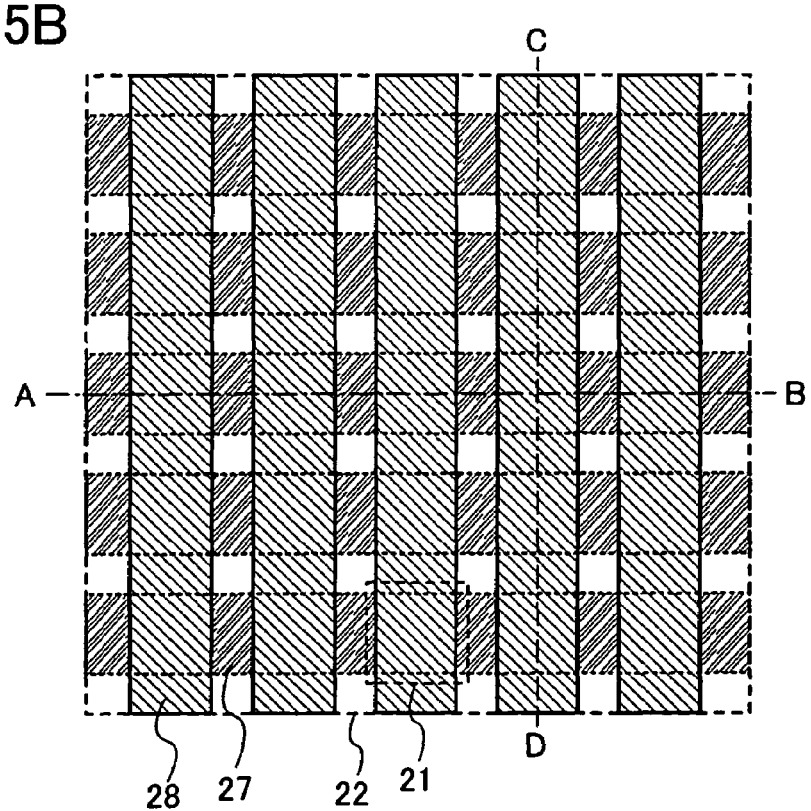

An example of a top-surface structure of the memory cell array 22 is shown in FIG. 5B.

The memory cell array 22 has the first conductive layer 27 extending in a first direction, an organic compound layer provided covering the first conductive layer 27, and the second conductive layer 28 extending in a second direction that is different from the first direction (here, the second direction is perpendicular to the first direction). Further, an organic compound layer is provided between the first conductive layer 27 and the second conductive layer 28. The first conductive layer 27 and the second conductive layer 28 correspond to the word line Wy and the bit line Bx, respectively.

Next, a method for manufacturing an organic memory having the above structure will be described with reference to FIGS. 6A to 6D. It is to be noted that the FIGS. 6A to 6D show a cross-sectional structure along a line A-B in the memory cell array 22 shown in FIG 5B.

Figure 6A:
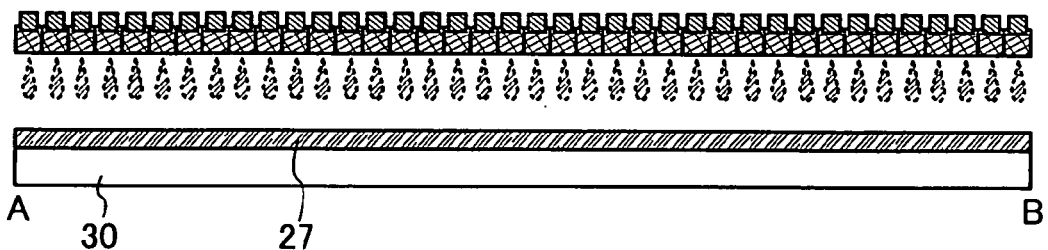
FIGS. 6A to 6D show an example of a method for manufacturing a semiconductor device of the present invention.

First, the first conductive layer 27 is formed over the substrate 30 by selectively discharging a composition having conductivity (FIG. 6A). The first conductive layer 27 may be formed not only by a droplet discharging method but also by an evaporation method, a sputtering method, a CVD method, a spin coating method, or a printing method such as a screen printing method or a gravure printing method. For example, the first conductive layer 27 can be formed with a conductive material by a sputtering method or a CVD method and then selectively etching the conductive material using a photolithography method.

Figure 6B:
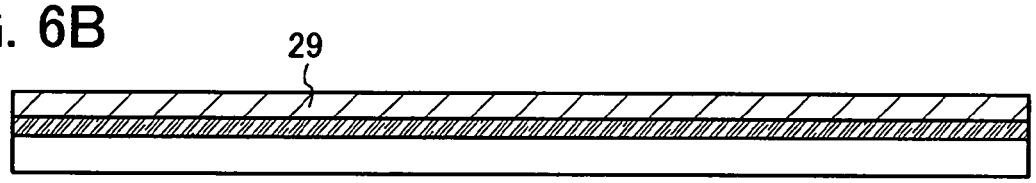

Next, the organic compound layer 29 is formed so as to cover the first conductive layer 27 (FIG. 6B). The organic compound layer 29 can be formed by a droplet discharging method, a screen printing method, gravure printing, a spin coating method, or an evaporation method. These methods can improve working efficiency.

Figure 6C:
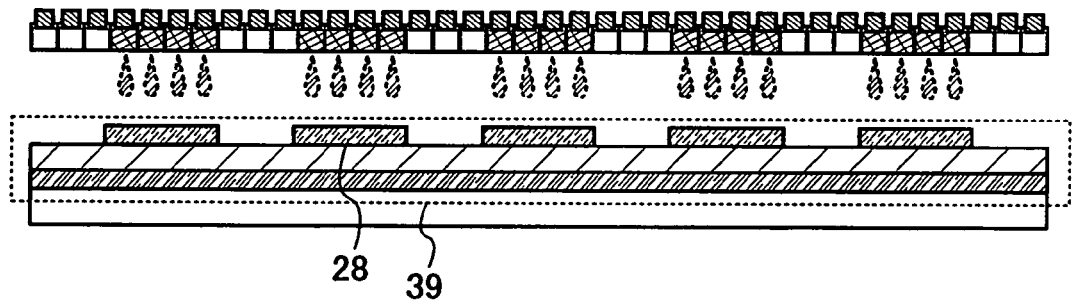

Subsequently, the second conductive layer 28 is formed by selectively discharging a conductive composition over the organic compound layer 29 (FIG. 6C). Here, a storage element portion 39 having a plurality of organic memory elements is formed by stacking the first conductive layer 27, the organic compound layer 29, and the second conductive layer 28. The second conductive layer 28 may be formed by a different method from a method of forming the first conductive layer 27. For example, the first conductive layer 27 can be formed by forming a conductive material over the entire surface by a CVD method or a sputtering method and then selectively etching the conductive material, and the second conductive layer 28 can be directly formed selectively by a droplet discharging method, a screen printing method, or the like. In this case, since etching is not necessary for forming the second conductive layer 28, damage to the organic compound layer 29 can be suppressed.

Figure 6D:
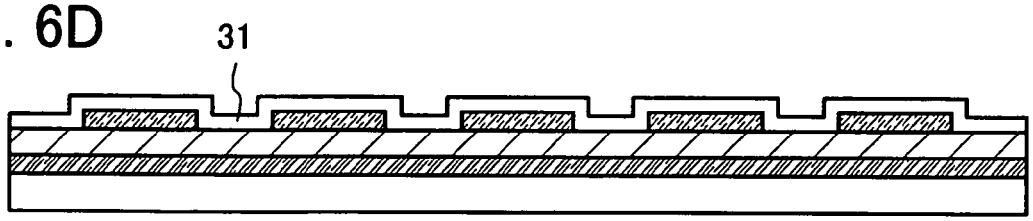

Next, an insulating layer 31 is provided as a protective film so as to cover the second conductive layer 28 (FIG. 6D).

By the above steps, a semiconductor device having a passive matrix storage circuit can be formed. Next, a material and the like used for each of the aforementioned steps are specifically described.

As the substrate 30, a glass substrate made of barium borosilicate glass, aluminoborosilicate glass, or the like; a quartz substrate; a ceramic substrate; or the like can be used. Alternatively, a metal substrate including stainless steel or a semiconductor substrate over which an insulating layer is formed may be used. Although a flexible substrate made of a synthetic resin such as plastic, for example PET, tends to have lower allowable temperature limit than the above substrate in general, the flexible substrate can also be used as long as the substrate can resist process temperature in the manufacturing steps. It is to be noted that a surface of the substrate 30 may be flattened by polishing by a CMP method or the like.

Either one or both of the first conductive layer 27 and the second conductive layer 28 may be formed with a metal having a standard potential of $-3.0$ V or higher and $+0.8$ V or lower with a saturated calomel electrode as a reference. Specifically, magnesium (Mg), aluminum (Al), zinc (Zn), chromium (Cr), iron (Fe), cadmium (Cd), cobalt (Co), nickel (Ni), or the like is preferred. One kind of element selected from these metals or a single layer of an alloy containing a plurality of the elements or a multilayer structure can be used.

In the case where one of the first conductive layer 27 and the second conductive layer 28 is formed with the metal or alloy, the other metal may be formed with a metal or alloy having a standard potential of +0.8 V or higher with a saturated calomel electrode as a reference. Specifically, gold (Au), silver (Ag), platinum (Pt), palladium (Pd), or the like is preferred. Moreover, metal oxide having a transparent property may be used. As the transparent conductive material, indium tin oxide (ITO), zinc oxide (ZnO), indium zinc oxide (IZO), gallium-doped zinc oxide (GZO), or other conductive oxide having a light-transmitting property can be used. Moreover, indium tin oxide containing silicon oxide, or indium oxide containing silicon oxide which is further mixed with 2 to 20 wt % of zinc oxide (ZnO) may be used. The above material can be formed by a droplet discharging method, an evaporation method, a sputtering method, a CVD method, a spin coating method, or a printing method such as a screen printing method or a gravure printing method. For example, Ag can be formed by a droplet discharging method and Al can be formed by an evaporation method.

The organic compound layer 29 is formed in a single-layer or multilayer structure with a material which can be electrochemically doped or dedoped. Alternatively, in the case of using a plurality of materials, a mixed layer may be used. In the case where a plurality of materials are used, as long as there is at least one material which can be electrochemically doped or dedoped, the other materials may be ones which cannot be electrochemically doped or dedoped. Specifically, an insulator or an organic electrolyte may be used. These organic compounds are formed by an evaporation method, a spin coating method, an ink jet method, a dip coating method, a printing method, or the like. By employing these methods, a thin film with favorable film quality and controlled thickness can be manufactured. Thus, simplification of a manufacturing process and cost reduction of a storage device are possible.

As the material which can be doped or dedoped electrochemically, the followings can be given: anthracene derivatives such as 9,10-diphenylanthracene or 9,10-di(2-naphtyl)anthracene; bianthryl derivatives such as 10,10'-diphenyl9,9'-dianthracene; pyrene derivatives such as 1,3,6,8-tetraphenylpyrene, carbazole derivatives such as 4,4'-di(N-carbazolyl)biphenyl; oxazole derivatives such as 4,4'-bis (5-methylbenzoxazole-2-yl)stilbene; and stilbene derivatives such as 4,4'-bis (2,2-diphenylethenyl)biphenyl. Alternatively, typical metal complexes such as tris (8-quinolinolato)aluminum (abbreviated as Alq$_3$), tris (4-methyl-8-quinolinolato) aluminum (abbreviated as Almq$_3$), bis (10-hydroxybenzo[h]-quinolinato)beryllium (abbreviated as BeBq$_2$), bis(2-methyl-8-quinolinolato)-(4-hydroxy-biphenylyl)-aluminum (abbreviated as BAlq), bis [2-(2-hydroxypheyl)-benzoxazolato]zinc (abbreviated as Zn(BOX)$_2$), and bis [2-(2-hydroxypheyl)-benzothiazolato]zinc (abbreviated as Zn(BTZ)$_2$) can be used. Further, triazole derivatives such as 3-(4-tert-buthylphenyl)-4-(4-ethylpheyl) -5-(4-biphenylyl)-1,2,4-triazole, phenanthroline derivatives such as bathophenanthroline or bathocuproine may be used.

As a more preferable material, a polymer which can be formed by a wet method such as a spin coating method, a dip coating method, or an ink jet method is given. Specifically, poly(phenylene vinylene), poly(phenylene ethynylene), polyfluorene, poly(acetylene), their substitution products, polysilane, polyaniline, polythiophene, polypyrrole, polypyridine, and the like are preferable. Since these polymers often have low solubility, it is preferable to introduce a substituent such as an alkyl group, and more preferable to introduce an alkyl group with 1 to 6 carbon atoms. These materials are usually formed by a wet method; however, an evaporation method may also be used.

As the insulating layer 31, an inorganic material or the like having nitrogen or oxygen, such as silicon oxide ($SiO_x$), silicon nitride ($SiN_x$), silicon oxynitride ($SiO_xN_y$) (x>y), silicon nitride oxide ($SiN_xO_y$) (x>y), or the like can be formed in a single-layer or multilayer structure. In addition, an organic material such as polyimide, polyamide, polyvinylphenol, benzocyclobutene, acrylic, epoxy, or siloxane is formed in a single-layer or multilayer structure. Moreover, an organic material and an inorganic material may be stacked. The siloxane material corresponds to a material including a Si—O—Si bond. A skeletal structure of siloxane includes a bond of silicon and oxygen. As the substituent, an organic group including at least hydrogen (such as an alkyl group or aromatic hydrocarbon) is used. A fluoro group may be used as the substituent. Moreover, an organic group including at least hydrogen and a fluoro group may be used as the substituent.

The structure shown in FIGS. 6A to 6D is just an example, and the present invention is not restricted to this structure. A structure different from the above structure will be shown in FIGS. 7A to 7E.

Figure 7A:
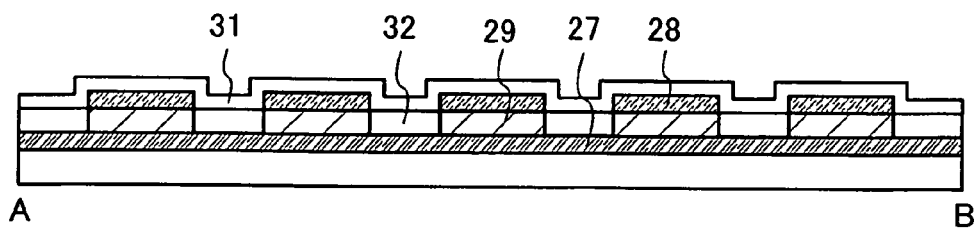
FIGS. 7A to 7E show structural examples of a semiconductor device of the present invention.

The organic compound layer 29 is formed over the entire surface so as to cover the first conductive layer 27 in FIGS. 6A to 6D. In the case where an effect of an electric field in a lateral direction between the adjacent memory cells is a concern, an insulating layer 32 may be provided between the organic compound layers provided for the respective memory cells in order to separate the organic compound layers provided for the memory cells (FIG. 7A). In other words, the organic compound layer 29 is selectively provided for each memory cell. In this case, the organic compound layer can be provided efficiently by selectively forming the organic compound layer for each memory cell by a droplet discharging method, a screen printing method, a gravure printing method, or the like.

Figure 7B:
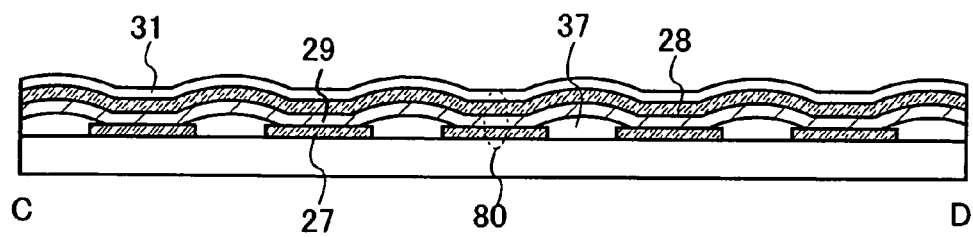

An insulating layer 37 may be provided between the first conductive layers 27 so as to cover end portions of the first conductive layers 27 in order to prevent an effect of an electric field in a lateral direction between the memory cells or prevent breakage of the organic compound layer 29 due to steps between the first conductive layers 27 when the organic compound layer 29 is provided covering the first conductive layer 27 (FIG. 7B). In this case, the insulating layer 37 can be formed selectively between the plurality of first conductive layers 27 by a droplet discharging method.

Figure 7C:
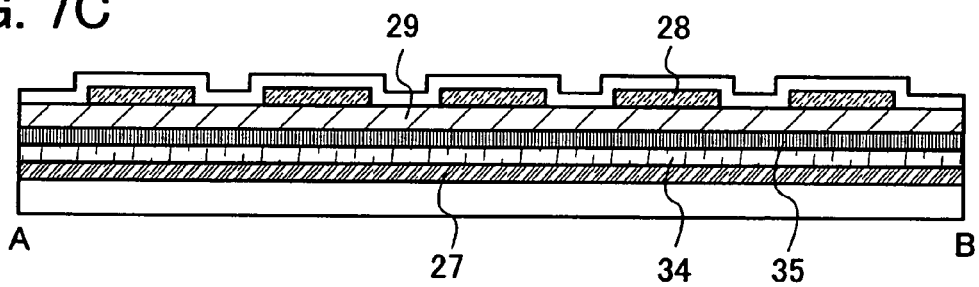
Figure 7D:
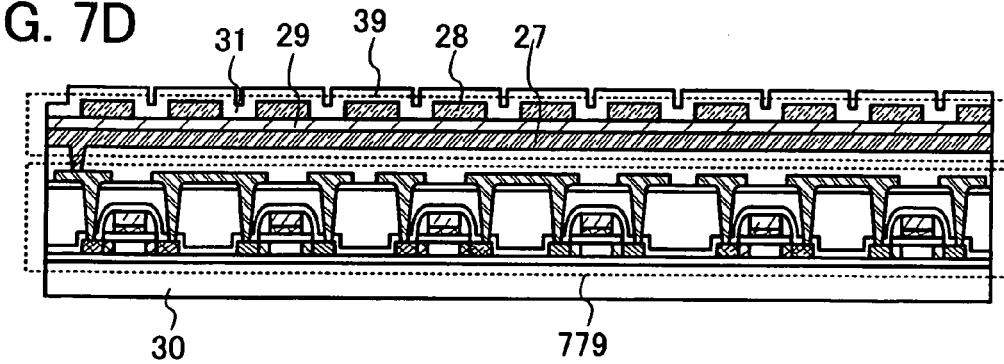

In the structure shown in FIGS. 6A to 6D, an element having a rectifying property may be provided between the first conductive layer 27 and the organic compound layer 29 (FIG. 7C). The element having a rectifying property is typically a schottky diode, a diode having PN junction, a diode having PIN junction, a transistor in which a gate electrode is connected to a drain electrode, or the like. Here, a case in which a PN junction diode including semiconductor layers 34 and 35 is provided between the first conductive layer 27 and the organic compound layer 29 is shown. One of the semiconductor layers 34 and 35 is an N-type semiconductor and the other is a P-type semiconductor. In this way, by providing a diode having a rectifying property, margin and accuracy of reading and writing operations can be improved. An element having a rectifying property may be provided between the organic compound layer 29 and the second conductive layer 28.

Figure 7E:
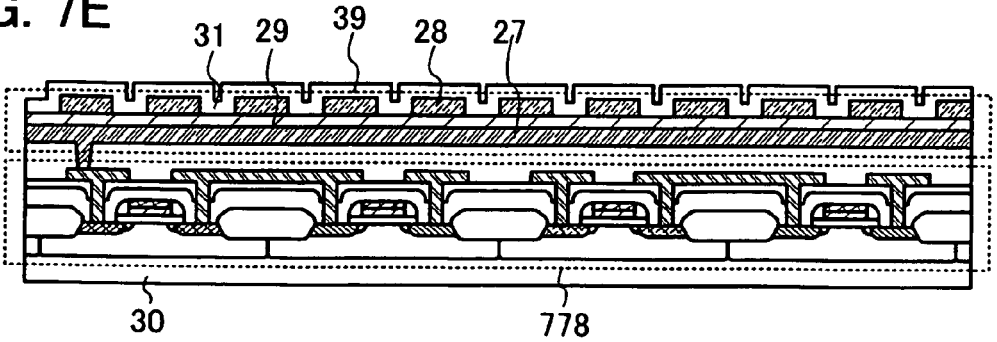

Although FIGS. 6A to 6D show a structure in which a storage element portion 39 is provided over the substrate 30, the present invention is not restricted to this structure. A thin film transistor (TFT) 779 may be formed over the substrate 30 and a storage element portion 39 may be formed over the thin film transistor 779 (FIG. 7D), or an field effect transistor (FET) 778 using a semiconductor substrate made of Si or the like or an SOI substrate as the substrate 30 and using the substrate as a channel portion may be formed and the storage element portion 39 may be formed over the field effect transistor 778 (FIG. 7E). Here, although an example of forming the storage element portion 39 over the thin film transistor 779 or the field effect transistor 778 has been shown here, the storage element portion 39 may be pasted to the thin film transistor 779 or the field effect transistor 778. In this case, the storage element portion 39 and the thin film transistor 779 or the field effect transistor 778 can be manufactured in different steps and then they can be pasted to each other using a conductive film or the like. The thin film transistor 779 or the field effect transistor 778 may have any structure as long as the structure is a known one.

Thus, since the organic compound layer of the storage element portion can be provided by a droplet discharging method, a printing method such as a screen printing method or a gravure printing method, or a spin coating method in this embodiment mode, an inexpensive storage device or semiconductor device can be manufactured easily. Moreover, since the storage element portion shown in this embodiment mode can be manufactured with a more minute structure, a storage device or semiconductor device having larger capacity can be obtained.

This embodiment mode can be freely combined with Embodiment Mode 1.

Embodiment Mode 3

This embodiment mode will describe a storage circuit and a semiconductor device having a structure different from the structure shown in Embodiment Mode 2. Specifically, this embodiment mode will show a case of a storage circuit having an active matrix structure.

Figure 8A:
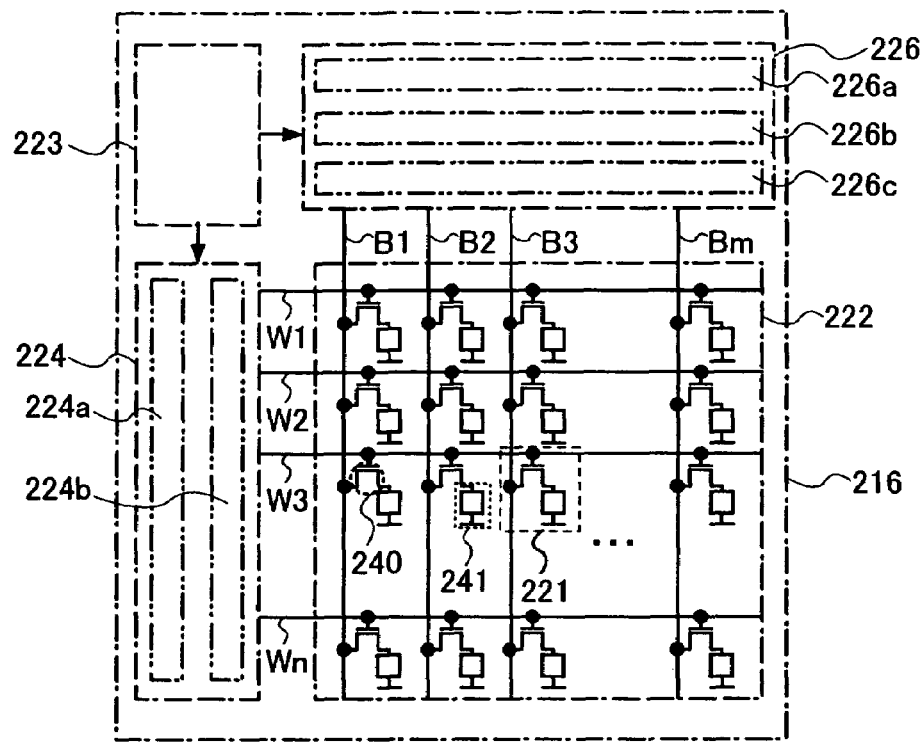
FIGS. 8A and 8B show structural examples of a semiconductor device of the present invention.

FIG. 8A shows a structural example of an organic memory shown in this embodiment mode, which includes a memory cell array 222 in which memory cells 221 are arranged in a matrix form; a bit line driver circuit 226 having a column decoder 226a, a reading circuit 226b, and a selector 226c; a word line driver circuit 224 having a row decoder 224a and a level shifter 224b; and an interface 223 having a writing circuit and the like to communicate with the outside. The structure of the storage circuit 216 shown here is just one example and the storage circuit 216 may further include other circuits such as a sense amplifier, an output circuit, and a buffer, and the writing circuit may be provided in the bit line driver circuit.

The memory cell 221 has at least a transistor 240 and a storage element 241 (organic memory element), and the transistor 240 is electrically connected to a first wire 231 that forms a word line Wy ($1 \leq y \leq n$) and a second wire 232 that forms a bit line Bx ($1 \leq x \leq m$).

Figure 8B:
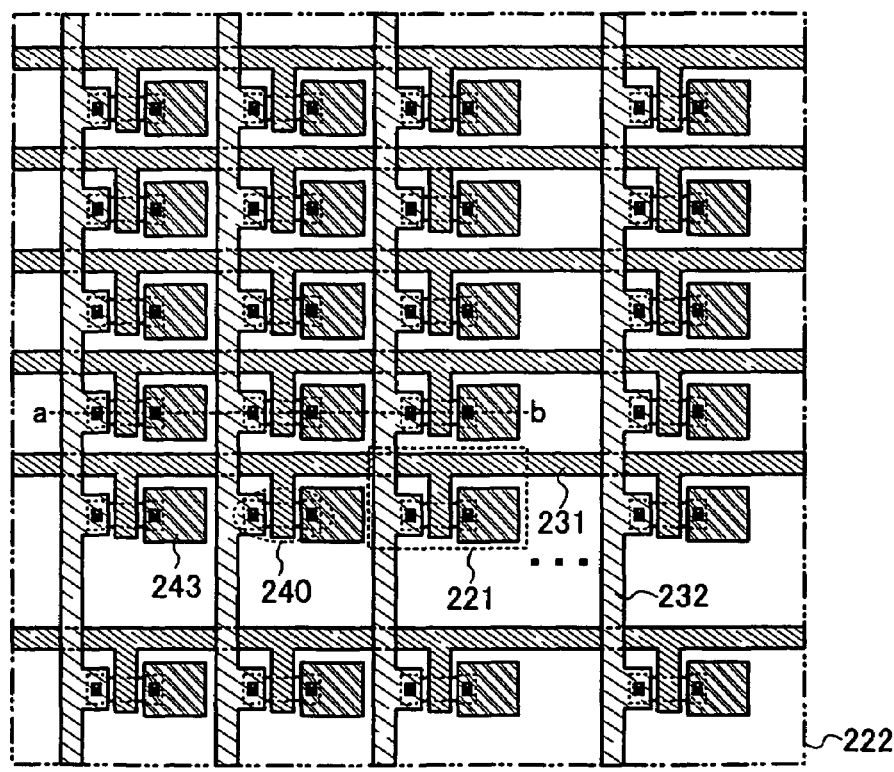

An example of a top-surface structure of the memory cell array 222 is shown in FIG. 8B.

The memory cell array 222 has the first wire 231 and the second wire 232 provided in a matrix form. The first wire 231 extends in a first direction and the second wire 232 extends in a second direction different from the first direction (here the second direction is perpendicular to the first direction). Here, the second wire 232 is electrically connected to one of source and drain electrodes of the transistor 240, and the first wire 231 is electrically connected to a gate electrode of the transistor 240. Moreover, the other of the source and drain electrodes that is not electrically connected to the second wire 232 is connected to a first conductive layer 243 and a storage element 241 is provided by a multilayer structure of the first conductive layer 243, the organic compound layer, and the second conductive layer.

Next, a method for manufacturing an organic memory having the above structure will be described with reference to FIGS. 9A to 9E. FIGS. 9A to 9E are cross-sectional views along a line a-b of the memory cell array 222 shown in FIG. 8B and show a cross-sectional structure of a CMOS circuit in the bit line driver circuit 226.

Figure 9A:
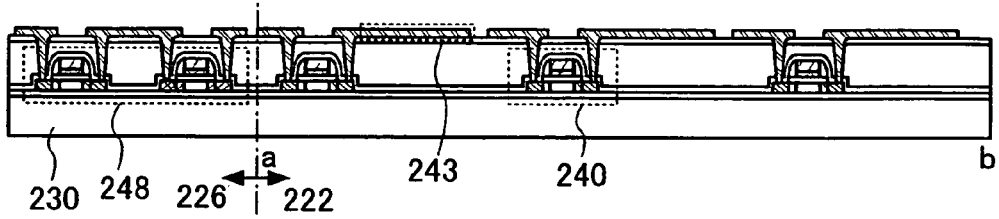
FIGS. 9A to 9E show a structural example of a method for manufacturing a semiconductor device.

First, a plurality of transistors 240 functioning as switching elements for storage elements and a transistor 248 that constitutes a part of a CMOS circuit in the bit line driver circuit 226 are formed over a substrate 230. After that, a source electrode or a drain electrode is formed so as to electrically connect to a source region or a drain region of the transistor 240 (FIG. 9A). Here, one of a source electrode and a drain electrode of the transistor 240 is also used as the first conductive layer 243 included in the storage element. Moreover, if different materials are used for the source or drain electrode and the first conductive layer 243, the first conductive layer 243 may be separately formed after forming the source or drain electrode. The first conductive layer 243 can be formed by an evaporation method, a sputtering method, a CVD method, a droplet discharging method, a spin coating method, or a printing method such as a screen printing method or a gravure printing method.

Figure 9B:
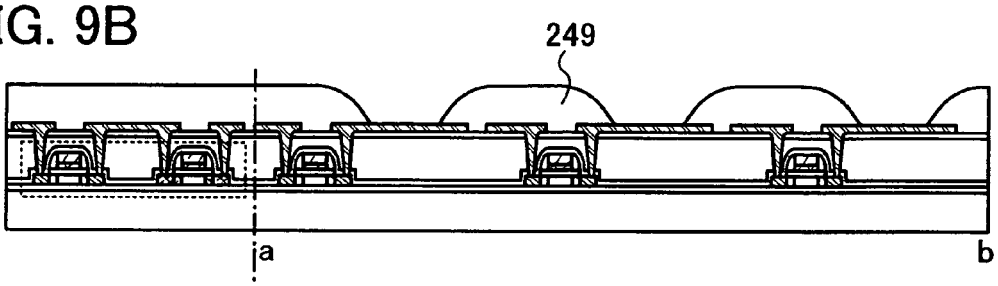

Next, an insulating layer 249 functioning as a protective film is formed so as to cover source electrodes and drain electrodes of the transistors 240 and 248 and an end portion of the first conductive layer 243 (FIG. 9B). For example, the insulating layer 249 may be directly formed selectively by a droplet discharging method, a screen printing method, or a gravure printing method. Alternatively, the insulating layer 249 may be formed by a CVD method, a sputtering method, or a spin coating method and then selectively etching to expose the first conductive layer 243.

Figure 9C:
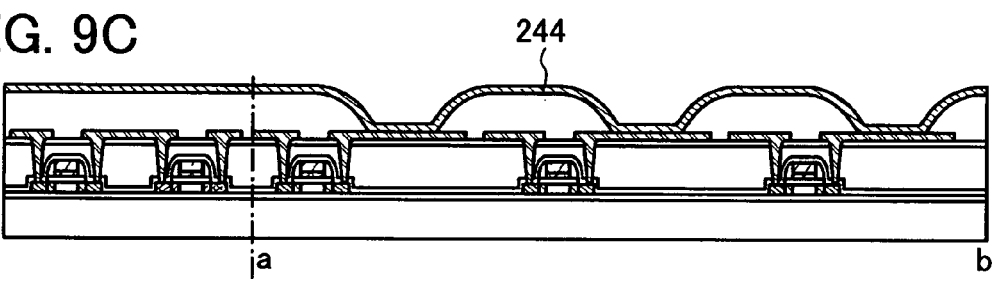

Subsequently, an organic compound layer 244 is formed over the first conductive layer 243 (FIG. 9C). The organic compound layer 244 may be formed over the entire surface as shown in FIG. 9C, or may be formed selectively so that the organic compound layers provided for the memory cells are separated from each other. The organic compound layer 244 can be formed by a droplet discharging method, a screen printing method, a gravure printing method, a spin coating method, an evaporation method, or the like. In the case of providing the organic compound layer 244 over the substrate 230 as shown in FIGS. 9A to 9E, working efficiency can be improved by using a spin coating method or an evaporation method. Moreover, in the case of providing the organic compound layer 244 selectively, working efficiency of a material can be improved by using a droplet discharging method, a screen printing method, a gravure printing method, or the like. Moreover, even in the case of using a spin coating method or an evaporation method, the organic compound layer can be selectively provided by providing a mask selectively in advance or by etching after forming a mask over the entire surface. A practitioner may choose appropriately which method to use.

Figure 9D:
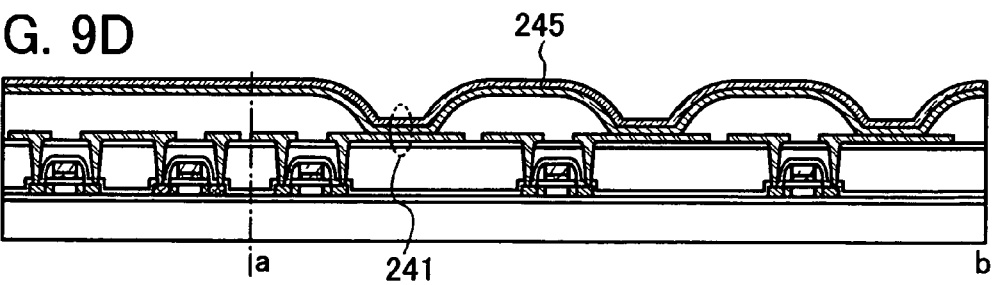

Next, a second conductive layer 245 is formed over the organic compound layer 244 (FIG. 9D). The second conductive layer 245 can be formed by an evaporation method, a sputtering method, a CVD method, a droplet discharging method, a spin coating method, or a printing method such as a screen printing method or a gravure printing method, similarly to the first conductive layer. The first conductive layer 243 and the second conductive layer 245 may be formed by different methods. The storage element 241 (organic memory element) is formed by stacking the first conductive layer 243, the organic compound layer 244, and the second conductive layer 245.

Figure 9E:
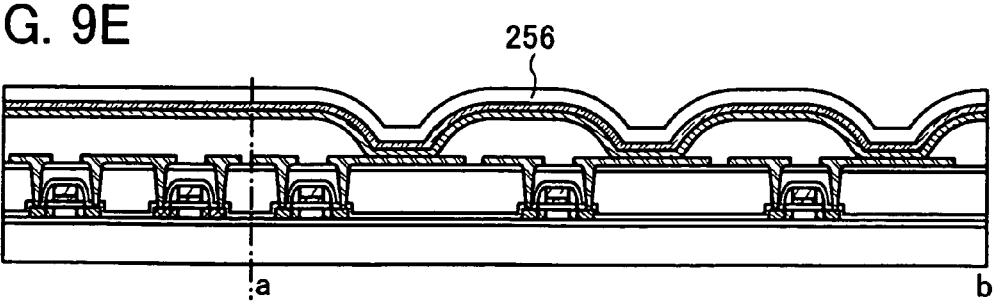

Next, an insulating layer 256 functioning as a protective film is formed so as to cover the second conductive layer 245 (FIG. 9E). The insulating layer 256 can be formed in a single-layer or multilayer structure by an evaporation method, a sputtering method, a CVD method, a droplet discharging method, a spin coating method, a screen printing method, a gravure printing method, or the like.

By the above steps, a semiconductor device having an active matrix storage circuit can be formed. Subsequently, a material and the like used for the steps are specifically described.

As the substrate 230, a glass substrate made of barium borosilicate glass, aluminoborosilicate glass, or the like; a quartz substrate; a ceramic substrate; or the like can be used. Alternatively, a metal substrate including stainless steel or a semiconductor substrate over which an insulating layer is formed may be used. Although a flexible substrate made of synthetic resin such as plastic, for example PET, tends to have lower allowable temperature limit than the above substrate in general, the flexible substrate can also be used as long as the substrate can resist process temperature in the manufacturing steps. It is to be noted that a surface of the substrate 230 may be flattened by polishing by a CMP method or the like.

The transistor 240 may have any structure as long as the transistor 240 can function as a switching element. For example, a thin film transistor (TFT) may be formed over a glass or flexible substrate as the substrate 230, or a field effect transistor (FET) using a semiconductor substrate made of Si or the like or an SOI substrate as a channel region of the transistor may be formed. Moreover, an organic transistor using an organic material for a channel region of the transistor may be formed. Although a planar type thin film transistor is provided over an insulating substrate in FIGS. 9A to 9E, a transistor having a staggered structure or an inverted staggered structure can be formed.

Moreover, semiconductor layers in the transistors 240 and 248 may have any structure, and for example, an impurity region (such as a source region, a drain region, a GOLD region, and an LDD region) can be formed. The transistor may be either a p-channel transistor or an n-channel transistor. The circuit may be only a p-channel type or an n-channel type, or may be a CMOS circuit using both of them. Moreover, an insulating layer (sidewall) may be formed in contact with a side surface of the gate electrode, or a silicide layer may be formed at a source region and a drain region, or a gate electrode. As a material for the silicide layer, nickel, tungsten, molybdenum, cobalt, platinum, or the like can be used.

Either one or both of the first conductive layer 243 and the second conductive layer 245 may be formed with a metal having a standard potential of −3.0 V or higher and +0.8 V or lower with a saturated calomel electrode as a reference. Specifically, magnesium (Mg), aluminum (Al), zinc (Zn), chromium (Cr), iron (Fe), cadmium (Cd), cobalt (Co), nickel (Ni), or the like is preferred. A single layer including one kind of element selected from these metals or an alloy containing a plurality of the elements, or a multilayer structure can be used.

In the case where one of the first conductive layer 243 and the second conductive layer 245 is formed with the metal or alloy, the other one may be formed with a metal or alloy having a standard potential of +0.8 V or higher with a saturated calomel electrode as a reference. Specifically, gold (Au), silver (Ag), platinum (Pt), palladium (Pd), or the like is preferred. Moreover, a conductive material including metal oxide with a transparent property may be used. As the transparent conductive material, indium tin oxide (ITO), zinc oxide (ZnO), indium zinc oxide (IZO), gallium-doped zinc oxide (GZO), or other conductive oxide materials having a light-transmitting property can be used. Moreover, indium tin oxide containing silicon oxide, or indium oxide containing silicon oxide which is further mixed with 2 to 20 wt % of zinc oxide (ZnO) may be used. The above materials can be formed by a droplet discharging method, an evaporation method, a sputtering method, a CVD method, a spin coating method, or a printing method such as a screen printing method or a gravure printing method. For example, Ag can be formed by a droplet discharging method and Al can be formed by an evaporation method.

The organic compound layer 244 can be formed with a material which is similar to the material of the organic compound layer 29 shown in Embodiment Mode 1. As an example, Al, Zn, or Mg or an alloy containing Al, Zn, or Mg is formed as the first conductive layer, poly(phenylene vinylene), poly(phenylene ethylene), or the like is provided as the organic compound layer, and Ag, Au, Pt, or the like is provided thereover as the second conductive layer by a droplet discharging method, thereby forming the storage element portion.

The insulating layers 249 and 256 can be formed in a single-layer or multilayer structure with an inorganic material having oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y), or an organic material such as polyimide, polyamide, polyvinyl phenol, benzocyclobutene, acrylic, epoxy, or siloxane. Moreover, the organic material and the inorganic material may be stacked. Polyimide, polyamide, polyvinylphenol, benzocyclobutene, acrylic, epoxy, siloxane, or the like can be formed efficiently by using a droplet discharging method, a printing method, or a spin coating method.

In the above structure, an element having a rectifying property may be provided between the first conductive layer 243 and the organic compound layer 244, or between the organic compound layer 244 and the second conductive layer 245. As the element having a rectifying property, any of the structures shown in the above embodiment modes may be employed.

Figure 10A:
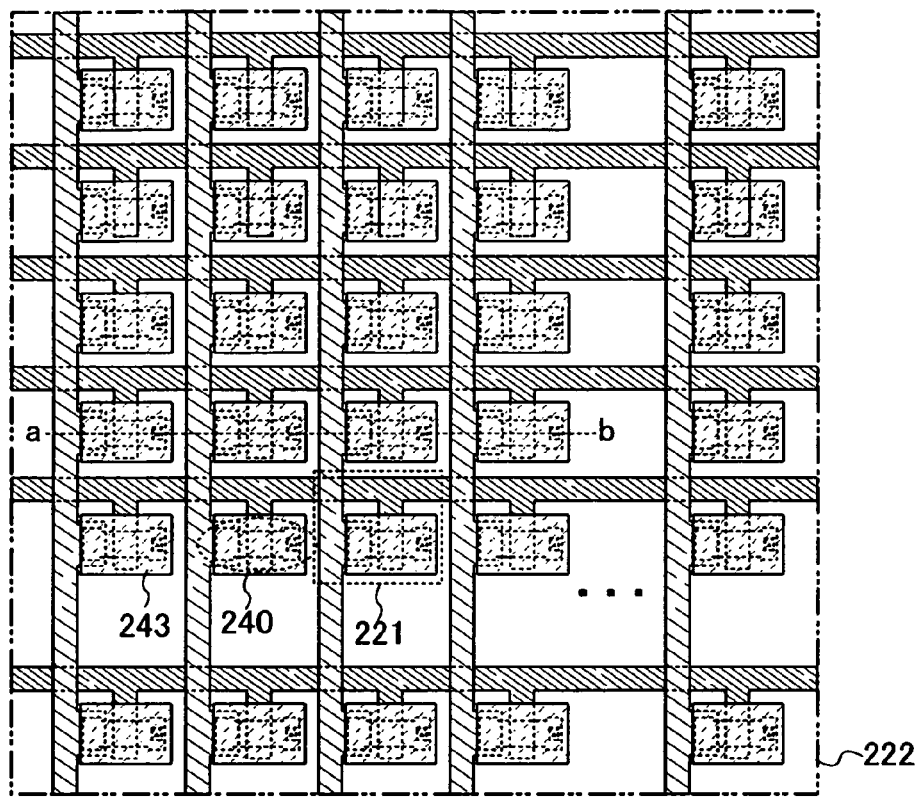
FIGS. 10A to 10C show structural examples of a semiconductor device of the present invention.
Figure 10B:
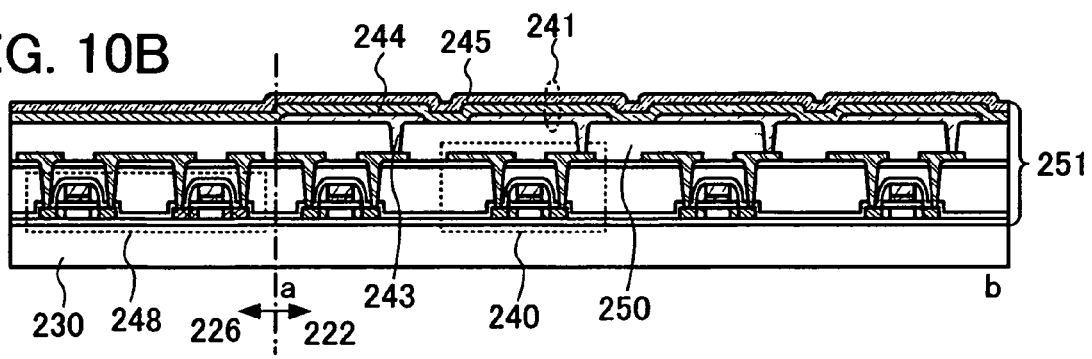
Figure 10C:
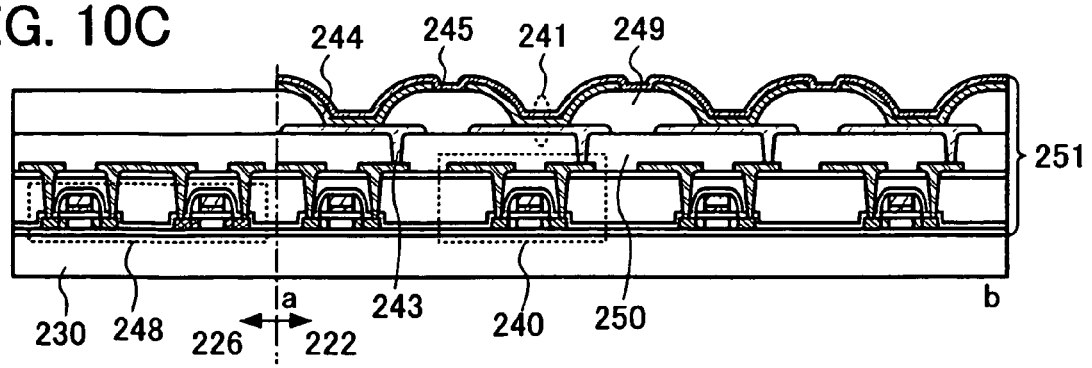

Moreover, the structure of the semiconductor layer shown in this embodiment mode is not restricted to the aforementioned one. For example, an insulating layer 250 can be provided so as to cover the source and drain electrodes of the transistor 240 and the first conductive layer 243 can be provided over the insulating layer 250 (FIGS. 10A to 10C). Even in this case, the organic compound layer 244 can be formed over the entire surface so as to cover the first conductive layer 243 by using a spin coating method or an evaporation method (FIG. 10B). In addition, in the case where breakage of the organic compound layer 244 or an effect of an electric field in a lateral direction between the adjacent memory cells is a concern, the insulating layer 249 may be provided between the organic compound layers provided for the respective memory cells in order to separate the organic compound layers provided for the memory cells (FIG. 10C). Although FIG. 10C shows an example in which the organic compound layer 244 is provided selectively for each memory cell by a droplet discharging method, a printing method, or the like, the organic compound layer 244 may be provided over the entire surface as shown in FIGS. 9A to 9E.

Thus, when the first conductive layer 243 is provided so as to electrically connect to the source or drain electrode with the insulating layer 250 interposed therebetween, the arrangement of the first conductive layer 243 can be determined freely as compared with the case of providing the first conductive layer 243 in the same layer as the source electrode and the drain electrode. In other words, it has been necessary to provide the storage element 241 in a region other than the source or drain electrode of the transistor 240 in the structure shown in FIGS. 9A to 9E; however, it becomes possible to form the storage element 241, for example, over the transistor 240 by providing the storage element 241 with the insulating layer 250 interposed therebetween. Accordingly, higher integration of the memory cell array 222 can be achieved (FIG. 10A).

Besides, as a structure different from the above structure, a storage element portion can be formed by providing the first conductive layer 243 and the second conductive layer 245 in the same layer. A structural example of this case will be described with reference to FIGS. 11A to 11C.

Figure 11A:
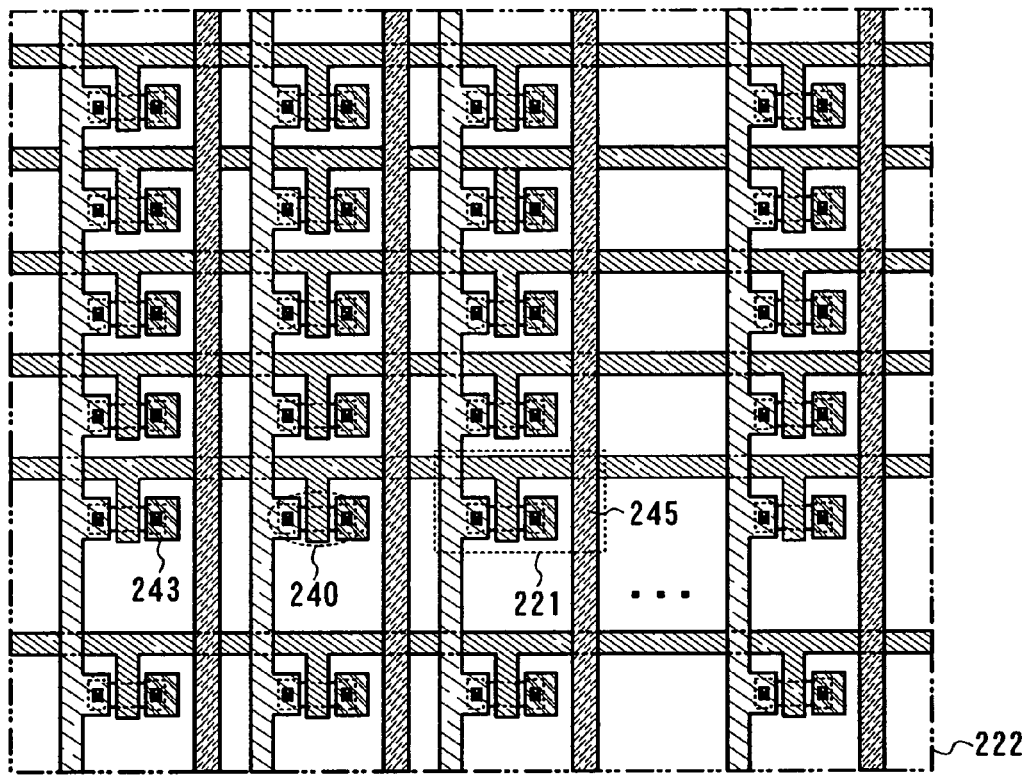
FIGS. 11A to 11C show structural examples of a semiconductor device of the present invention.
Figure 11B:
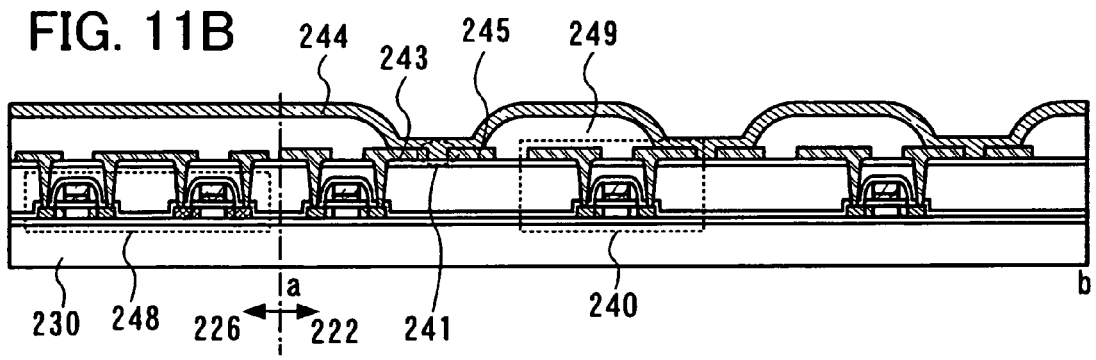

In FIGS. 9A to 9E and FIGS. 10A to 10C, the storage element portion is formed by sandwiching the organic compound layer 244 between the first conductive layer 243 and the second conductive layer 245 above and below; however, the storage element portion is formed by providing the first conductive layer 243 and the second conductive layer 245 in the same layer and sandwiching the organic compound layer 244 in a lateral direction (FIGS. 11A and 11B). In this case, the first conductive layer 243 has a function as the source or drain electrode of the transistor 240 and the second conductive layer 245 is also formed in the same layer as the source or drain electrode. In the case where the first conductive layer 243 and the second conductive layer 245 are formed with the same material, the number of manufacturing steps can be decreased because the first conductive layer 243 and the second conductive layer 245 can be formed at the same time. Here, although the organic compound layer 244 is formed over the entire surface, the organic compound layer 244 can be formed selectively.

Figure 11C:
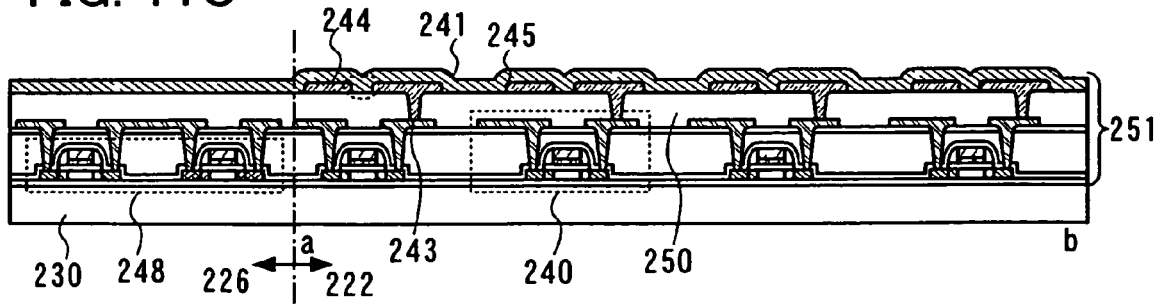

In addition, the insulating layer 250 can be formed as a protective film so as to cover the source and drain electrodes of the transistor 240 and the first conductive layer 243 and the second conductive layer 245 can be provided over the insulating layer 250 (FIG 11C). This is effective when, for example, the first conductive layer 243 is formed with a light-transmitting material such as ITO, i.e., the first conductive layer 243 is formed with a different material from the source and drain electrodes of the transistor. Moreover, since the first conducive layer 243 and the second conductive layer 245 can be freely arranged with the insulating layer 250 interposed therebetween, integration of the storage element portion is possible. Even in this case, if the first conductive layer 243 and the second conductive layer 245 are formed with the same material, the number of manufacturing steps can be decreased by forming the first conductive layer 243 and the second conductive layer 245 at the same time.

In the structure of FIGS. 11A to 11C, it is not always necessary to form the first conductive layer 243 and the second conductive layer 245 in the same layer. For example, in the structure of FIG. 11C, the second conductive layer 245 is formed over the organic compound layer 244 and the first conductive layer 243 and the second conductive layer 245 may be arranged in an oblique direction with the organic compound layer 244 interposed therebetween. Even if contaminators such as particles exist on the first electrode, such a structure makes it possible to prevent an effect of the contaminators.

This embodiment mode can be freely combined with Embodiment Mode 1 or 2.

Embodiment Mode 4

This embodiment mode will describe an example of a semiconductor device different from the one shown in the above embodiment modes, with reference to drawings.

A semiconductor device shown in this embodiment mode is capable of reading and writing data without contact. Transmission formats of data are roughly classified into three types, which are: electromagnetic coupling type which carries out communication through mutual induction by positioning a pair of coils so as to face each other; electromagnetic induction type which carries out communication through an induction field; and electric wave type which carries out communication by utilizing electric waves. Any type may be used. Moreover, an antenna used for the data transmission is provided in two ways: one is that the antenna is provided over a substrate where a transistor and a storage element are provided, and the other is that a terminal portion is provided over a substrate where a transistor and a storage element are provided and an antenna provided to another substrate is connected to the terminal portion.

One structural example of a semiconductor device in which an antenna is provided over a substrate where a plurality of elements and storage elements are provided is described with reference to FIGS. 12A and 12B.

Figure 12A:
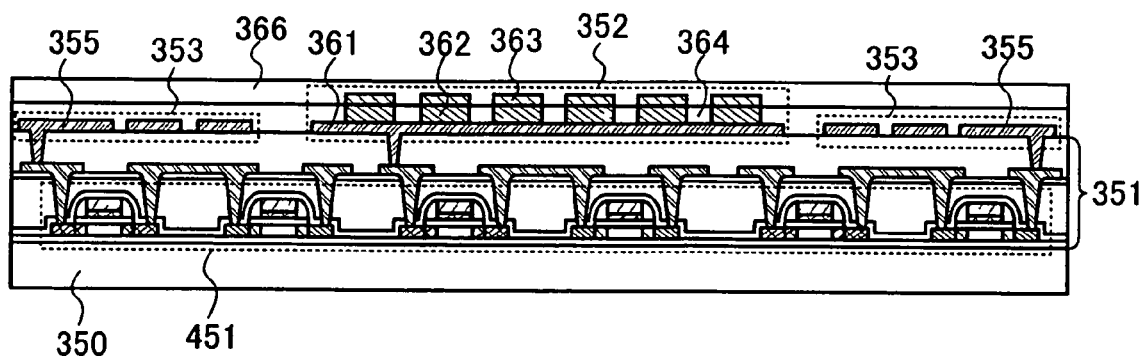
FIGS. 12A and 12B show structural examples of a semiconductor device of the present invention.

FIG. 12A shows a semiconductor device including an organic memory that is formed as a passive matrix type. The semiconductor device has an element-forming layer 351 having a plurality of transistors 451 over a substrate 350; a storage element portion 352 including a plurality of organic memory elements formed over the element-forming layer 351; and an antenna portion 353. Although the case is shown here where the storage element portion 352 or the antenna portion 353 is formed over the element-forming layer 351, the present invention is not restricted to this structure, and the storage element portion 352 or the antenna portion 353 may be provided under or in the same layer as the element-forming layer 351.

The plurality of organic memory elements in the storage element portion 352 are formed by stacking a first conductive layer 361, an organic compound layer 362, and a second conductive layer 363, and an insulating layer 366 functioning as a protective film is formed covering the second conductive layer 363. Here, the organic compound layer 362 is provided for each memory cell by providing an insulating layer 364 between the respective memory cells (between the organic memory elements); however, the organic compound layer 362 may be formed over the entire surface so as to cover the first conductive layer 361. The storage element portion 352 can be formed by using the material or manufacturing method shown in the above embodiment modes.

In the storage element portion 352, an element having a rectifying property may be provided between the first conductive layer 361 and the organic compound layer 362 or between the organic compound layer 362 and the second conductive layer 363. The element having a rectifying property can employ the structure shown in the above embodiment modes.

The antenna portion 353 has a conductive layer 355 functioning as an antenna. Here, the conductive layer 355 is formed in the same layer as the first conductive layer 361, and the conductive layer 355 and the first conductive layer 361 may be formed with the same material at the same time. The conductive layer 355 may be formed over the insulating layer 364 or 366. In the case of providing the conductive layer 355 over the insulating layer 364, the conductive layer 355 can be formed with the same material at the same time as the second conductive layer 363.

The conductive layer 355 functioning as the antenna is connected to a transistor that constitutes a part of a waveform shaping circuit or a rectifying circuit. Here, the conductive layer 355 functioning as an antenna is electrically connected to any of the plurality of thin film transistors 451. Data sent from outside without contact is processed in the waveform shaping circuit or the rectifying circuit and then the data is exchanged (data writing or reading) with an organic memory element through the reading circuit or the writing circuit.

As a material for the conductive layer 355, one kind of element selected from gold (Au), platinum (Pt), nickel (Ni), tungsten (W), molybdenum (Mo), cobalt (Co), copper (Cu), aluminum (Al), manganese (Mn), titanium (Ti), and the like; an alloy containing a plurality of these elements; or the like can be used. The conductive layer 355 can be formed by an evaporation method, a sputtering method, a CVD method, a droplet discharging method, a screen printing method, a gravure printing method, or the like.

The element-forming layer 351 has at least a transistor. By the transistor, any kind of integrated circuit such as a CPU (Central Processing Unit), a memory, or a microprocessor can be provided. In this embodiment mode, the transistors 451 in the element-forming layer 351 can be p-channel TFTs, n-channel TFTs or a CMOS in which these TFTs are combined. Moreover, the semiconductor layer in the transistors 451 may also have any structure, and for example, an impurity region (source region, drain region, GOLD region, or LDD region) may be formed. Moreover, an insulating layer (sidewall) may be formed in contact with a side surface of the gate electrode, or a silicide layer may be formed at a source region, a drain region, or a gate electrode. As the material for the silicide layer, nickel, tungsten, molybdenum, cobalt, platinum, or the like can be used.

The transistors 451 in the element-forming layer 351 may be organic transistors of which a channel region in each of the transistors is formed with an organic material. In this case, the element-forming layer 351 having an organic transistor can be formed directly by a printing method, a droplet discharging method, or the like over a flexible substrate such as a plastic substrate used as the substrate 350. At this time, when the storage element portion 352 is also formed by a droplet discharging method, a screen printing method, a gravure printing method, or the like, a semiconductor device can be manufactured at low cost.

Figure 12B:
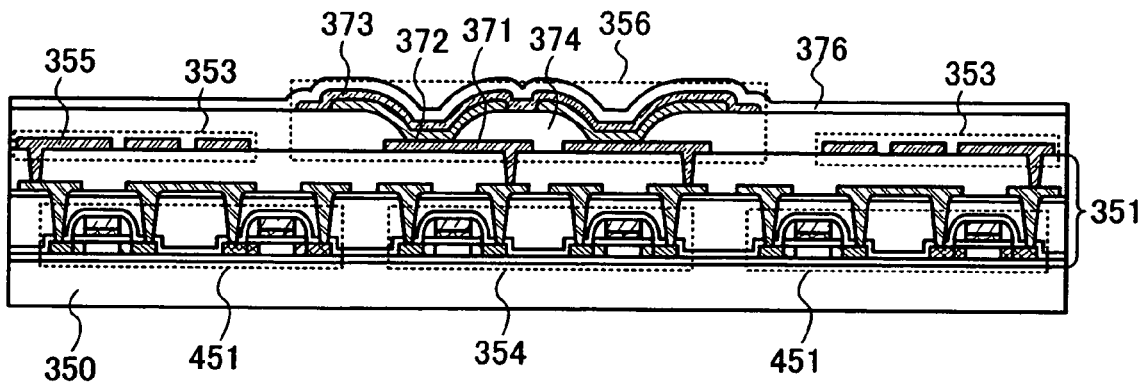

FIG. 12B shows an example of a semiconductor device having an active matrix organic memory. As for FIG. 12B, a part different from that in FIG. 12A will be described.

FIG. 12B shows a semiconductor device in which the element-forming layer 351 including the transistors 451 and transistors 354 is provided over the substrate 350 and a storage element portion 356 and the antenna portion 353 are provided over the element-forming layer 351. Although the transistors 354 functioning as switching elements of the storage element portion 356 are provided in the same layer as the transistors 451 and the storage element portion 356 and the antenna portion 353 are provided over the element-forming layer 351, the present invention is not restricted to this structure. The transistors 354 may be provided over or under the element-forming layer 351, or the storage element portion 356 and the antenna portion 353 can be formed under or in the same layer as the element-forming layer 351.

The plurality of organic memory elements in the storage element portion 356 are formed by stacking a first conductive layer 371, an organic compound layer 372, and a second conductive layer 373, and an insulating layer 376 is formed as a protective film so as to cover the second conductive layer 373. Although an insulating layer 374 is formed so as to cover an end portion of the first conductive layer 371 and the organic compound layer 372 is formed selectively for each memory cell here, the organic compound layer 372 may be formed over the entire surface so as to cover the first conductive layer 371 and the insulating layer 374. The storage element portion 356 can be formed by using the same material and manufacturing method as those shown in the above embodiment modes. In the storage element portion 356, an element having a rectifying property may be provided between the first conductive layer 371 and the organic compound layer 372 or between the organic compound layer 372 and the second conductive layer 373.

The conductive layer 355 provided in the antenna portion 353 may be formed in the same layer as the first conductive layer 371 or may be formed over the insulating layer 374 or the insulating layer 376. In the case where the conductive layer 355 is provided in the same layer as the first conductive layer 371 or the second conductive layer 373, the conductive layer 355 can be formed with the same material as the first conductive layer 371 or the second conductive layer 373, respectively, and at the same time.

The conductive layer 355 functioning as an antenna is connected to a transistor that constitutes a part of a waveform shaping circuit or a rectifying circuit. Here, the conductive layer 355 functioning as an antenna is electrically connected to the transistors 451 that constitute a part of a waveform shaping circuit or a rectifying circuit. Moreover, after data sent from outside without contact is processed in a waveform shaping circuit or a rectifying circuit, the data is exchanged (data writing or reading) with an organic memory element through a reading circuit or a writing circuit.

The transistors 354 provided in the element-forming layer 351 function as switching elements in the case where data is written in or read out from an organic memory element in the storage element portion 356. Therefore, the transistors 354 are preferably formed by using one of a p-channel TFT structure and an n-channel TFT structure. Moreover, the semiconductor layer in the transistors 354 may have any structure, and for example, an impurity region (source region, drain region, or LDD region) may be formed or either a p-channel or n-channel type may be employed. In addition, an insulating layer (sidewall) may be formed in contact with a side surface of a gate electrode, or a silicide layer may be formed at a source region, a drain region, or a gate electrode. As a material for the silicide layer, nickel, tungsten, molybdenum, cobalt, platinum, or the like can be used.

The element-forming layer 351, the storage element portion 356, and the antenna portion 353 can be formed by evaporation, a sputtering method, a CVD method, a droplet discharging method, a screen printing method, a gravure printing method, or the like as mentioned above. Different methods may be used depending on the location. For example, the transistors 451 requiring high-speed operation can be formed in such a way that after forming a semiconductor layer with silicon or the like over a substrate, the semiconductor layer is crystallized by a thermal process, and then the transistor 354 functioning as a switching element is formed as an organic transistor over the element-forming layer 351 by a printing method or a droplet discharging method.

In the storage element portion 356 shown in FIG. 12B, the first conductive layer 371 is connected to the source or drain electrode of the transistors 354 of the element-forming layer 351 through the insulating layer. However, it is also possible to form the first conductive layer 371 in the same layer as the source or drain electrode of the transistor as shown in FIGS. 9A to 9E. Although the organic compound layer 372 is provided selectively for each memory cell in FIG. 12B, the organic compound layer 372 may be provided over the entire surface as shown in FIG. 9A to 9E. In the case of providing the organic compound layer for each memory cell, a droplet discharging method, a screen printing method, a gravure printing method, or the like is preferable. In the case of providing the organic compound layer over the entire surface, a spin coating method or an evaporation method is preferable.

Figure 13A:
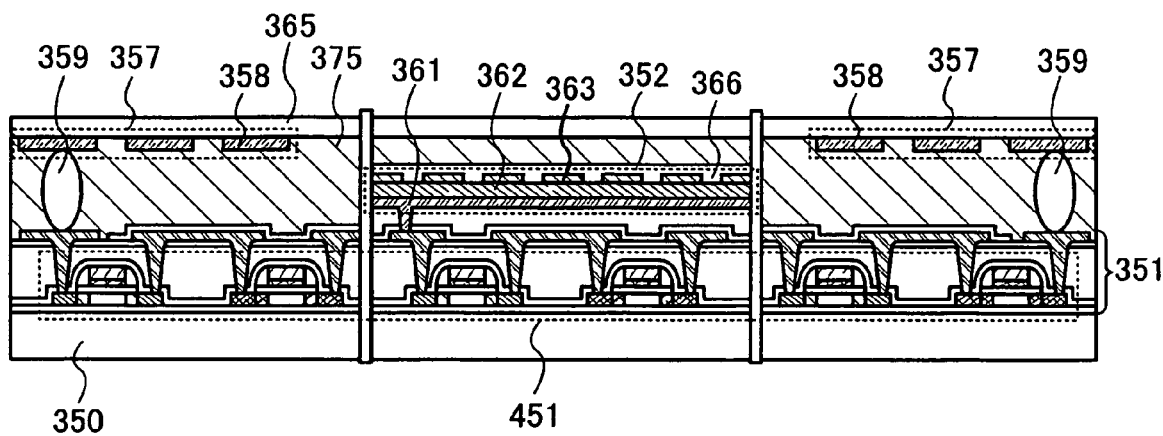
FIGS. 13A and 13B show structural examples of a semiconductor device of the present invention.
Figure 13B:
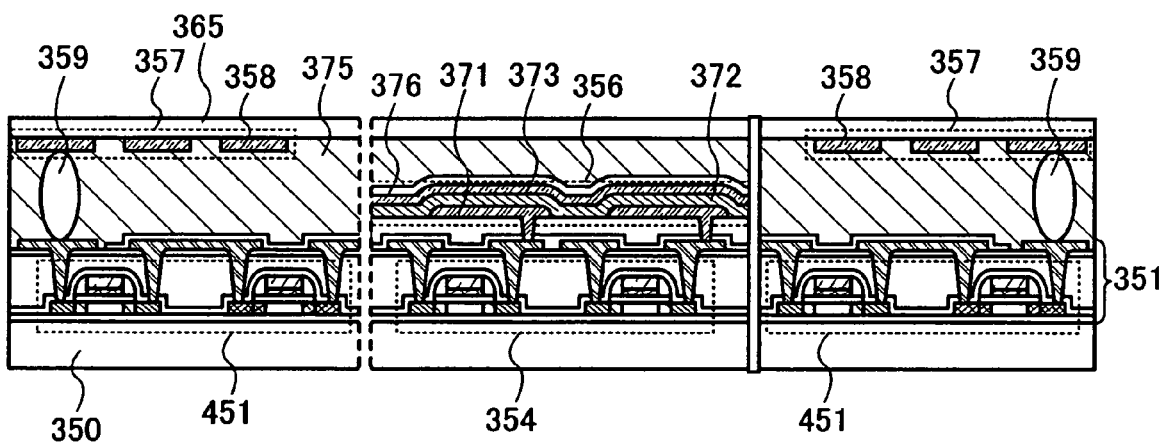

Next, description is made on a structural example of a semiconductor device in which the substrate where a plurality of elements and storage elements are formed is provided with a terminal portion and an antenna provided to another substrate is connected to the terminal portion, with reference to FIGS. 13A and 13B. It is to be noted that a portion different from that shown in FIGS. 12A and 12B will be described on FIGS. 13A and 13B.

FIG. 13A shows a semiconductor device having a passive matrix organic memory, in which the element-forming layer 351 including the plurality of transistors 451 is provided over the substrate 350 and the storage element portion 352 is provided over the element-forming layer 351, and an antenna portion 357 provided at a substrate 365 is connected to the transistors 451 of the element-forming layer 351. Although the storage element portion 352 or the antenna portion 357 is provided over the element-forming layer 351 here, the present invention is not restricted to this structure. The storage element portion 352 can be provided under or in the same layer as the element-forming layer 351, or the antenna portion 357 can be provided under the element-forming layer 351.

The organic memory element in the storage element portion 352 is provided by stacking the first conductive layer 361, the organic compound layer 362, and the second conductive layer 363. Moreover, in the case where breakage of the organic compound layer 362 or an effect of an electric field in a lateral direction between the adjacent memory cells is a concern, an insulating layer may be provided in order to separate the organic compound layer for each memory cell. It is to be noted that the storage element portion 352 can be formed by using the material or the manufacturing method shown in the above embodiment mode.

The substrate 350 where the element-forming layer 351 and the storage element portion 352 are provided is pasted to the substrate 365 where the antenna portion 357 is provided, with the use of a resin 375 having an adhesive property. In addition, the element-forming layer 351 is electrically connected to a conductive layer 358 through a conductive particulate 359 contained in the resin 375. The substrate 350 where the element-forming layer 351 and the storage element portion 352 are provided may be pasted to the substrate 365 where the antenna portion 357 is provided, with the use of a conductive adhesive such as a silver paste, a copper paste, or a carbon paste, or a method using solder bonding.

FIG. 13B shows a semiconductor device where an active matrix organic memory is provided, in which the element-forming layer 351 including the transistors 451 and 354 is provided over the substrate 350, the storage element portion 356 including the plurality of organic memory elements is provided over the element-forming layer 351, and the antenna portion 357 provided at the substrate 365 is connected to the element-forming layer 351. Although the transistors 354 are provided in the same layer as the transistors 451 in the element-forming layer 351 and the antenna portion 357 is provided over the element-forming layer 351 here, the present invention is not restricted to this structure. The storage element portion 356 can be provided under or in the same layer as the element-forming layer 351, or the antenna portion 357 can be provided under the element-forming layer 351.

The organic memory element in the storage element portion 356 is provided by stacking the first conductive layer 371, the organic compound layer 372, and the second conductive layer 373. Moreover, in the case where an effect of an electric field in a lateral direction between the adjacent memory cells is a concern, an insulating layer may be provided in order to separate the adjacent organic compound layers from each other. It is to be noted that the storage element portion 356 can be formed by using the material or the manufacturing method shown in the above embodiment mode.

Even in FIG. 13B, the substrate 350 where the element-forming layer 351 and the storage element portion 356 are provided can be pasted to the substrate 365 where the antenna portion 357 is provided, with the use of the resin 375 containing the conductive particulate 359.

In this way, a semiconductor device provided with the organic memory and the antenna can be formed. Although the thin film transistors are formed over the substrate 350 as the transistors 354 and 451 in this embodiment mode, field effect transistors (FETs) may be formed using a semiconductor substrate made of Si or the like as the substrate 350 and using the substrate as their channel regions. Moreover, an SOI substrate may be used as the substrate 350 and the transistors may be manufactured in the substrate. In this case, an SOI substrate can be formed by a method in which wafers are pasted to each other or a method called SIMOX in which an insulating layer is formed inside a Si substrate by implanting oxygen ions to the Si substrate.

According to the present invention, an inexpensive semiconductor device with a minute structure can be formed. This embodiment mode can be freely combined with Embodiment Modes 1 to 3.

Embodiment Mode 5

This embodiment mode will describe a method for manufacturing a semiconductor device of the present invention which includes a thin film transistor, a storage element, and an antenna, with reference to drawings.

Figure 14A:
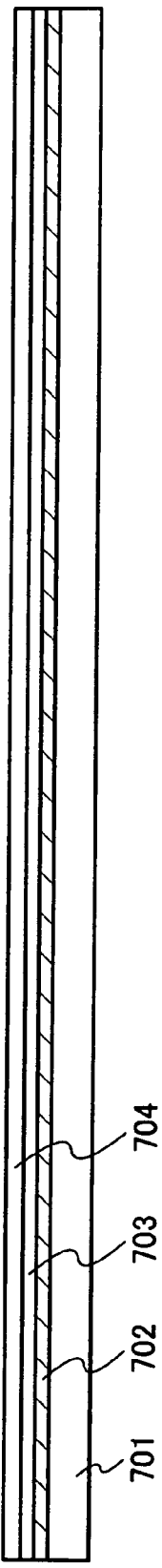
FIGS. 14A to 14C show a structural example of a method for manufacturing a semiconductor device of the present invention.

First, a peeling layer 702 is formed on one surface of a substrate 701 (FIG. 14A). The substrate 701 is preferably a glass substrate, a quartz substrate, a metal substrate or stainless steel substrate with an insulating layer formed on one surface, a plastic substrate having heat resistance that can resist process temperature of the steps, or the like. The substrate 701 like these is not particularly restricted in its size and shape. Therefore, for example, when a rectangular substrate with a length of 1 meter or more on one side is used as the substrate 701, the productivity can be increased drastically. The substrate 701 is superior in this advantage to a circular silicon substrate. Although the peeling layer 702 is provided on the entire surface of the substrate 701 in this step, the peeling layer 702 may be provided selectively by a photolithography method as necessary after providing the peeling 702 on the entire surface of the substrate 701. Moreover, although the peeling layer 702 is formed in contact with the substrate 701, an insulating layer may be formed as a base in contact with the substrate 701 and then the peeling layer 702 may be formed in contact with the insulating layer.

The peeling layer 702 is formed by a known means (such as a sputtering method or a plasma CVD method) with an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), and silicon (Si), or an alloy or compound material containing the element as its main component, in a single-layer or multilayer structure. A structure of a layer containing silicon may be any of amorphous, microcrystalline, and polycrystalline structures.

In the case where the peeling layer 702 has a single-layer structure, for example, a tungsten layer, a molybdenum layer, or a layer containing a mixture of tungsten and molybdenum is formed. Alternatively, a layer containing oxide or oxynitride of tungsten, a layer containing oxide or oxynitride of molybdenum, or a layer containing oxide or oxynitride of a mixture of tungsten and molybdenum is formed. The mixture of tungsten and molybdenum corresponds to, for example, an alloy of tungsten and molybdenum. Oxide of tungsten is sometimes referred to as tungsten oxide.

In the case where the peeling layer 702 has a multilayer structure, a tungsten layer, a molybdenum layer, or a layer containing a mixture of tungsten and molybdenum is formed as a first layer, and a layer containing oxide, nitride, oxynitride, or nitride oxide of tungsten, molybdenum, or a mixture of tungsten and molybdenum is formed as a second layer.

If the peeling layer 702 is formed in a multilayer structure by using a tungsten layer and a layer containing oxide of tungsten, a tungsten layer is formed and a silicon oxide layer is formed thereover, whereby the layer containing oxide of tungsten is formed at an interface between the tungsten layer and the silicon oxide layer. This similarly applies to the case where layers containing nitride, oxynitride, and nitride oxide of tungsten are formed, and after forming a tungsten layer, a silicon nitride layer, a silicon oxynitride layer, and a silicon nitride oxide layer are preferably formed thereover. The oxide of tungsten is expressed with $WO_x$, where x ranges from 2 to 3. X may be 2 ($WO_2$), 2.5 ($W_2O_5$), 2.75 ($W_4O_{11}$), 3 ($WO_3$), and so on. X is not particularly limited in forming the oxide of tungsten, and which oxide to be formed may be determined based on the etching rate or the like. A layer containing oxide of tungsten ($WO_x$, 0<X<3) formed by a sputtering method in an oxygen atmosphere has the most favorable etching rate. Therefore, in order to shorten the manufacturing time, a layer containing oxide of tungsten is preferably formed by a sputtering method in an oxygen atmosphere.

In the case where the peeling layer is provided in a multilayer structure by using a metal layer and a layer containing metal oxide, a metal layer may be formed and then the metal layer may be subjected to a plasma treatment to form a metal oxide layer on the metal layer. When the plasma treatment is performed in an oxygen atmosphere, a nitrogen atmosphere, an $N_2O$ atmosphere, or the like, a metal oxide film, a metal oxynitride film, or the like can be formed on the metal film.

Subsequently, an insulating layer 703 is formed as a base so as to cover the peeling layer 702. The insulating layer 703 is formed by a known means (such as a sputtering method or a plasma CVD method) using a layer containing oxide of silicon or nitride of silicon in a single-layer or multilayer structure. The oxide material of silicon is a substance containing silicon (Si) and oxygen (O) and corresponds to silicon oxide, silicon oxynitride, silicon nitride oxide, or the like. The nitride material of silicon is a substance containing silicon and nitrogen (N) and corresponds to silicon nitride, silicon oxynitride, silicon nitride oxide, or the like. If the insulating layer to be a base has a two-layer structure, for example, it is preferable to form a silicon nitride oxide layer as a first layer and a silicon oxynitride layer as a second layer. If the insulating layer to be a base has a three-layer structure, it is preferable to form a silicon oxide layer as a first insulating layer, a silicon nitride oxide layer as a second insulating layer, and a silicon oxynitride layer as a third insulating layer. Alternatively, it is preferable to form a silicon oxynitride layer as a first insulating layer, a silicon nitride oxide layer as a second insulating layer, and a silicon oxynitride layer as a third insulating layer. The insulating layer to be a base functions as a blocking film for preventing intrusion of impurities from the substrate 701.

Figure 14B:
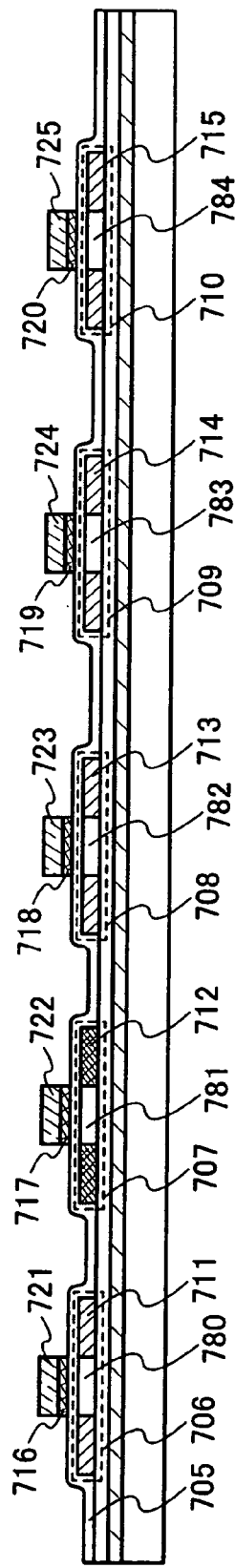

Next, an amorphous semiconductor layer 704 (for example, a layer containing amorphous silicon) is formed over the insulating layer 703. The amorphous semiconductor layer 704 is formed in thickness of 25 to 200 nm (preferably 30 to 150 nm) by a known means (such as a sputtering method, an LPCVD method, or a plasma CVD method). Subsequently, the amorphous semiconductor layer 704 is crystallized by a known crystallization method (such as a laser crystallization method, a thermal crystallization method using an RTA or a furnace anneal, a thermal crystallization method using a metal element for promoting crystallization, a method in which a thermal crystallization method using a metal element for promoting crystallization and a layer crystallization method are combined, or the like) to form a crystalline semiconductor layer. After that, the obtained crystalline semiconductor layer is patterned into a desired shape to form crystalline semiconductor layers 706 to 710 (FIG. 14B).

An example of a process for manufacturing the crystalline semiconductor layers 706 to 710 is briefly described. First, an amorphous semiconductor layer of 66 nm thick is formed by a plasma CVD method. Then, a solution containing nickel, which is a metal element for promoting crystallization, is applied on the amorphous semiconductor layer, followed by a dehydrogenation treatment (500° C. for 1 hour) and a thermal crystallization treatment (550° C. for 4 hours) to form a crystalline semiconductor layer. Subsequently, laser irradiation is carried out as necessary and then a patterning process is carried out by a photolithography method, thereby forming the crystalline semiconductor layers 706 to 710. In the case where the crystalline semiconductor layers are formed by a laser crystallization method, a continuous wave or pulsed gas laser or a continuous wave or pulsed solid state laser is used. As the gas laser, an excimer laser, a YAG laser, a $YVO_4$ laser, a YLF laser, a $YAlO_3$ laser, a glass laser, a ruby laser, a Ti:sapphire laser, or the like is used. As the solid state laser, a laser using a crystal of YAG, $YVO_4$, YLF, $YAlO_3$, or the like each of which is doped with Cr, Nd, Er, Ho, Ce, Co, Ti, or Tm is used.

Although crystallization of the amorphous semiconductor layer using a metal element for promoting crystallization has an advantage that the crystallization is possible at low temperature in a short time as well as a crystal direction is aligned, such crystallization also has a disadvantage that off-current increases to make characteristics unstable because the metal element is left in the amorphous semiconductor layer. Accordingly, an amorphous semiconductor layer functioning as a gettering site is preferably formed over the crystalline semiconductor layers. Since the amorphous semiconductor layer functioning as a gettering site needs to contain an impurity element such as phosphorus or argon, it is preferable to form the amorphous semiconductor layer by a sputtering method capable of having the amorphous semiconductor layer contain argon at high concentration. After that, a heat treatment (such as an RTA method or a thermal anneal method using an anneal furnace) is carried out to diffuse the metal element in the amorphous semiconductor layer. Then, the amorphous semiconductor layer containing the metal element is removed. Thus, the content of the metal element of the crystalline semiconductor layer can be decreased or the metal element thereof can be removed.

Next, a gate insulating layer 705 is formed covering the crystalline semiconductor layers 706 to 710. The gate insulating layer 705 is formed by a known means (such as a plasma CVD method or a sputtering method) using a layer containing oxide of silicon or nitride of silicon, in a single-layer or multilayer structure. Specifically, a layer containing silicon oxide, a layer containing silicon oxynitride, a layer containing silicon nitride oxide is formed in a single-layer or multilayer structure.

Next, a first conductive layer and a second conductive layer are stacked over the gate insulating layer 705. The first conductive layer is formed in thickness of 20 to 100 nm by a known means (such as a plasma CVD method or a sputtering method). The second conductive layer is formed in thickness of 100 to 400 nm by a known means. The first conductive layer and the second conductive layer are formed with an element selected from tantalum (Ta), tungsten (W), titanium (Ti), molybdenum (Mo), aluminum (Al), copper (Cu), chromium (Cr), niobium (Nb), and the like or an alloy or compound material containing the element as its main component. Moreover, the first conductive layer and the second conductive layer may be formed with a semiconductor material typified by a polycrystalline silicon doped with an impurity element such as phosphorus. Examples of a combination of the first conductive layer and the second conductive layer are: a tantalum nitride (TaN) layer and a tungsten (W) layer, a tungsten nitride (WN) layer and a tungsten layer, a molybdenum nitride (MoN) layer and a molybdenum (Mo) layer, and the like. Since tungsten and tantalum nitride have high heat resistance, a heat treatment can be carried out for the purpose of thermal activation after forming the first conductive layer and the second conductive layer. In the case of a three-layer structure instead of the two-layer structure, a multilayer structure of a molybdenum layer, an aluminum layer, and another molybdenum layer is preferably employed.

Next, a mask is formed with a resist by a photolithography method and then an etching process for forming a gate electrode and a gate wire is carried out to form conductive layers 716 to 725 functioning as a gate electrode (also referred to as gate electrode layers).

Subsequently, a mask is formed with a resist by a photolithography method to dope the crystalline semiconductor layers 706 and 708 to 710 with an impurity element imparting N-type conductivity by an ion doping method or an ion implantation method at low concentration, thereby forming N-type impurity regions 711 and 713 to 715 and channel-forming regions 780 and 782 to 784. As the impurity element imparting N-type conductivity, an element belonging to Group 15 may be used, and for example, phosphorus (P) or arsenic (As) is used.

Next, a mask is formed with a resist by a photolithography method to dope the crystalline semiconductor layer 707 with an impurity element imparting P-type conductivity, thereby forming a P-type impurity region 712 and a channel-forming region 781. As the impurity element imparting P-type conductivity, boron (B) is used for example.

Figure 14C:
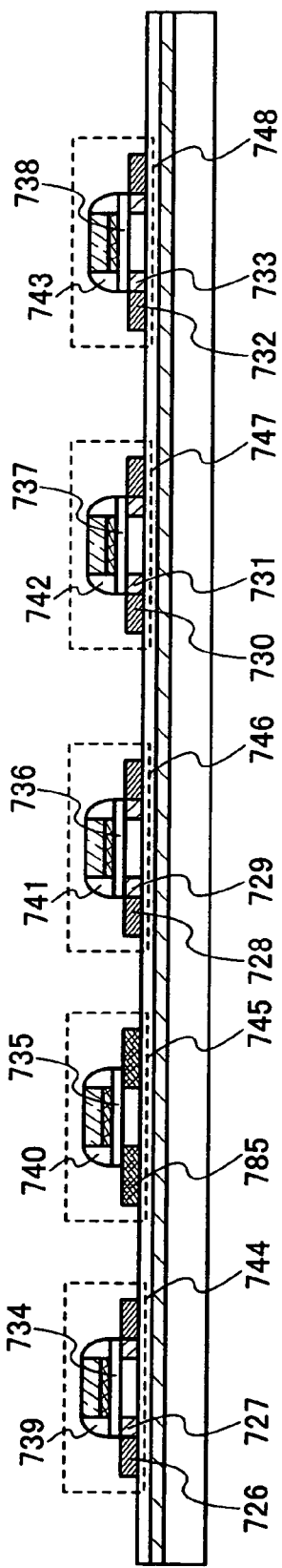

Next, an insulating layer is formed so as to cover the gate insulating layer 705 and the conductive layers 716 to 725. The insulating layer is formed in a single-layer or multilayer structure by a known means (such as a plasma CVD method or a sputtering method) using a layer containing an inorganic material such as silicon, oxide of silicon, or nitride of silicon, or a layer containing an organic material such as an organic resin. Next, the insulating layer is selectively etched by anisotropic etching mainly in a perpendicular direction, thereby forming insulating layers (also called sidewalls) 739 to 743 in contact with side surfaces of the conductive layers 716 to 725 (FIG. 14C). At the same time as the manufacturing of the insulating layers 739 to 743, insulating layers 734 to 738 are formed by etching the gate insulating layers 705. The insulating layers 739 to 743 are used as masks for doping when an LDD (Lightly Doped Drain) region is formed later.

Next, the crystalline semiconductor layers 706 and 708 to 710 are doped with an impurity element imparting N-type conductivity by using a mask formed with resist by a photolithography method and the insulating layers 739 to 743 as masks, thereby forming first N-type impurity regions (also referred to as LDD regions) 727, 729, 731, and 733, and second N-type impurity regions (also referred to as source regions or drain regions) 726, 728, 730, and 732. The concentration of the impurity element of the first N-type impurity regions 727, 729, 731, and 733 is lower than that of the second N-type impurity regions 726, 728, 730, and 732. By the above steps, N-type thin film transistors 744 and 746 to 748 and a P-type thin film transistor 745 are completed.

In order to form the LDD region, the insulating layer of the sidewall can be used as a mask. When the insulating layer of the sidewall is used as a mask, the width of the LDD region can be easily controlled and the LDD region can be formed for sure.

Figure 15A:
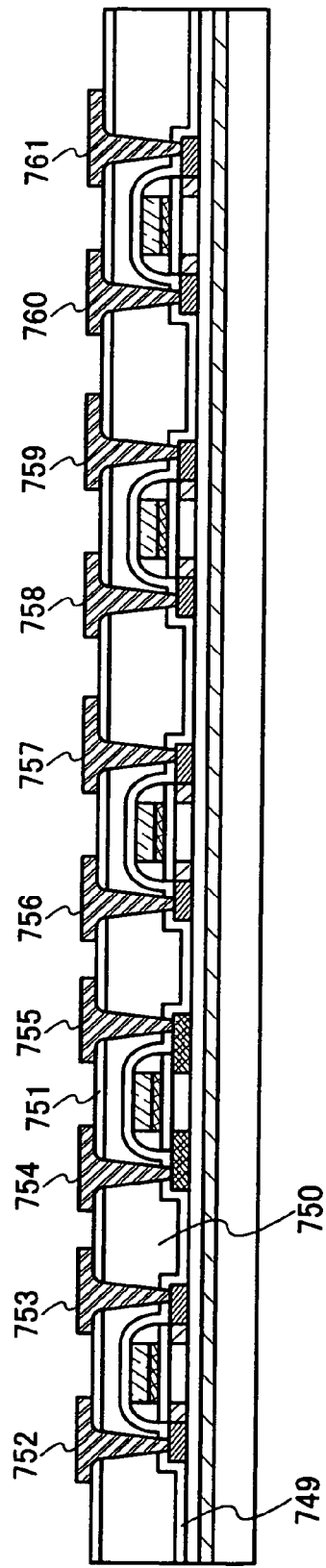
FIGS. 15A and 15B show a structural example of a method for manufacturing a semiconductor device of the present invention.

Subsequently, an insulating layer is formed in a single-layer or multilayer structure so as to cover the thin film transistors 744 to 748 (FIG. 15A). The insulating layer covering the thin film transistors 744 to 748 is formed by a known means (such as an SOG method or a droplet discharging method) using an inorganic material such as oxide of silicon or nitride of silicon, an organic material such as polyimide, polyamide, benzocyclobutene, acrylic, epoxy, or siloxane, or the like. For example, if the insulating layer covering the thin film transistors 744 to 748 has a three-layer structure, it is preferable to form a layer containing silicon oxide as a first insulating layer 749, a layer containing resin as a second insulating layer 750, and a layer containing silicon nitride as a third insulating layer 751.

Before forming the insulating layers 749 to 751 or after forming one or a plurality of thin films among the insulating layers 749 to 751, it is preferable to carry out a heat treatment for recovery of crystallinity of the semiconductor layer, activation of the impurity element added in the semiconductor layer, and hydrogenation of the semiconductor layer. As the heat treatment, a thermal anneal method, a laser anneal method, an RTA method, or the like is preferably used.

Next, the insulating layers 749 to 751 are etched by a photolithography method to form contact holes for exposing the N-type impurity regions 726, 728, 730, and 732 and a P-type impurity region 785. Subsequently, a conductive layer is formed so as to fill the contact holes and patterned to form conductive layers 752 to 761 functioning as source-drain wiring.

The conductive layers 752 to 761 are formed by a known means (such as a plasma CVD method or a sputtering method) using an element selected from titanium (Ti), aluminum (Al), and neodymium (Nd) or an alloy or compound material containing the element as its main component in a single-layer or multilayer structure.

An alloy material containing aluminum as its main component corresponds to, for example, a material containing nickel and containing aluminum as its main component, or an alloy material containing nickel and one or both of carbon and silicon and containing aluminum as its main component. The conductive layers 752 to 761 preferably have a multilayer structure of a barrier layer, an aluminum-silicon (Al—Si) layer, and another barrier layer; or a multilayer structure of a barrier layer, an aluminum-silicon (Al—Si) layer, a titanium nitride (TiN) layer, and a barrier layer. The barrier layer corresponds to a thin film including titanium, nitride of titanium, molybdenum, or nitride of molybdenum. Since aluminum or aluminum-silicon has low resistance and are inexpensive, such materials are suitable for forming the conductive layers 752 to 761. Moreover, if barrier layers are provided as an upper layer and a lower layer, generation of hillock of aluminum or aluminum-silicon can be prevented. Further, when a barrier layer is formed with titanium, which is highly reducible, even though a thin natural oxide film is formed over the crystalline semiconductor layer, this natural oxide film can be reduced to have favorable contact with the crystalline semiconductor layer.

Figure 15B:
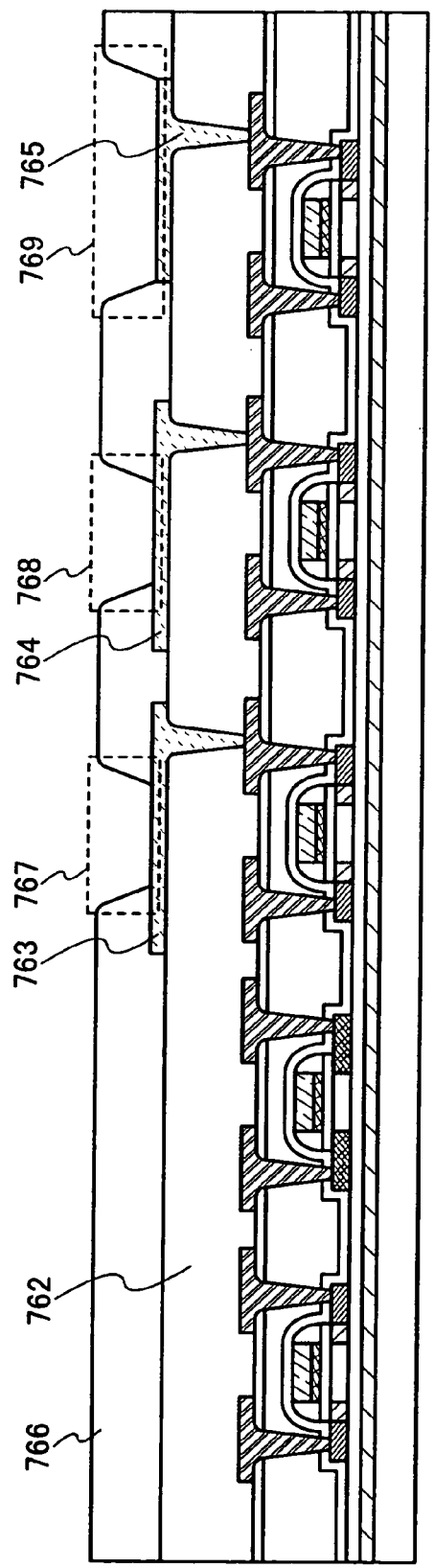

Next, an insulating layer 762 is formed so as to cover the conductive layers 752 to 761 (FIG. 15B). The insulating layer 762 is formed by a known means (such as an SOG method or a droplet discharging method) using an inorganic material or an organic material in a single-layer or multilayer structure. The insulating layer 762 is preferably formed with a thickness of 0.75 to 3 μm.

Next, the insulating layer 762 is etched by a photolithography method to form contact holes for exposing the conductive layers 757, 759, and 761. Then, a conductive layer is formed so as to fill the contact holes. The conductive layer is formed by a known means (such as a plasma CVD method or a sputtering method) using a conductive material. Next, the conductive layer is patterned to form conductive layers 763 to 765. The conductive layers 763 to 765 function as one conductive layer of a pair of conductive layers in a storage element. Therefore, the conductive layers 763 to 765 are preferably formed with any material shown in the above embodiment modes. In a photolithography step for forming the conductive layers 763 to 765, a wet etching process is preferably carried out to avoid damage to the thin film transistors 744 to 748 thereunder. As the etchant, hydrogen fluoride (HF) or ammonia hydrogen peroxide water is preferably used.

Next, an insulating layer 766 is formed so as to cover the conductive layers 763 to 765. The insulating layer 766 is formed by a known means (such as an SOG method or a droplet discharging method) using an inorganic material or an organic material in a single-layer or multilayer structure. Moreover, the insulating layer 766 is formed in thickness of 0.75 to 3 μm. Subsequently, the insulating layer 766 is etched by a photolithography method to form contact holes 767 to 769 for exposing the conductive layers 763 to 765.

Figure 16A:
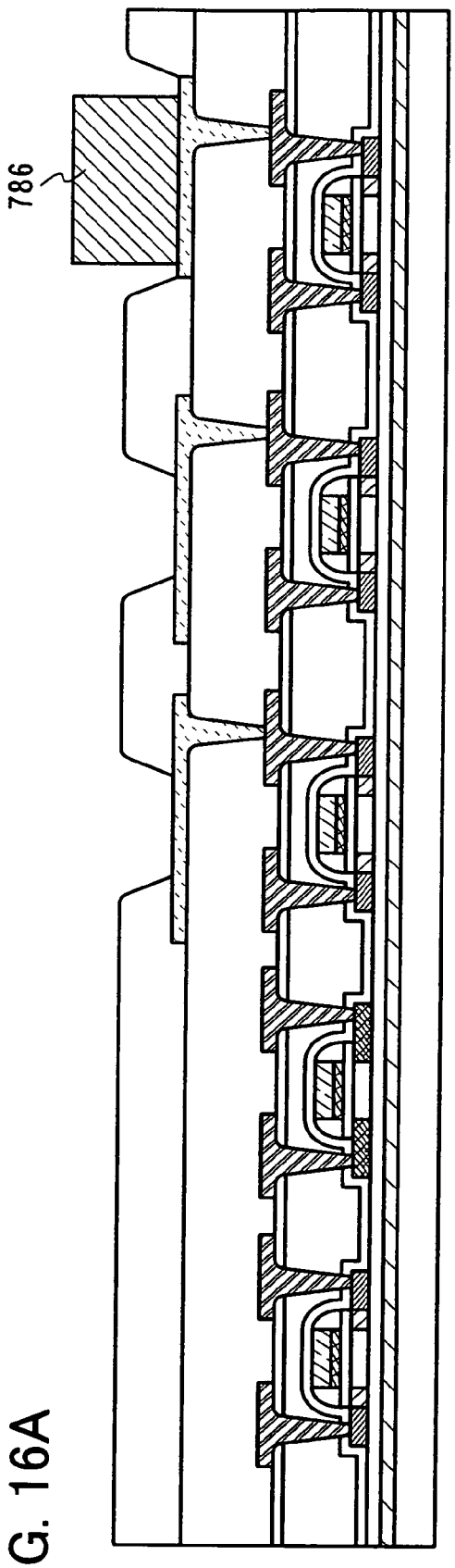
FIGS. 16A and 16B show a structural example of a method for manufacturing a semiconductor device of the present invention.

Next, a conductive layer 786 functioning as an antenna is formed in contact with the conductive layer 765 (FIG. 16A). The conductive layer 786 is formed by a known means (such as a plasma CVD method, a sputtering method, a printing method, or a droplet discharging method) using a conductive material. It is preferable to form the conductive layer 786 with an element selected from aluminum (Al), titanium (Ti), silver (Ag), and copper (Cu) or an alloy or compound material containing the element as its main component in a single-layer or multilayer structure. Specifically, the conductive layer 786 is formed by using a paste containing silver by a screen printing method and then carrying out a heat treatment at 50 to 350° C. Alternatively, an aluminum layer is formed by a sputtering method and the aluminum layer is patterned to form the conductive layer 786. The patterning of the aluminum layer is preferably carried out by a wet etching process, and a heat treatment at 200 to 300° C. is preferably carried out after the wet etching process.

Figure 16B:
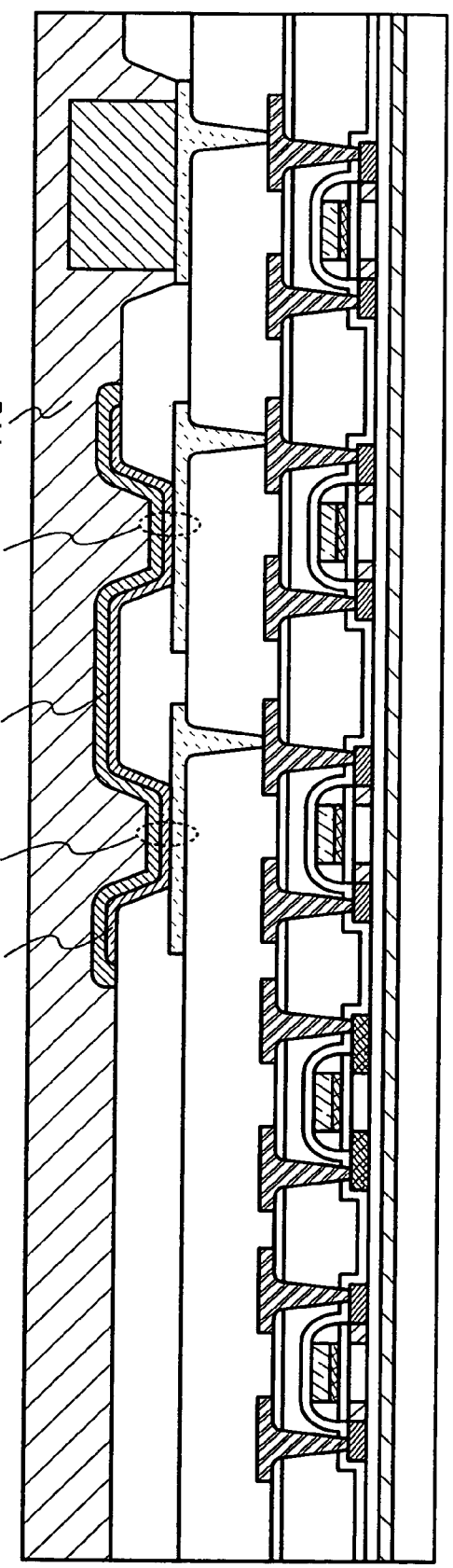

Next, an organic compound layer 787 is formed so as to be in contact with the conductive layers 763 and 764 (FIG. 16B). The organic compound layer 787 is formed by a known means (such as a droplet discharging method or an evaporation method). Subsequently, a conductive layer 771 is formed so as to be in contact with the organic compound layer 787. The conductive layer 771 is formed by a known means (such as a sputtering method or an evaporation method).

By the above steps, a storage element 789 including a multilayer body of the conductive layer 763, the organic compound layer 787, and the conductive layer 771, and a storage element 790 including a multilayer body of the conductive layer 764, the organic compound layer 787, and the conductive layer 771 are completed.

Since the organic compound layer 787 in the above manufacturing process does not have high heat resistance, the step of forming the organic compound layer 787 is carried out after the step of forming the conductive layer 786 functioning as an antenna.

Next, an insulating layer 772 functioning as a protective layer is formed by a known means (such as an SOG method or a droplet discharging method) so as to cover the storage elements 789 and 790 and the conductive layer 786 functioning as an antenna. The insulating layer 772 may be formed by a layer containing carbon such as DLC (Diamond-Like Carbon), a layer containing silicon nitride, a layer containing silicon nitride oxide, or an organic material, and is preferably formed with an epoxy resin.

Figure 17A:
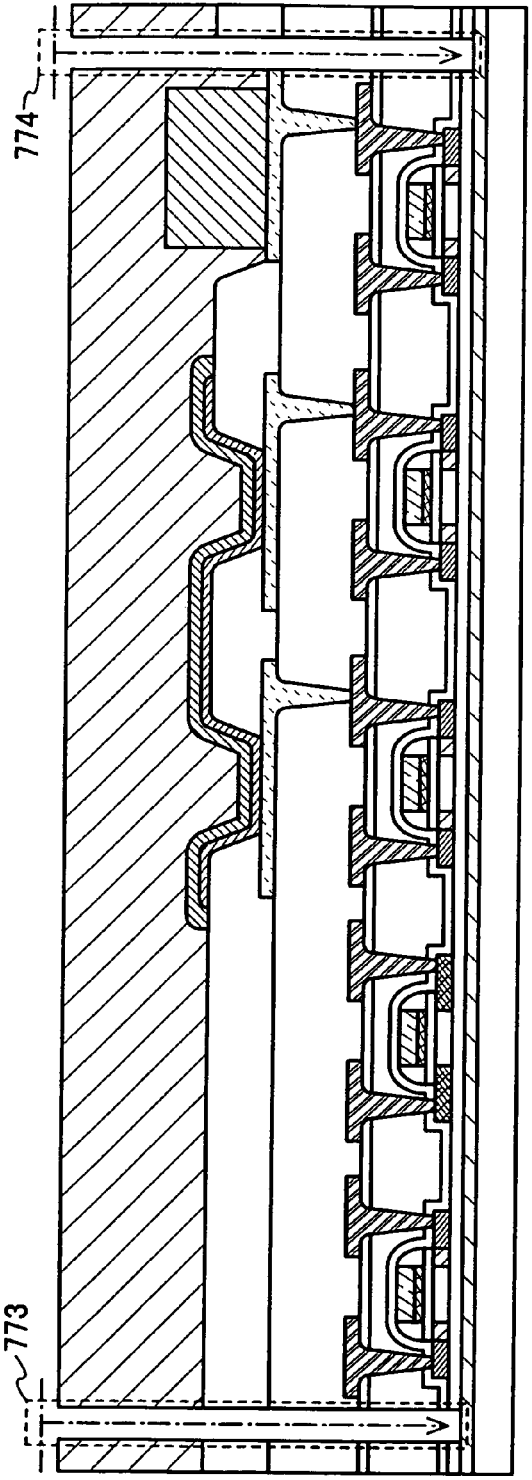
FIGS. 17A and 17B show a structural example of a method for manufacturing a semiconductor device of the present invention.

Next, a thin film integrated circuit 791 is peeled from the substrate 701. After opening portions 773 and 774 are formed by irradiation with laser light (for example UV light) (FIG. 17A), the thin film integrated circuit 791 can be peeled from the substrate 701 by a physical force.

Figure 17B:
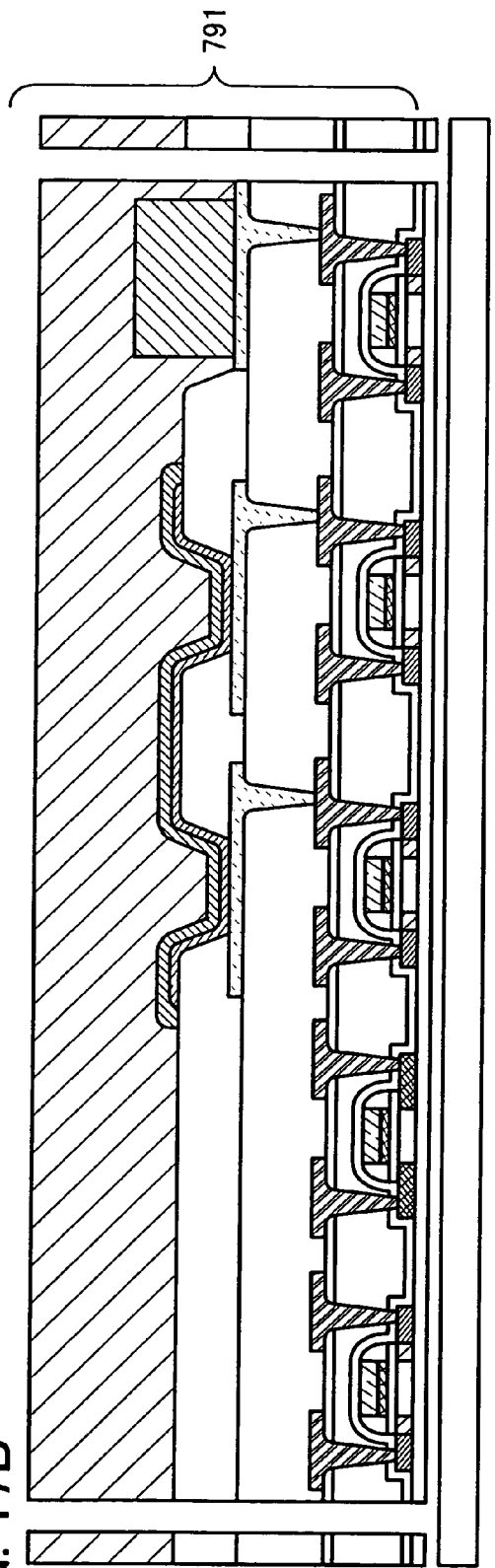

Further, after the opening portion 773 and 774 are formed and before the thin film integrated circuit 791 is peeled from the substrate 701, etchant may be introduced into the opening portions 773 and 774. After introducing the etchant and removing the peeling layer 702, the thin film integrated circuit 791 is peeled (FIG. 17B). The etchant is liquid or gas containing halogen fluoride or an interhalogen compound. For example, chlorine trifluoride ($ClF_3$) is used as the gas containing halogen fluoride. Thus, the thin film integrated circuit 791 is peeled from the substrate 701. It is to be noted that the peeling layer 702 may be partially left instead of being removed entirely. This makes it possible to shorten the process time.

The substrate 701 from which the thin film integrated circuit 791 has been peeled is preferably reused for cost reduction. The insulating layer 772 is formed so that the thin film integrated circuit 791 does not fly apart after removing the peeling layer 702. Since the thin film integrated circuit 791 is small and thin, the thin film integrated circuit 702 is easy to fly apart after removing the peeling layer 702 because the thin film integrated circuit 702 is not closely attached to the substrate 701. However, when the insulating layer 772 is formed over the thin film integrated circuit 791, the thin film integrated circuit 791 gets heavier, so that the thin film integrated circuit 791 can be prevented from flying apart from the substrate 701. Moreover, although the thin film integrated circuit 791 alone is thin and lightweight, the formation of the insulating layer 772 makes it possible to prevent the thin film integrated circuit 791 from being rolled up and to secure a certain degree of strength.

Figure 18:
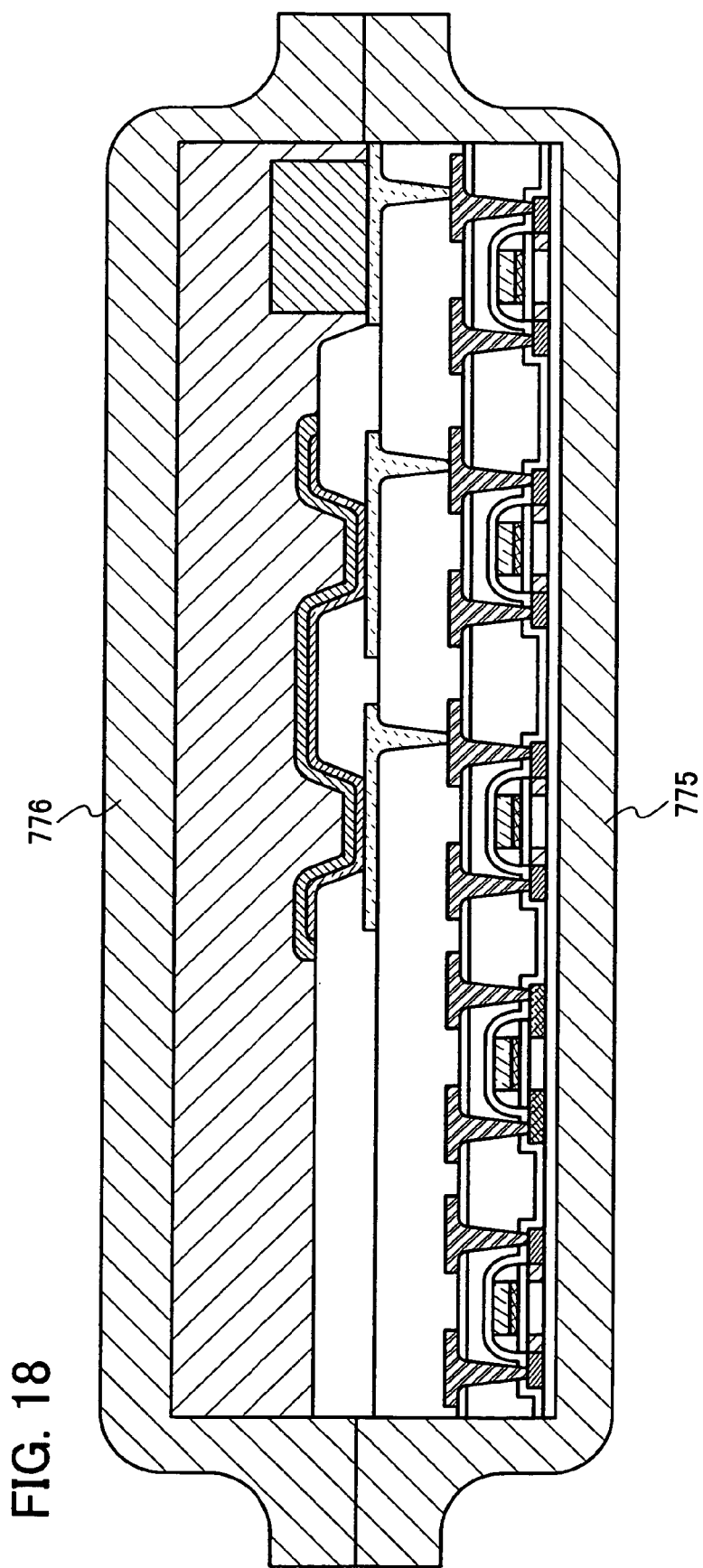
FIG. 18 shows a structural example of a method for manufacturing a semiconductor device of the present invention.

Next, one surface of the thin film integrated circuit 791 is attached to a first base 776 and the thin film integrated circuit 791 is completely peeled from the substrate 701 (FIG. 18). Subsequently, the other surface of the thin film integrated circuit 791 is attached to a second base 775 and then one or both of a heat treatment and a pressurization treatment is/are carried out to seal the thin film integrated circuit 791 by the first base 776 and the second base 775. The first base 776 and the second base 775 can be formed using a film including polypropylene, polyester, vinyl, polyvinyl fluoride, vinyl chloride, or the like, paper including a fibrous material, a multilayer film of a base material film (polyester, polyamide, inorganic evaporated film, papers, or the like) and an adhesive synthetic resin film (acrylic-based synthetic resin, epoxy-based synthetic resin, or the like), or the like. It is preferable that the film be antistatic (antistatic film). The film is subjected to a heat treatment and a pressurization treatment by thermocompression. At the heat treatment and the pressurization treatment, an adhesive layer provided at an outermost surface of the film or a layer provided at the outermost layer (not the adhesive layer) is melted by the heat treatment and attached by applying pressure. The first base 776 and the second base 775 may be provided with adhesive layers on their surfaces or are not necessarily provided therewith. The adhesive layer can be a layer containing an adhesive such as an adhesive containing a thermoplastic resin, an adhesive containing an ultraviolet curable resin, an adhesive containing an epoxy resin, or a resin additive.

By the above steps, a semiconductor device having the storage element portion and the antenna can be manufactured. By combining the above steps and the present invention, an inexpensive and flexible semiconductor device can be obtained.

This embodiment mode can be freely combined with Embodiment Modes 1 to 4.

Embodiment Mode 6

This embodiment mode will describe a method for manufacturing a semiconductor device, which is different from the method in the above embodiment mode.

Figure 19A:
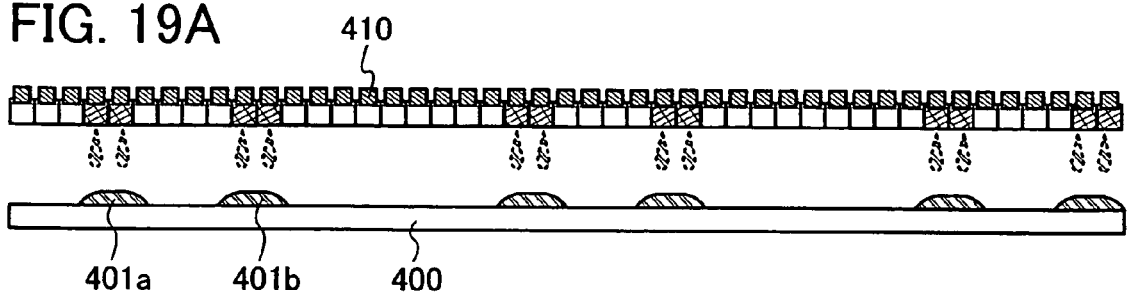
FIGS. 19A to 19E show a structural example of a method for manufacturing a semiconductor device of the present invention.

First, conductive layers 401a and 401b functioning as a wire and an electrode are formed by selectively discharging a conductive composition from a nozzle 410 on a substrate 400 (FIG. 19A). It is to be noted that a base insulating layer may be formed in advance as a protective film over the substrate 400. The base insulating layer may be irradiated with an ultrashort pulsed laser such as a picosecond laser or a femtosecond laser to form a depressed portion on the surface. This permits accurate control for a position at which the conductive layers 401a and 401b are to be formed, when discharging the composition.

Figure 19B:
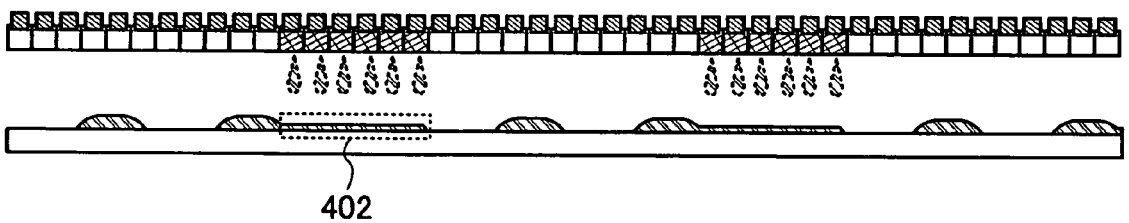

Next, a conductive layer 402 is formed by selectively discharging a conductive composition from the nozzle 410 (FIG. 19B). The conductive layer 402 may be formed at the same time as the conductive layer 401b, and the conductive layer 402 is particularly preferable to be provided in the case where the conductive layers 401b and 402 are formed with the same material.

Figure 19C:
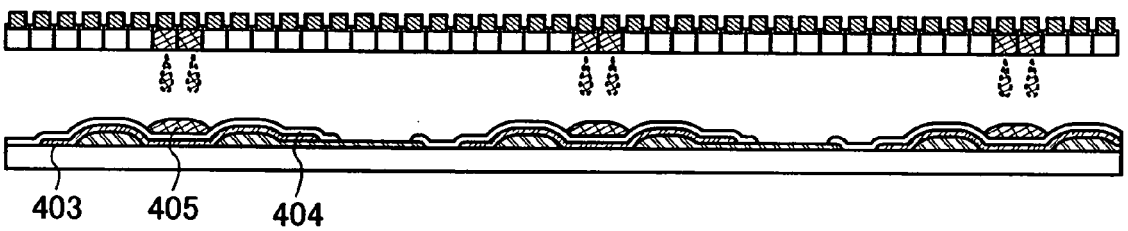

Subsequently, a semiconductor layer 403 is formed so as to cover the conductive layers 401a and 401b by selectively discharging a composition, and an insulating layer 404 is formed so as to cover the semiconductor layer 403. After that, a conductive layer functioning as a gate electrode (hereinafter referred to as a gate electrode 405) is formed between the conductive layers 401a and 401b (FIG. 19C). Since the depressed portion is formed between the conductive layers 401a and 401b, it is possible to accurately control a position when the gate electrode 405 is formed by discharging the composition.

Figure 19D:
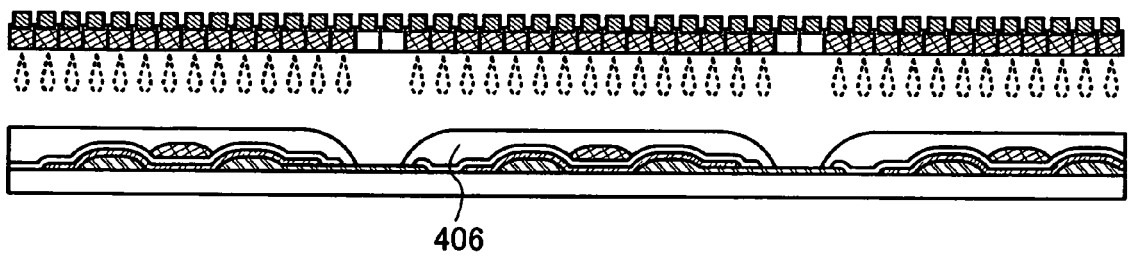

Next, an insulating layer 406 is formed by selectively discharging an insulating composition so as to cover the conductive layers 401a and 401b, the semiconductor layer 403, the insulating layer 404, and the gate electrode 405 (FIG. 19D).

Figure 19E:
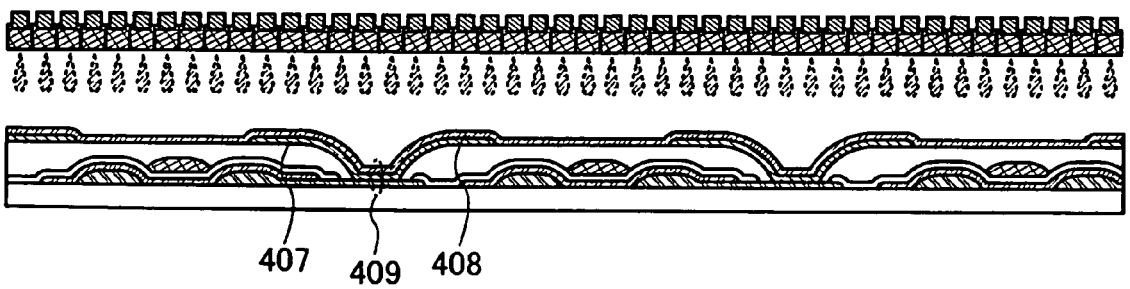

Next, an organic compound layer 407 is formed so as to be in contact with the conductive layer 402 by selectively discharging a composition, and a conductive layer 408 is formed over the organic compound layer 407. The organic compound layer 407 may be provided over the entire surface or may be provided so as to be in contact with the conductive layer 402 (FIG. 19E). In this way, a storage element portion 409 is formed by a multilayer body including the conductive layer 402, the organic compound layer 407, and the conductive layer 408.

By the above steps, an active matrix organic memory can be formed. Although FIGS. 19A to 19E show a case of using a droplet discharging method in all the steps, this embodiment mode is not restricted to this. In each step, an evaporation method, a CVD method, a sputtering method, a spin coating method, a printing method such as a screen printing method or a gravure printing method, or other methods can be used. It is also possible to use a different method for each step, i.e., combine the aforementioned methods. For example, the conductive layers 401a and 401b are formed by a droplet discharging method, the semiconductor layer 403 is formed by an evaporation method, and the organic compound layer 407 is formed by a spin coating method. A material and the like used in each step will be hereinafter described.

As the substrate 400, for example, a glass substrate made of barium borosilicate glass, aluminoborosilicate glass, or the like; a quartz substrate; a ceramic substrate; or the like can be used. Alternatively, a metal substrate including stainless steel or a semiconductor substrate over which an insulating layer is formed may be used. Although a flexible substrate made of synthetic resin such as plastic, for example PET, tends to have lower allowable temperature limit than the above substrate in general, the flexible substrate can also be used as long as the substrate can resist process temperature in the manufacturing steps. It is to be noted that a surface of the substrate 400 may be flattened by polishing by a CMP method or the like.

Materials for the conductive layers 401a and 401b are not particularly restricted as long as the materials are conductive. A conductive material having one or more selected from Ag, Au, Cu, Pd, Cr, Mo, Ti, Ta, W, and Al and a metal compound can be used. Besides those, a known conductive polymer of which conductivity is increased by doping or the like, for example conductive polyaniline, conductive polypyrrole, conductive polythiophene, polyethylene dioxythiophene (PEDOT) and a complex of polystyrene sulfonate (PSS), or the like can be used. Moreover, the same material as the conductive layer 402 can also be used.

Either one or both of the conductive layer 402 and the conductive layer 408 may be formed with a metal having a standard potential of −3.0 V or higher and +0.8 V or lower with a saturated calomel electrode as a reference. Specifically, magnesium (Mg), aluminum (Al), zinc (Zn), chromium (Cr), iron (Fe), cadmium (Cd), cobalt (Co), nickel (Ni), or the like is preferred. One kind of element selected from these metals or a single layer containing a plurality of the elements or a multilayer structure can be used.

In the case where one of the conductive layer 402 and the conductive layer 408 is formed with the metal or alloy, the other metal may be formed with a metal or alloy having a standard potential of +0.8 V or higher with a saturated calomel electrode as a reference. Specifically, gold (Au), silver (Ag), platinum (Pt), palladium (Pd), or the like is preferred. Moreover, a conductive material including metal oxide having a transparent property may be used. As the transparent conductive material, indium tin oxide (ITO), zinc oxide (ZnO), indium zinc oxide (IZO), gallium-doped zinc oxide (GZO), or other conductive oxide having a light-transmitting property can be used. Moreover, indium tin oxide containing silicon oxide, or indium oxide containing silicon oxide which is further mixed with 2 to 20 wt % of zinc oxide (ZnO) may be used. The above material can be formed by a droplet discharging method, an evaporation method, a sputtering method, a CVD method, a spin coating method, or a printing method such as a screen printing method or a gravure printing method. For example, Ag can be formed by a droplet discharging method and Al can be formed by an evaporation method.

As the semiconductor layer 403, a semiconductor element alone (such as silicon or germanium), an alloy including a semiconductor element, an organic semiconductor material, or the like can be used. The organic semiconductor material means an organic compound exhibiting an electric property like a semiconductor, and its structure desirably includes a π electron conjugated polymer material with its skeleton includes a conjugated double bond. Specifically, soluble polymer material such as polyphenylene vinylene, polythiophene, poly(3-alkylthiophene), or polythiophene derivative can be used. In addition, a material such as pentacene or naphtacene may be used. In this specification, a transistor using an organic semiconductor material for a semiconductor layer is called an organic transistor. In this embodiment mode, the organic compound can be formed by a droplet discharging method, a screen printing method, a gravure printing method, a spin coating method, an evaporation method, or the like.

The insulating layers 404 and 406 can be formed by using an inorganic insulating layer such as a silicon oxide layer, a silicon nitride layer, or a silicon nitride oxide layer; an insulating layer such as a layer containing polyvinyl phenol, polyimide, or siloxane, or the like. Moreover, polyvinyl phenol, polyimide, or siloxane can be formed effectively by a droplet discharging method, a printing method, or a spin coating method. Siloxane can be categorized into silica glass, alkylsiloxane polymer, alkylsilsesquioxane polymer, silsesquioxane hydride polymer, alkylsilsesquioxane hydride polymer, and the like according to their structures. Further, the insulating layer may be formed with a material including a polymer having a Si—N bond (polysilazane). Furthermore, these films may be stacked to form the insulating layer.

The organic compound layer 407 can be formed by using any of the organic compound materials shown in Embodiment Mode 1.

In the above structure, an element having a rectifying property may be provided between the conductive layer 402 and the organic compound layer 407 or between the organic compound layer 407 and the conductive layer 408. As the element having a rectifying property, a transistor of which a gate electrode is connected to a drain electrode, or a diode can be provided. For example, a PN junction diode provided by stacking an N-type semiconductor layer and a P-type semiconductor layer can be used. In this way, since current flows only in one direction by providing a diode having a rectifying property, errors decrease and reading margin improves. In the case of providing the diode, the PN junction diode may be replaced by a diode having another structure such as a PIN junction diode or an avalanche diode.

Although FIGS. 19A to 19E show a top-gate structure (staggered structure) in which a gate electrode is positioned above source and drain electrodes, a bottom-gate structure (inverted staggered) structure in which the gate electrode is positioned below the source and drain electrodes is also acceptable. A case of the bottom-gate structure is shown in FIG. 21A.

Figure 20A:
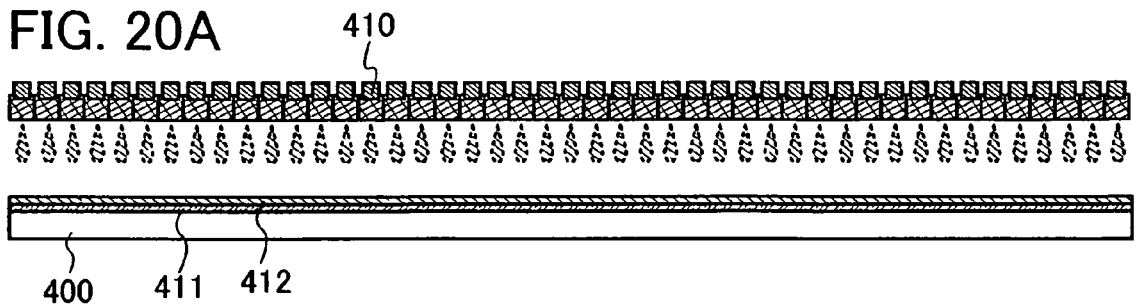
FIGS. 20A to 20E show a structural example of a method for manufacturing a semiconductor device of the present invention.
Figure 20B:
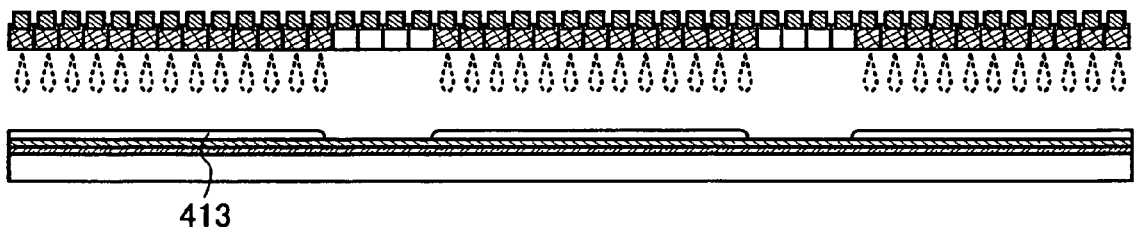
Figure 20C:
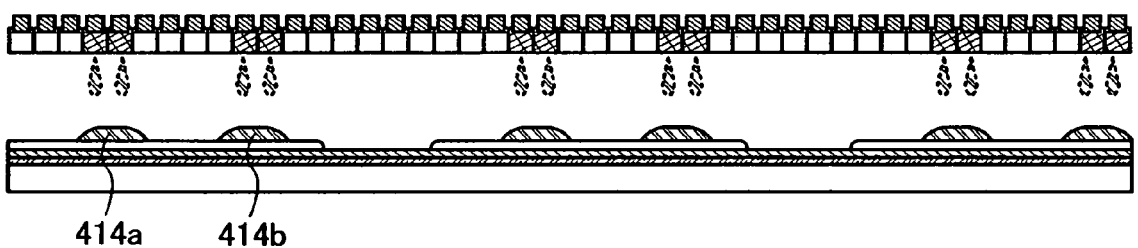
Figure 20D:
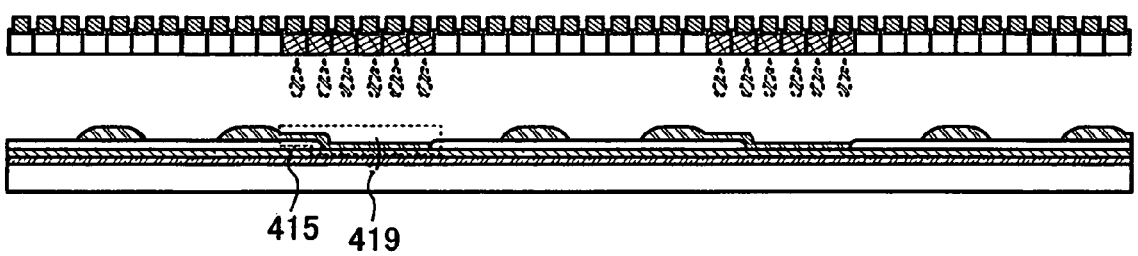
Figure 20E:
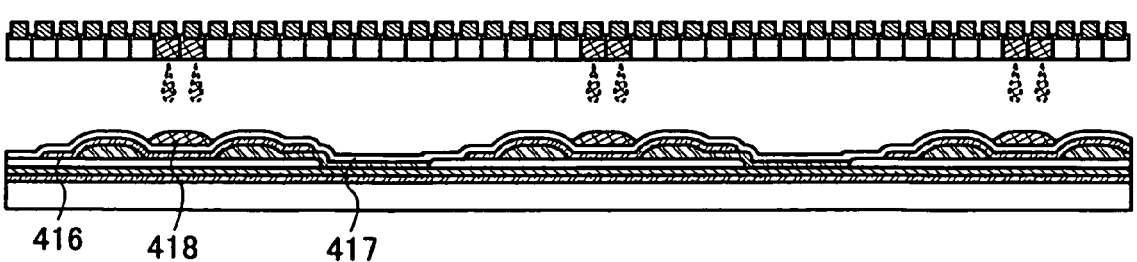
Figure 21A:
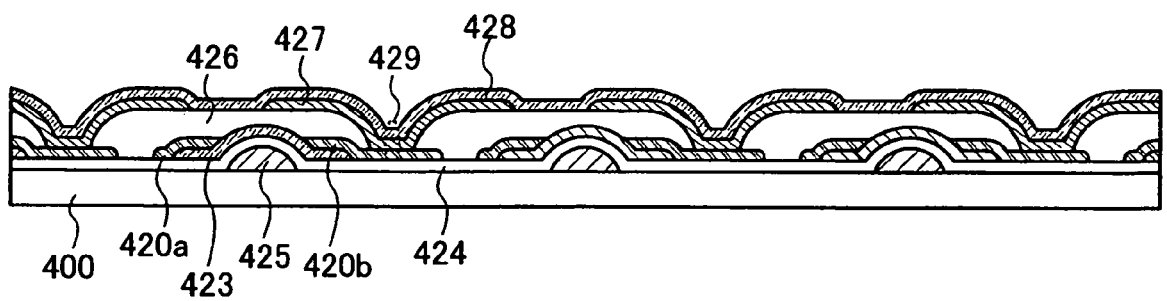
FIGS. 21A and 21B show a structural example of a semiconductor device of the present invention.

In FIG. 21A, a gate electrode 425, an insulating layer 424, a semiconductor layer 423, conductive layers 420*a* and 420*b* functioning as source or drain electrodes, an insulating layer 426, an organic compound layer 427, and a conductive layer 428 are stacked in order over the substrate 400. The materials and formation methods can be similar to those shown in FIGS. 20A to 20E. Even in this case, an element having a rectifying property may be provided between the conductive layer 420*b* and the organic compound layer 427 or between the organic compound layer 427 and the conductive layer 428.

Next, a case different from the above structure is described with reference to FIGS. 20A to 20E. Specifically, a case of providing a storage element portion under the transistor is shown.

First, a conductive layer 411 and an organic compound layer 412 are stacked over the substrate 400 (FIG. 20A). The conductive layer 411 and the organic compound layer 412 can be formed by any of the aforementioned methods.

Next, an insulating layer 413 is formed by selectively discharging an insulating composition (FIG. 20B). At this time, the insulating layer 413 is provided in a region other than a region to become a storage element portion.

Next, conductive layers 414*a* and 414*b* functioning as a wire and an electrode are selectively formed by selectively discharging a conductive composition over the insulating layer 413 (FIG. 20C). In this case, a depressed portion may be formed in advance by laser irradiation at a position on the insulating layer 413 where the conductive layers 414*a* and 414*b* are provided.

Next, a conductive layer 415 is formed so as to connect to the conductive layer 414*b* (FIG. 20D). It is to be noted that the conductive layer 415 is provided over the organic compound layer 412. Then, a storage element portion 419 having a multilayer structure of the conductive layer 411, the organic compound layer 412, and the conductive layer 415 is obtained. Since the conductive layer 415 is formed in the depressed portion, the position of the conductive layer 415 is easily controlled in the case of using a droplet discharging method or the like. The conductive layer 415 may be formed at the same time as the conductive layers 414*a* and 414*b*.

Next, a semiconductor layer 416 is formed so as to cover the conductive layers 414*a* and 414*b*. After that, an insulating layer 417 is formed so as to cover the semiconductor layer 416 and a gate electrode 418 is formed between the conductive layer 414*a* and the conductive layer 414*b* (FIG. 20E). Since a depressed portion is provided between the conductive layer 414*a* and the conductive layer 414*b*, the position is easily controlled in the case of providing the gate electrode 418 by a droplet discharging method or the like.

By the above steps, an organic memory where the storage element portion 419 is provided under the transistor can be formed. Although FIGS. 20A to 20E show the case of using a droplet discharging method in all the steps, the present invention is not restricted to this. In each step, an evaporation method, a CVD method, a sputtering method, a spin coating method, a printing method such as a screen printing method or a gravure printing method, or other methods can be employed. The above methods can be combined for each step. In particular, the material to be formed over the entire surface of the substrate like the conductive layer 411, the organic compound layer 412, and the like is preferably formed by a spin coating method.

In FIGS. 20A to 20E, the conductive layers 411, 414*a*, 414*b*, and 415, the insulating layers 413 and 417, and the semiconductor layer 416 can be formed with any material shown in FIGS. 19A to 19E. The organic compound layer 412 can also be formed with any material shown in the above embodiment modes.

Figure 21B:
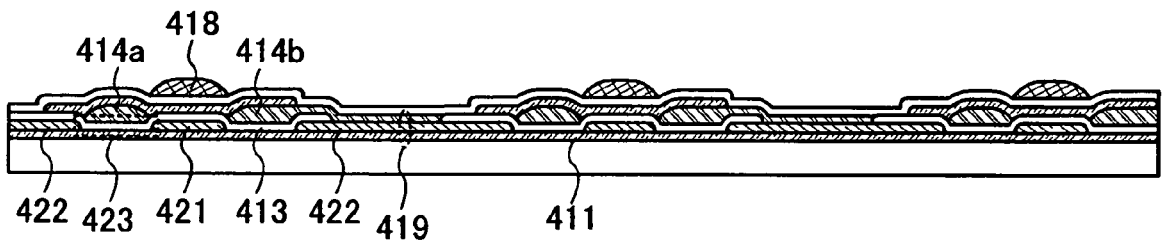

Next, an organic memory having a partially different structure from the structure shown in FIGS. 20A to 20E is shown in FIG. 21B.

In a highly-integrated storage element, an effect of an electric field in a lateral direction between the adjacent memory cells is sometimes a concern. Therefore, organic compound layers 422 provided in the adjacent storage element portions 419 may be separated from each other as shown in FIG. 21B. Here, after forming the conductive layer 411 over the substrate 400, the organic compound layer is selectively formed. In FIG. 21B, the organic compound layer 422 constituting a part of the storage element portions 419 is formed.

Moreover, in FIG. 21B, an organic compound layer 421 is provided. This is to make it easy to control the position when the conductive layers 414a and 414b are formed over the insulating layer 413 by a droplet discharging method or the like. In other words, by providing the organic compound layer 421, a depressed portion can be formed in advance at a position where the conductive layers 414a and 414b are to be provided. In the case of using another method such as an evaporation method or a sputtering method or considering flatness, the organic compound layer 421 is not necessarily provided. In this case, as mentioned above, a depressed portion is preferably formed in advance by irradiating with laser light a position on the insulating layer at which the conductive layers 414a and 414b are to be provided.

Even in the structures shown in FIGS. 20A to 20E and FIG. 21B, an element having a rectifying property may be provided between the organic compound layer and the conductive layer that constitutes a part of the storage element portion 419.

In this way, by providing the storage element portion and the transistor with an organic compound according to the present invention, an organic memory and a semiconductor device provided with the organic memory can be manufactured by a simple process at low cost. Moreover, by forming the transistor with an organic compound, an organic memory can be manufactured directly over a flexible substrate and a semiconductor device provided with the organic memory can be manufactured.

This embodiment mode can be freely combined with Embodiment Modes 1 to 5.

Embodiment Mode 7

This embodiment mode will describe a case of applying the semiconductor device shown in the above embodiment mode to a display device, with reference to drawings.

Figure 22A:
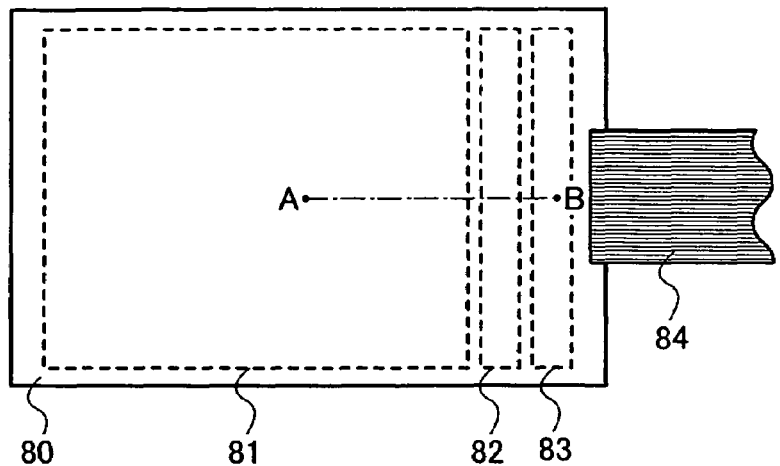
FIGS. 22A to 22C show a structural example in which a semiconductor device of the present invention is provided to a display device.
Figure 22B:
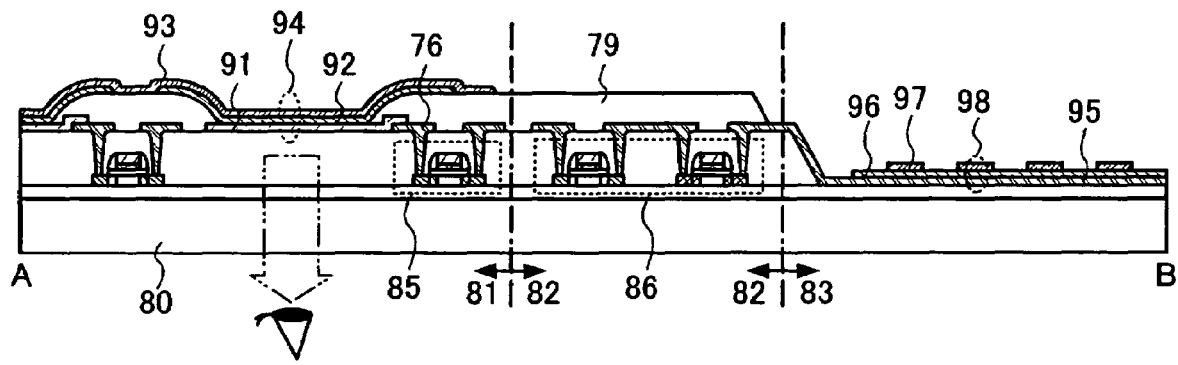

First, FIGS. 22A and 22B show a case in which a pixel portion is of active matrix type and a storage element portion is of passive matrix type. A cross sectional view along a line A-B of FIG. 22A corresponds to FIG. 22B.

A pixel portion 81 is provided with a light-emitting element 94 which has a first conductive layer 91, an organic compound layer 92, and a second conductive layer 93. The first conductive layer 91, the organic compound layer 92, and the second conductive layer 93 are provided by being stacked. The first conductive layer 91 included in the light-emitting element 94 is connected to the conductive layer 76 functioning as a source or drain wire of a driver transistor 85. Between the adjacent light-emitting elements 94 is provided an insulating layer 79 functioning as a partition wall.

In a driver circuit portion 82, an element-forming layer including a plurality of transistors 86 is provided. The element-forming layer constitutes a part of a driver circuit for controlling operation of the pixel portion 81 and a memory cell portion 83. The driver circuit for controlling the operation of the pixel portion 81 corresponds to, for example, a shift register, a decoder, a buffer, a sampling circuit, a latch, or the like. Moreover, the driver circuit for controlling the operation of the memory cell portion 83 corresponds to, for example, a decoder, a sense amplifier, a selector, a buffer, a reading circuit, a writing circuit, or the like.

In the memory cell portion 83, a storage element 98 having a first conductive layer 95 functioning as a word line Wy, an organic compound layer 96, and a second conductive layer 97 functioning as a bit line Bx is provided. The first conductive layer 95, the organic compound layer 96, and the second conductive layer 97 are provided by being stacked. In the structure shown in FIG. 22B, by forming the storage element portion 98 over the insulating layer 79, the memory cell portion 83 can be provided over the driver circuit portion 82. Such a structure makes it possible to expand the area of the pixel portion 81.

Moreover, a connection film 84 is provided over the substrate 80, and the connection film 84 specifically corresponds to a flexible print circuit (FPC) or the like. A signal and a power source potential for controlling operation of a plurality of elements that constitute parts of the pixel portion 81 and the memory cell portion 83 are inputted from outside through the connection film 84.

Data reading from the storage element 98 in the memory cell portion 83 is carried out by applying an electric action. Specifically, voltage is applied between the first conductive layer 95 and the second conductive layer 97 of the storage element 98 and the resistance of the storage element 98 is read, thereby carrying out data reading. When data reading is carried out in this way, the storage element 98 may emit light depending on the material for the organic compound layer 96. Therefore, in the case where the organic compound layer 92 in the light-emitting element 94 and the organic compound layer 96 in the storage element 98 are formed with the same material, a housing such as black matrix is preferably arranged so that the light emission from the storage element 98 is not observed. Alternatively, such a structure may be employed that only the light-emitting element 94 emits light by providing the organic compound layer 92 in the light-emitting element 94 and the organic compound layer 96 in the storage element 98 with different materials.

Figure 22C:
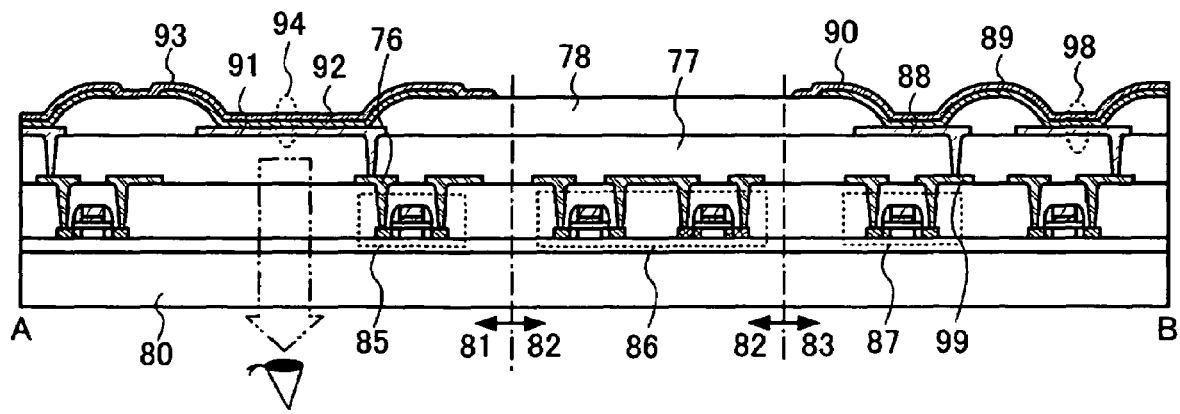

Next, FIG. 22C shows a case in which the pixel portion and the storage element portion are of active matrix type.

In the pixel portion 81, the light-emitting element 94 having the first conductive layer 91, the organic compound layer 92, and the second conductive layer 93 is provided. The first conductive layer 91, the organic compound layer 92, and the second conductive layer 93 are provided by being stacked. The first conductive layer 91 in the light-emitting element 94 is connected to the conductive layer 76 functioning as a source or drain wire of the driver transistor 85 through the insulating layer 77. Moreover, between the adjacent light-emitting elements 94 is provided an insulating layer 78 functioning as a partition wall.

In the driver circuit portion 82, an element-forming layer including a plurality of transistors 86 is provided. The element-forming layer constitutes a part of a driver circuit for controlling operation of the pixel portion 81 and the memory cell portion 83. The driver circuit for controlling the operation of the pixel portion 81 corresponds to, for example, a shift register, a decoder, a buffer, a sampling circuit, a latch, or the like. Moreover, the driver circuit for controlling the operation of the memory cell portion 83 corresponds to, for example, a decoder, a sense amplifier, a selector, a buffer, a reading circuit, a writing circuit, or the like.

In the memory cell portion 83, the storage element 98 having a first conductive layer 88, an organic compound layer 89, and a second conductive layer 90 is provided. The first conductive layer 88, the organic compound layer 89, and the second conductive layer 90 are provided by being stacked. The first conductive layer 88 in the storage element 98 is connected to a conductive layer 99 functioning as a source-drain wire of a switching transistor 87 with the insulating layer 77 interposed therebetween. Between the adjacent storage elements 98 is provided the insulating layer 78 functioning as a partition wall. In the structure shown in FIG. 22C, the first conductive layer 91 may be provided in the same layer as the conductive layer 76 functioning as a source or drain electrode without providing the insulating layer 77, or the first conductive layer 88 may be provided in the same layer as the conductive layer 99 functioning as a source or drain electrode of the switching transistor 87.

In the above structure, light may be emitted from the light-emitting element 94 toward a substrate 80 side (bottom-emission structure) or the light may be emitted toward a side opposite of the substrate 80 (top-emission structure). Moreover, a dual-emission structure having both of the top-emission structure and the bottom-emission structure may be employed.

Moreover in the above structure, the organic compound layers 96, 92, and 89 can be manufactured by a droplet discharging method, a spin coating method, a screen printing method, a gravure printing method, an evaporation method, or the like. Although the organic compound layers 96, 92, and 89 are formed selectively in FIGS. 22B and 22C, the organic compound layers 96, 92, and 89 can be formed by a droplet discharging method, a screen printing method, a gravure printing method, or the like. In this case, since the organic compound layer can be provided selectively for each pixel or each memory cell, usage efficiency of a material can be improved. Further, a different material can be used for each of the organic compound layers 96, 92, and 89.

A light-emitting device having the above structure has a storage circuit including a storage element portion with a structure in which an organic compound layer is sandwiched between a pair of conductive layers. Since the structure of the above storage element portion is the same or almost the same as the structure of the light-emitting element, an inexpensive display device which can be easily manufactured can be provided. Moreover, since size reduction of the memory cell is easy, high integration is easy; therefore, a display device with a large-capacity storage circuit can be provided.

In combination with the present invention, the display device of this embodiment mode can have a plurality of pixels for displaying an image and a storage circuit over one substrate. This feature allows the number of IC chips connected to the outside to decrease; therefore a display device which has achieved reduction in size, thickness, and weight can be provided.

This embodiment mode can be freely combined with Embodiment Modes 1 to 4 and Embodiment Mode 6. In other words, the material and structure of the semiconductor device shown in any of the above embodiment modes can be freely combined with this embodiment mode.

Embodiment Mode 8

Figure 23A:
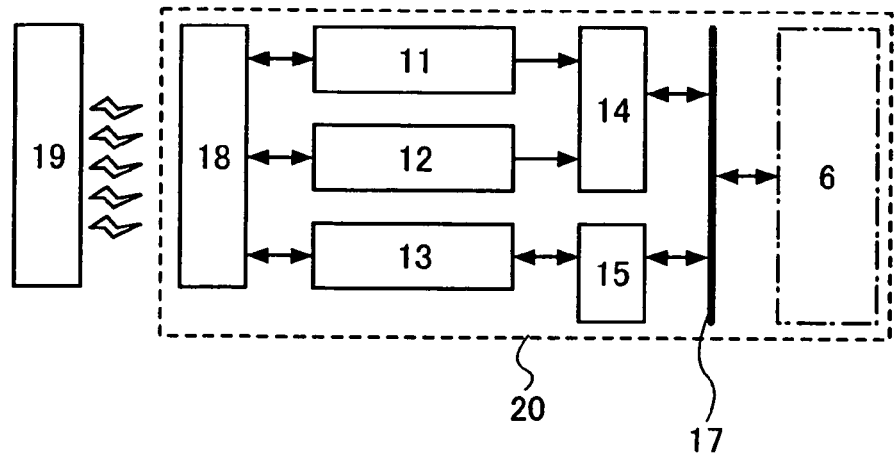
FIGS. 23A to 23C show usage of a semiconductor device of the present invention.
Figure 23B:
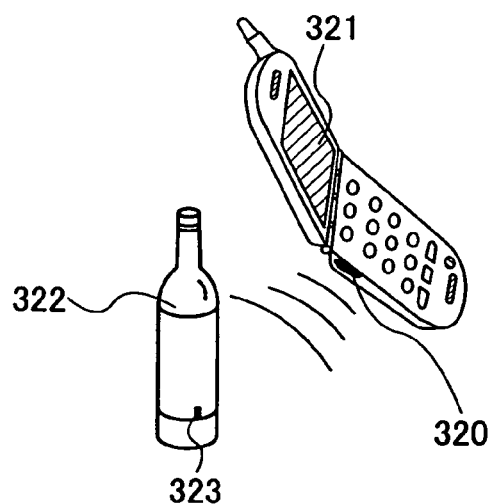
Figure 23C:
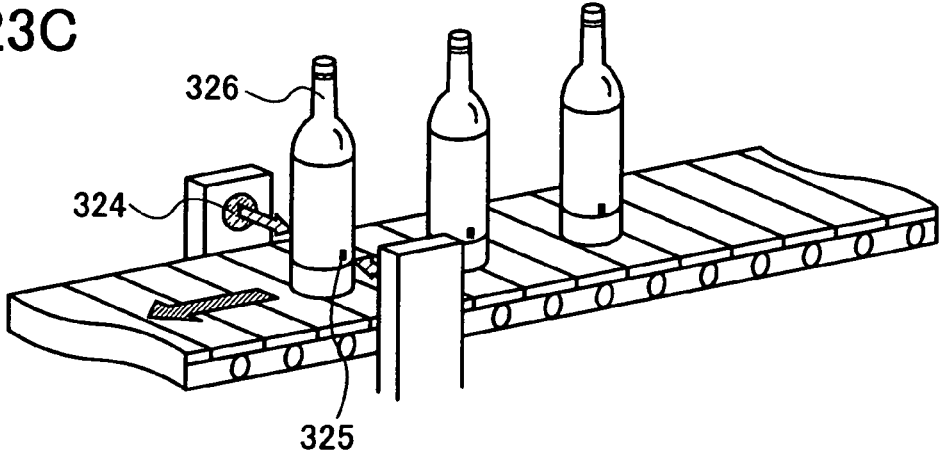

This embodiment mode will describe with reference to FIGS. 23A to 23C a semiconductor device of the present invention capable of sending and receiving data without contact, such as a wireless chip.

A semiconductor device 20 has a function of exchanging data without contact and has a power source circuit 11, a clock generating circuit 12, a data demodulating/modulating circuit 13, a controlling circuit 14 for controlling another circuit, an interface 15, a memory 6, a data bus 17, and an antenna (antenna coil) 18 (FIG. 23A).

The power source circuit 11 is a circuit generating various power sources to be supplied to the respective circuits in the semiconductor device 20 based on an alternating signal inputted from the antenna 18. The clock generating circuit 12 is a circuit generating various clock signals to be supplied to each circuit in the semiconductor device 20 based on an alternating signal inputted from the antenna 18. The data modulating/demodulating circuit 13 has a function of modulating/demodulating data to be sent to or received from a reader/writer 19. The controlling circuit 14 has a function of controlling the memory 6. The antenna 18 has a function of sending and receiving an electromagnetic wave or an electric wave. The reader/writer 19 exchanges data with the semiconductor device, controls the semiconductor device, and controls the process of the data sent to or received from the semiconductor device.

The memory 6 is formed to have any structure of the organic memories shown in the above embodiment modes. The semiconductor device is not restricted to the above structure, and for example, another element such as a limiter circuit of power source voltage or hardware only for processing codes may be added.

Moreover, in the semiconductor device, power source voltage may be supplied to each circuit by any of the following means: an electric wave instead of providing a power source (battery), a power source (battery) provided instead of an antenna, and both of an electric wave and a power source.

The semiconductor device of the present invention has advantages of communicating without contact; capability of multiple readings; capability of data writing, erasing, and rewriting; processability into various shapes; strong directivity and wide recognition range, depending on a selected frequency; and so on. The semiconductor device can be applied to an IC tag which can identify individual information on a person or an object through wireless communication without contact, a label which can be pasted to a target, a wristband for an event or amusement, or the like. Further, the semiconductor device may be shaped by a resin material or may be fixed directly to a metal for interrupting wireless communication. The semiconductor device can be utilized for operating systems such as an entrance-exit control system and a payment system.

Next, one mode of practically using a semiconductor device is described. A side surface of a mobile terminal including a display portion 321 is provided with a reader/writer 320, and a side surface of a product 322 is provided with a semiconductor device 323 (FIG. 23B). When the reader/writer 320 is held over the semiconductor device 323 included in the product 322, the display portion 321 displays information on the product, such as an ingredient, a production area, an inspection result for each production step, history of a circulation process, and further, description on the product. When a product 326 is delivered by a conveyor belt, the product 326 can be inspected by using a semiconductor device 325 provided to the product 326 (FIG. 23C). In this way, by utilizing the semiconductor device for the system in accordance with the present invention, information can be easily obtained to achieve a sophisticated and high-value-added system.

This embodiment mode can be freely combined with any of Embodiment Modes 1 to 6.

Embodiment Mode 9

Figure 24A:
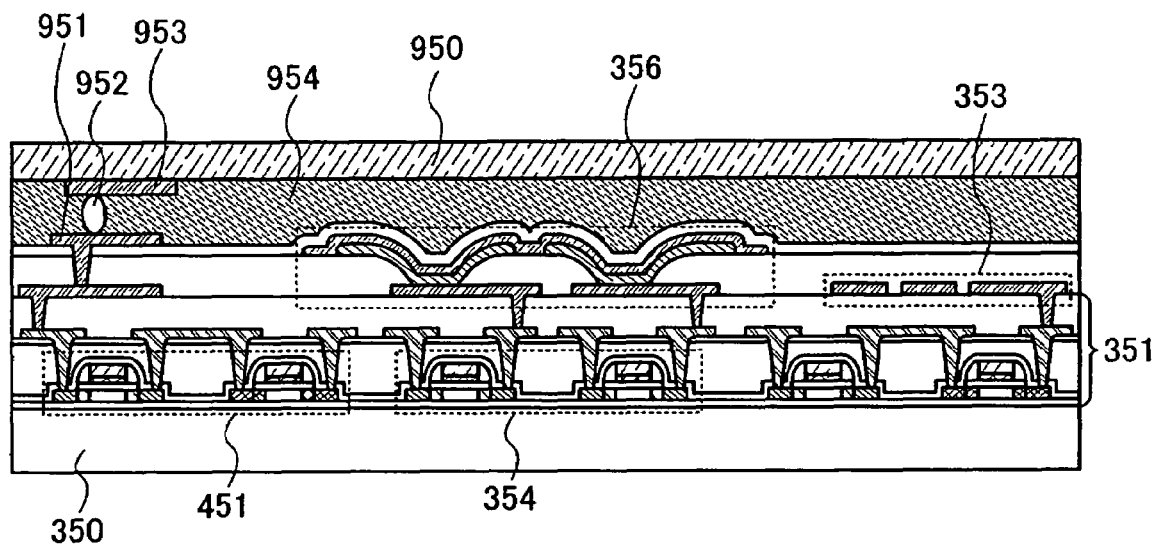
FIGS. 24A and 24B show a structural example of a semiconductor device of the present invention.
Figure 24B:
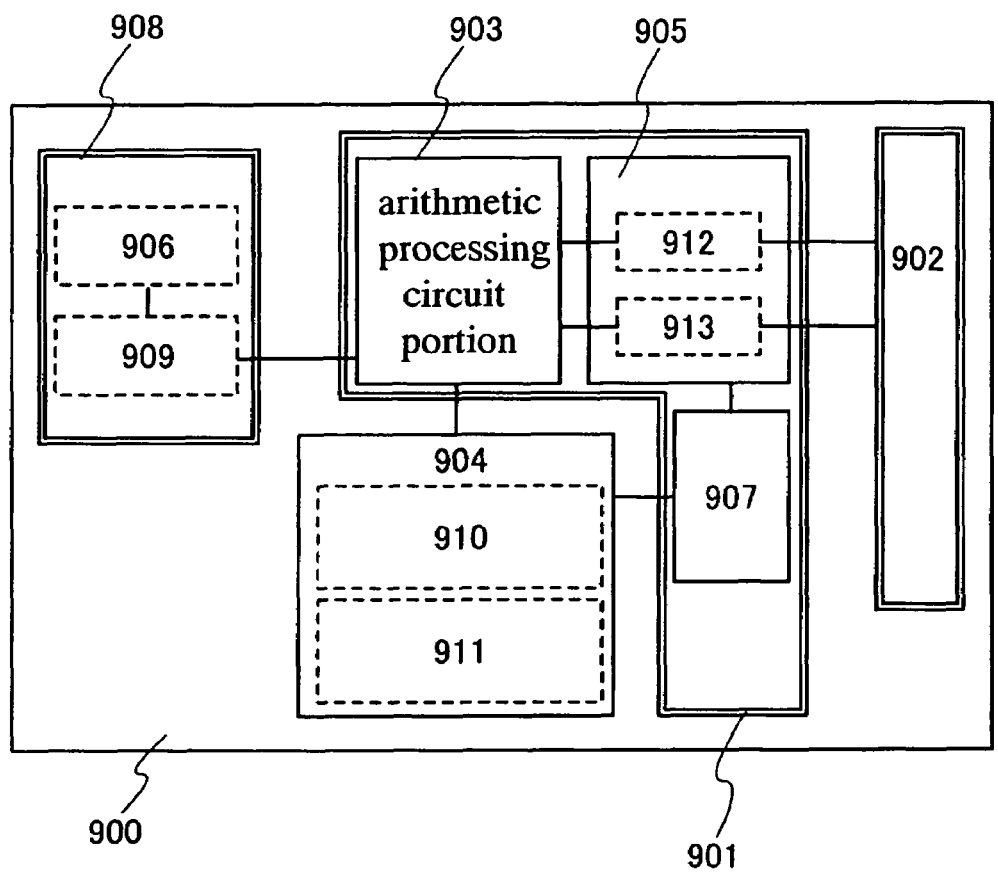

This embodiment mode will describe with reference to FIGS. 24A and 24B a semiconductor device provided with a sensor which can measure various information such as temperature and pressure in addition to the above structure.

FIG. 24A shows a structural example of a case of providing a sensor portion in a semiconductor device shown in the above embodiment mode. The element-forming layer 351 including the transistors 451 and 354 is provided over the substrate 350 and the storage element portion 356 and the antenna portion 353 are provided over the element-forming layer. Then, a sensor portion 950 is provided over the storage element portion 356.

The sensor portion 950 can detect temperature, humidity, illuminance, gas, gravity, pressure, sound, vibration, acceleration, and other characteristics by a physical or chemical means. Moreover, the sensor portion 950 has a sensor and a sensor circuit for controlling the sensor. As the sensor, a resistor element, a photoelectric conversion element, a thermo-electromotive force element, a transistor, a thermistor, a diode, or the like can be used.

The sensor portion 950 is connected to the transistors 451 in the element-forming layer 351 and here, they are pasted to each other by a resin 954 having an adhesive property. The sensor portion 950 and the transistors 451 are electrically connected to each other through a conductive particulate 952 contained in a resin 954 in such a way that a conductive layer 953 electrically connected to the sensor portion 950 and a conductive layer 951 electrically connected to a source or drain region of a transistor are electrically connected to each other.

The sensor portion 950 may be arranged at any position without being restricted to the above structure. For example, the sensor portion 950 may be provided in the same layer as the storage element portion 356 or in the same layer as the transistors 451. The sensor portion 950 can be provided under the substrate 350.

In the above structure, the sensor portion 950 may be connected to the transistor 451 not only by the above method but also by a method using a conductive adhesive such as a silver paste, a copper paste, or a carbon paste, or solder bonding, or a known method such as a TCP (Tape Carrier Package) method or a wire bonding method.

Although the semiconductor device is pasted to the sensor portion formed separately in the above structure, the sensor portion can be directly manufactured in the semiconductor device. The latter case will be described with reference to FIG. 25.

Figure 25:
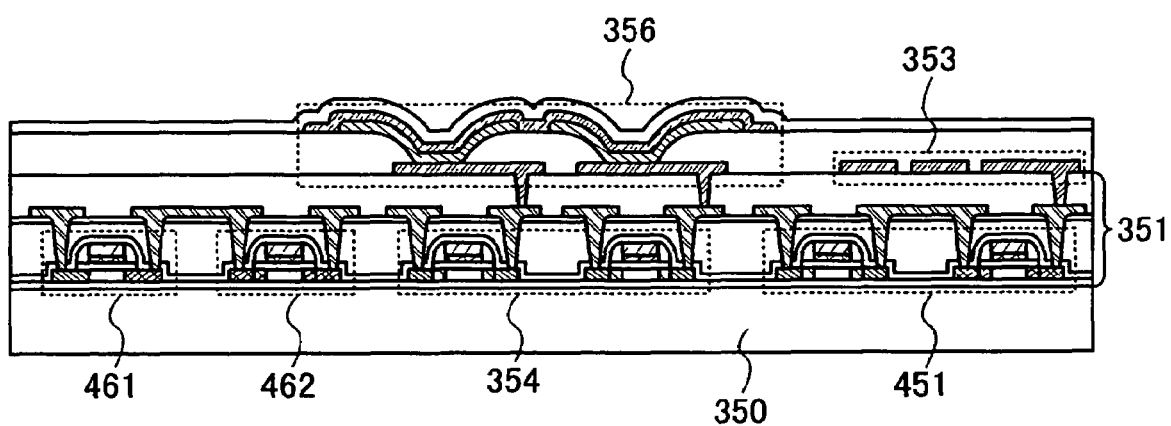
FIG. 25 shows a structural example of a semiconductor device of the present invention.

In FIG. 25, a light sensor is provided in the same layer as the element-forming layer 351 including the transistors 354 and 451. Here, a photodiode 461 including a P-type impurity region, an intrinsic semiconductor region, and an N-type impurity region is provided as the light sensor. Since the photodiode 461 changes in its current value by light irradiation, light can be detected by measuring the change in the current valued with the use of a transistor 462 connected to the photodiode 461. Moreover, the photodiode 461 may have a junction structure of a P-type impurity region, an intrinsic semiconductor region, and a P-type impurity region; an N-type impurity region, an intrinsic semiconductor region, and an N-type impurity region; or a P-type impurity region and an N-type impurity region. A photo transistor may be provided instead of the photodiode. For example, the photodiode or the photo transistor is preferably manufactured at the same time in the case of providing the transistors 354 and 451 by thin film transistors, because the process can be simplified and cost can be reduced.

Next, FIG. 24B shows a structure of a semiconductor device 900 equipped with an element-forming layer 901, a storage circuit portion 904, a sensor 908, and an antenna 902. A sensor portion 906 detects temperature, humidity, illuminance, gas, gravity, pressure, sound, vibration, acceleration, and other characteristics by a physical or chemical means. Moreover, the sensor portion 906 has the sensor 908 and a sensor circuit 909 for controlling the sensor 908. The sensor 908 is formed by a resistor element, a photoelectric conversion element, a thermo-electromotive force element, a transistor, a thermistor, a diode, or the like. The sensor circuit 909 detects changes of impedance, reactance, inductance, voltage, or current, and performs analog/digital conversion (A/D conversion) of the changes into signals and then outputs the signals to an arithmetic processing circuit portion 903.

The element-forming layer 901 is provided with the arithmetic processing circuit portion 903, a communication circuit portion 905, and a power source circuit portion 907. The storage circuit portion 904 can be provided in the element-forming layer 901. The storage circuit portion 904 can at anytime store information from the outside which has been received through the sensor portion 906 and the antenna 902. The storage circuit portion 904 can be constituted by two separate parts: a first storage circuit portion 910 for storing signals detected by the sensor portion 906 and a second storage circuit portion 911 for storing information written from a reader/writer device.

It is preferable that the first storage circuit portion 910 be sequentially-writable in order to store information detected by the sensor portion 906 and constituted by a flash memory in which data is not erased. Moreover, a write-once storage element portion is preferably applied.

The communication circuit portion 905 includes a demodulating circuit 912 and a modulating circuit 913. The demodulating circuit 912 demodulates a signal inputted through the antenna 902 and outputs the signal to the arithmetic processing circuit portion 903. The signal includes a signal for controlling the sensor portion 906 and information to be stored in the storage circuit portion 904. Moreover, the signal outputted from the sensor circuit 909 and the information read from the storage circuit portion 904 are outputted to the modulating circuit 913 through the arithmetic processing circuit portion 903. The modulating circuit 913 modulates this signal into a wirelessly communicable signal and outputs the modulated signal to an external device through the antenna 902.

Electric power required for operating the arithmetic processing circuit portion 903, the sensor portion 906, the storage circuit portion 904, and the communication circuit portion 905 is supplied through the antenna 902. Moreover, a battery may be incorporated depending on how the device will be used.

In this way, by providing the sensor for detecting the information such as temperature or pressure in the. semiconductor device shown in the above embodiment mode, it becomes possible to manage various information detected by the sensor by storing the information in the storage element portion. For example, a semiconductor device having a gas sensor can be provided to foods to control the condition of the foods. Specifically, a semiconductor device having a gas sensor is provided to perishable foods to detect putrefaction gas from the foods. A reader/writer provided to shelves or the side of a conveyor belt regularly reads information stored in the semiconductor device; accordingly, the freshness of the foods can be controlled and a putrefying food can be sorted out from the rest.

A semiconductor device having a sensor such as a temperature sensor or a pressure sensor is provided over a surface of a human body or inside the body to store information on a living body such as a pulse rate, a heart rate, body temperature, blood pressure, an electrocardiogram, or an electromyogram. The semiconductor device according to the present invention is so thin and small that information on a living body can be read out without body restraint. By regularly reading the stored information by a reader/writer, a health condition or an exercise condition of a human body can be controlled and diseases can be prevented and predicted. Further, a monitoring system for home medical care and the like can be realized by obtaining information on a living body which is read out by a reader/writer using a network such as the Internet. It is also possible to control various information not only on a human body but also on animals such as livestock by implanting a semiconductor device equipped with a sensor in the animals. Since the above system is inexpensive and has a function of writing, erasing, and rewriting data arbitrarily by using the semiconductor device of the present invention, a sophisticated monitoring system for home medical care and the like can be provided.

This embodiment mode can be freely combined with Embodiment Modes 1 to 8. In other words, this embodiment mode can be combined with any structure of semiconductor devices shown in the above embodiment modes.

Embodiment Mode 10

Figure 26:
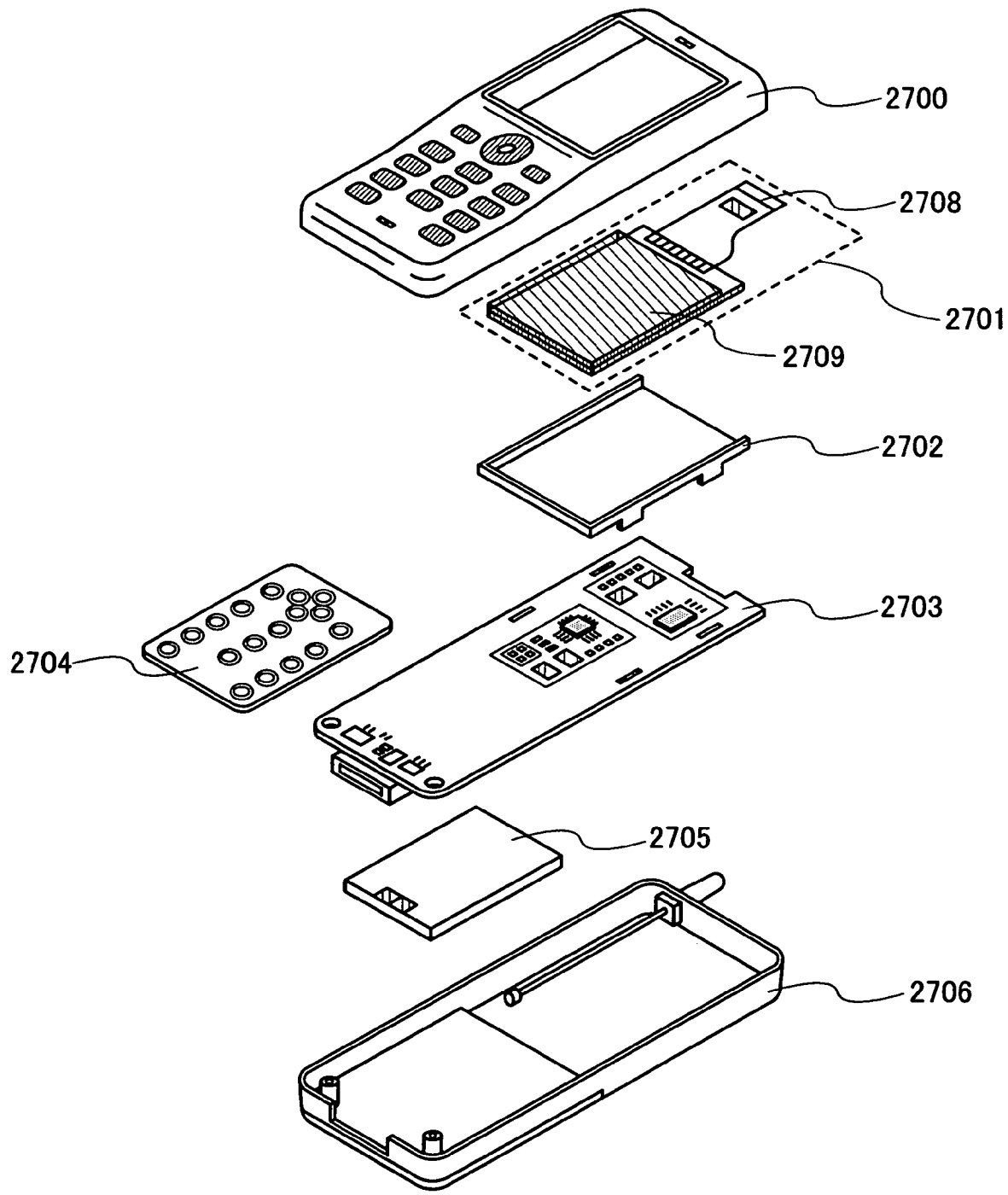
FIG. 26 shows usage of a semiconductor device of the present invention.

Application range of the semiconductor device of the present invention is wide, and for example, the semiconductor device of the present invention can be applied to an electronic appliance for storing and displaying information. Such an electronic appliance is, for example, a liquid crystal display device, an EL display device, a television device, a mobile information terminal typified by a mobile phone, a printer, a camera, a personal computer, a earphone-equipped goggle, a speaker device, a headphone, a navigation system, a car-mount device for ETC, an electronic key, or the like. A case of using the semiconductor device of the present invention to a mobile phone will be described with reference to FIG. 26.

The mobile phone includes cases 2700 and 2706, a panel 2701, a housing 2702, a print wiring substrate 2703, operation buttons 2704, and a battery 2705. The panel 2701 is detachably incorporated into the housing 2702, and the housing 2702 is fitted into the print wiring substrate 2703. The shape and size of the housing 2702 is appropriately modified in accordance with an electronic appliance to which the panel 2701 is to be incorporated. The print wiring substrate 2703 has a plurality of packaged semiconductor devices mounted. A semiconductor device of the present invention can be used as one of the packaged semiconductor devices. The plurality of semiconductor devices mounted on the print wiring substrate 2703 has any function of a controller, a central processing unit (CPU), a memory, a power source circuit, an audio processing circuit, a sending/receiving circuit, and the like.

The panel 2701 is connected to the print wiring substrate 2703 through a connection film 2708. The panel 2701 is housed inside the cases 2700 and 2706 together with the operation buttons 2704 and the battery 2705. The pixel region 2709 in the panel 2701 is provided so as to be observed from an opening window provided in the case 2700.

The semiconductor device of the present invention has advantages of its compactness, thinness, and lightness in weight. These advantages allow efficient usage of limited space in the cases 2700 and 2706 of the electronic appliance. Moreover, the semiconductor device of the present invention has a storage circuit with a simple structure, and accordingly, an electronic appliance using an inexpensive and highly-integrated storage circuit can be provided. Moreover, the semiconductor device of the present invention is arbitrarily writable, erasable, and rewritable, and accordingly, a more sophisticated and higher-value-added electronic appliance can be provided. The semiconductor device of the present invention can have a transistor using a single-crystal semiconductor layer having favorable mobility and response speed in its channel region. In this case, an electronic appliance using a semiconductor device which is capable of high-speed operation and which has higher operating frequency can be provided.

For example, a semiconductor device of the present invention can be provided and used for bills, coins, securities, certificates, bearer bonds, containers for wrapping, documents, storage media, personal belongings, vehicles, groceries, garments, health products, daily commodities, medicines, electronic appliances, and the like.

Figure 27A:
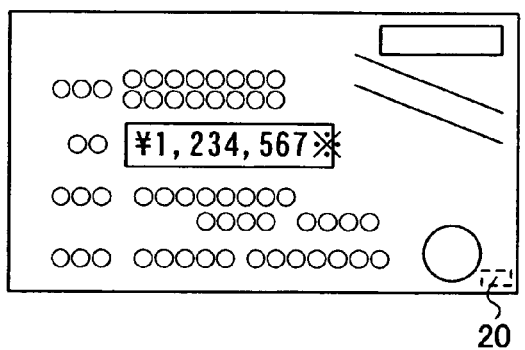
FIGS. 27A to 27H show usage of a semiconductor device of the present invention.
Figure 27B:
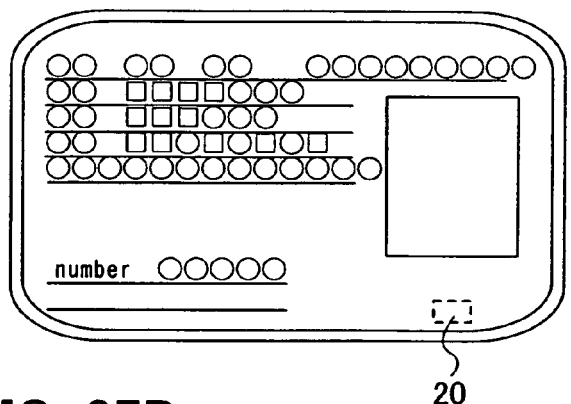
Figure 27C:
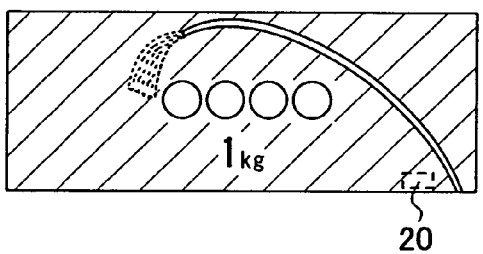
Figure 27D:
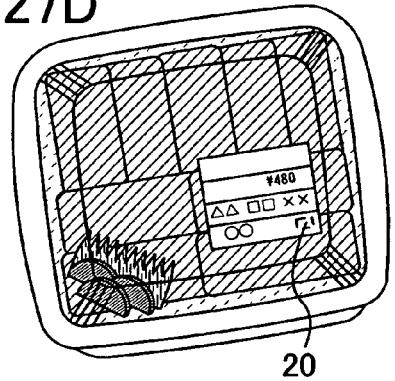
Figure 27E:
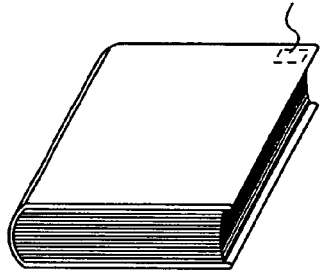
Figure 27F:
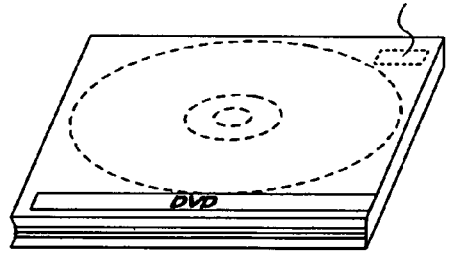
Figure 27G:
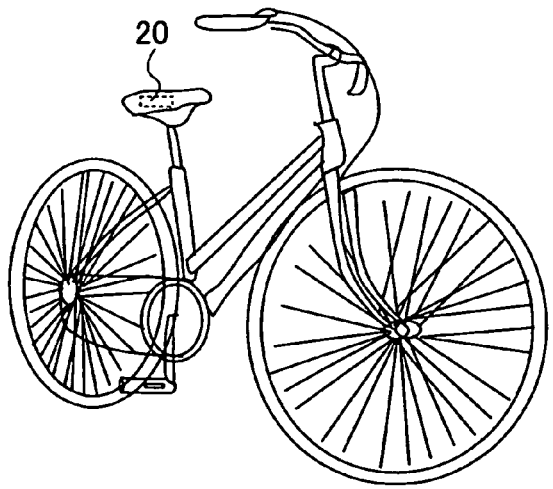
Figure 27H:
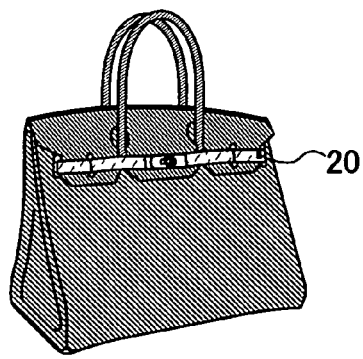

The bills and coins are money that circulates in the market, and include one that can be used in the same way as money in a specific area (such as cash voucher), a commemorative coin, and the like. The securities indicate a check, certificate, a promissory note, and the like (see FIG. 27A). The certificates indicate a driver's license, a resident's card, and the like (see FIG. 27B). The bearer bonds indicate a stamp, a rice coupon, various gift coupons, and the like (see FIG. 27C). The containers for wrapping indicate a wrapper for a packaged lunch and the like, a plastic bottle, and the like (see FIG. 27D). The documents indicate a magazine, a dictionary, a book, and the like (see FIG. 27E). The storage media indicate DVD software, a video tape, and the like (see FIG. 27F). The vehicles indicate a wheeled vehicle such as a bicycle, a ship, and the like (see FIG. 27G). The personal belongings indicate a bag, glasses, and the like (see FIG. 27H). The groceries indicate foods, beverages, and the like. The garments indicate clothes, shoes, and the like. The health products indicate a medical apparatus, a health appliance, and the like. The daily commodities indicate furniture, lighting apparatus, and the like. The medicines indicate a drug, an agricultural chemical, and the like. The electronic devices indicate a liquid crystal display device, an EL display device, a television device, a cellular phone, a printer, a camera, a personal computer, a earphone-equipped goggle, a speaker device, a headphone, a navigation device, a car-mount device for ETC, an electronic key, and the like.

By providing the semiconductor device for bills, coins, securities, certificates, bearer bonds, and the like, falsification can be prevented. In addition, by providing the semiconductor device for containers for wrapping, books, storage mediums, personal belongings, groceries, daily commodities, electronic devices, and the like, efficiency of an inspection system and a system of a rental store, and the like can be improved. By providing the semiconductor device for vehicles, health products, medicines, and the like, falsification and theft can be prevented, and accidental ingestion of a drug can be prevented in the case of the medicines. The semiconductor device can be provided by being attached to the surface of an article or being implanted in an article. For example, the semiconductor device can be implanted in paper in the case of a book, and can be implanted in an organic resin in the case of a package composed of the organic resin.

However, it is preferable to make devises; for example, requiring a password or forming a security key at data rewriting so that data stored in a rewritable memory is not modified by an unspecified third person. Moreover, problems of privacy after a user purchases a product and the like can also be solved by providing a data erasing system in a storage element provided in the semiconductor device.

By providing the semiconductor devices for containers for wrapping, books, storage media, personal belongings, groceries, daily commodities, electronic devices, and the like, an inspection system and a system of a rental store, and the like can be facilitated. By providing the semiconductor devices for vehicles, falsification and theft can be prevented. By implanting the semiconductor devices in creatures such as animals, identification of the individual creature can be easily carried out. For example, by implanting the semiconductor device equipped with a sensor in a creature such as livestock, it is possible to easily know not only a year of birth, sex, and kind but also a health condition such as current temperature.

As thus described, the semiconductor device of the present invention can be used by being provided to any object as long as the object is to store data. Moreover, the semiconductor device of the present invention has a storage circuit with a simple structure, and accordingly, an electronic appliance using a semiconductor device having an inexpensive and compact storage circuit can be provided. Moreover, the semiconductor device is arbitrarily writable, erasable, and rewritable, and accordingly, a more sophisticated and higher-value-added electronic appliance can be provided. This embodiment mode can be freely combined with the above embodiment mode.

This application is based on Japanese Patent Application serial no. 2005-194077 filed in Japan Patent Office on Jul. 1, 2005, the entire contents of which are hereby incorporated by reference.

What is claimed is:

1. A semiconductor device comprising:
a storage element including a first conductive layer, a second conductive layer, and a layer containing at least one kind of an organic compound between the first conductive layer and the second conductive layer; and
a transistor,
wherein a source or drain region of the transistor is electrically connected to the first conductive layer or the second conductive layer, and
wherein when current is fed between the first conductive layer and the second conductive layer, the organic compound is reduced and one of the first conductive layer and the second conductive layer is oxidized, so that one of the first conductive layer and the second conductive layer is partially ionized.

2. A semiconductor device according to claim 1,
wherein one or both of the first conductive layer and the second conductive layer has/have a standard potential of −3.0 V or higher and +0.8 V or lower with a saturated calomel electrode as a reference.

3. A semiconductor device according to claim 1, further comprising an antenna,
wherein the antenna is electrically connected to a transistor that constitutes a part of a waveform shaping circuit or a rectifying circuit.

4. An electronic appliance using the semiconductor device described in claim 1.

5. A semiconductor device according to claim 1,
wherein the organic compound is a conjugated polymer.

6. A semiconductor device comprising:
a storage element including a first conductive layer, a second conductive layer, and a layer containing at least one kind of an organic compound between the first conductive layer and the second conductive layer; and
a transistor,
wherein a source or drain region of the transistor is electrically connected to the first conductive layer or the second conductive layer,
wherein a metal cation exists in the organic compound, and
wherein when current is fed between the first conductive layer and the second conductive layer, the organic compound is oxidized as well as the metal cation is reduced.

7. A semiconductor device according to claim 6,
wherein one or both of the first conductive layer and the second conductive layer has/have a standard potential of −3.0 V or higher and +0.8 V or lower with a saturated calomel electrode as a reference.

8. A semiconductor device according to claim 6, further comprising an antenna,
wherein the antenna is electrically connected to a transistor that constitutes a part of a waveform shaping circuit or a rectifying circuit.

9. An electronic appliance using the semiconductor device described in claim 6.

10. A semiconductor device according to claim 6,
wherein the organic compound is a conjugated polymer.

* * * * *